United States Patent
Chaivipas et al.

(10) Patent No.: US 8,981,974 B2
(45) Date of Patent: Mar. 17, 2015

(54) TIME-TO-DIGITAL CONVERTER AND CONTROL METHOD

(71) Applicant: Fujitsu Limited, Kawasaki-shi, Kanagawa (JP)

(72) Inventors: Win Chaivipas, Kawasaki (JP); Atsushi Matsuda, Akishima (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/480,432

(22) Filed: Sep. 8, 2014

(65) Prior Publication Data

US 2014/0375486 A1    Dec. 25, 2014

Related U.S. Application Data

(63) Continuation of application No. PCT/JP2012/058008, filed on Mar. 27, 2012.

(51) Int. Cl.
*H03M 1/06* (2006.01)
*H03M 1/50* (2006.01)

(52) U.S. Cl.
CPC ............. *H03M 1/0624* (2013.01); *H03M 1/50* (2013.01)
USPC .......................................... 341/118; 341/155

(58) Field of Classification Search
CPC .............. H03M 1/00; H03M 2201/13; H03M 2201/1109
USPC ................... 341/117–120, 155, 156
See application file for complete search history.

(56) References Cited

U.S. PATENT DOCUMENTS

| | | | | |
|---|---|---|---|---|
| 5,835,552 A | * | 11/1998 | Kusumoto et al. | 377/24 |
| 7,106,239 B1 | * | 9/2006 | Keskin | 341/157 |
| 7,196,778 B2 | * | 3/2007 | Lin et al. | 356/5.01 |
| 8,138,958 B2 | * | 3/2012 | Dai et al. | 341/155 |
| 2008/0297392 A1 | | 12/2008 | Kudo et al. | |
| 2009/0262878 A1 | | 10/2009 | Sun et al. | |
| 2009/0322574 A1 | | 12/2009 | Rivoir | |
| 2010/0277158 A1 | * | 11/2010 | Lee et al. | 324/76.79 |

FOREIGN PATENT DOCUMENTS

| | | |
|---|---|---|
| JP | 2009-527158 A | 7/2009 |
| JP | 2010-183176 A | 8/2010 |
| JP | 2011-518534 A | 6/2011 |
| JP | 2011-259208 A | 12/2011 |
| WO | WO 2007/094074 A1 | 8/2007 |

OTHER PUBLICATIONS

International Search Report of PCT/JP2012/058008 dated Mar. 27, 2012.
M. J. Edward Lee et al., "Jitter Transfer Characteristics of Delay-Locked Loops—Theories and Design Techniques", IEEE Journal of Solid-State Circuits, vol. 38, No. 4, pp. 614-621, Apr. 2003.

* cited by examiner

*Primary Examiner* — Jean B Jeanglaude
(74) *Attorney, Agent, or Firm* — Arent Fox LLP

(57) ABSTRACT

A first switching unit configured to switch a first state for inputting a first clock signal input from a first input terminal, and a second state for inputting an output signal of a second delay element, to a first delay element. A second switching unit configured to switch a first state for inputting a second clock signal input from a second input terminal, and a second state for inputting an output signal of a first delay element, to a second delay element. After the two clock signals are respectively taken in the first delay elements and the second delay elements by putting the first and second switching units into the first state, the control unit puts the first and second switching units into the second state. An output unit outputs a phase difference obtained by decoding values stored in FFs in the second state.

11 Claims, 55 Drawing Sheets

FIG.51

| T2_CON<i> | T1_CON<i> | DIFFERENCE |
|---|---|---|
| L | L | $\Delta \tau$ |
| L | H | $\alpha$ |

TIME-TO-DIGITAL CONVERTER AND CONTROL METHOD

CROSS REFERENCE TO RELATED APPLICATIONS

This application is a continuation application of International Application PCT/JP2012/058008, filed on Mar. 27, 2012 and designating the U.S., the entire contents of which are incorporated herein by reference.

FIELD

The embodiments discussed herein are related to a time-to-digital converter and a control method.

BACKGROUND

A time-to-digital converter (hereinafter referred to as a TDC) is conventionally known that outputs a phase difference between two clock signals as a digital value.

For example, the TDC delays a clock signal with multiple delay elements connected in series to detect a phase difference between two clock signals. For example, in a known related technique for the TDC, a phase difference between two clock signals is detected in two stages of fine and coarse phase differences (see. e.g., Published Japanese-Translation of PCT Application, Publication Nos. 2009-527158 and 2011-518534).

For example, in a known technique for an A/D converter, a pulse signal is delayed by multiple delay elements depending on a delay time corresponding to analog input voltage or amplitude of analog input current so as to convert an analog signal to a digital signal based on output signals output from the respective multiple delay elements (see., e.g., Japanese Laid-Open Patent Publication No. 2010-183176).

For example, a delay-locked loop (DLL) may be utilized for reducing variations of delay amounts of delay elements due to process voltage temperature (PVT) (see., e.g., "Jitter Transfer Characteristics of Delay-Locked Loops Theories and Design Techniques", IEEE JOURNAL OF SOLID-STATE CIRCUITS, Vol. 38, No. 4, April 2003)

However, variations in the delay of delay elements due to PVT cause a problem of deterioration in accuracy of phase detection from two clock signals by the TDC.

SUMMARY

According to an aspect of an embodiment, a time-to-digital converter includes first delay elements connected in series; second delay elements disposed respectively for the the first delay elements and connected in series; flip-flops configured to store a value of an input signal to a first delay element at a front stage of the first delay elements and values of output signals of the first delay elements in synchronization with an input signal to a second delay element at the front stage of the plurality of the second delay elements and output signals of the second delay elements, respectively; a first switching unit configured to switch a first state for inputting a first clock signal input from a first input terminal, and a second state for inputting an output signal of a second delay element at a last stage of the second delay elements, to the first delay element at the front stage; a second switching unit configured to switch a first state for inputting a second clock signal input from a second input terminal, and a second state for inputting an output signal of a first delay element at the last stage of the first delay elements, to the second delay element at the front stage; a control unit configured to put the first and second switching units into the second state after the first clock signal and the second clock signal are taken in the first delay elements and the second delay elements, respectively, by putting the first and second switching units into the first state; and an output unit configured to output information indicating a phase difference between the first clock signal and the second clock signal obtained by decoding values stored in the flip-flops in the second state.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 51 is an explanatory view of a difference between a delay amount of a first delay element C1$i$ and a delay amount of a second delay element C2$i$;

DESCRIPTION OF EMBODIMENTS

Embodiments of a TDC will be described in detail with reference to the accompanying drawings.

Figure 1:
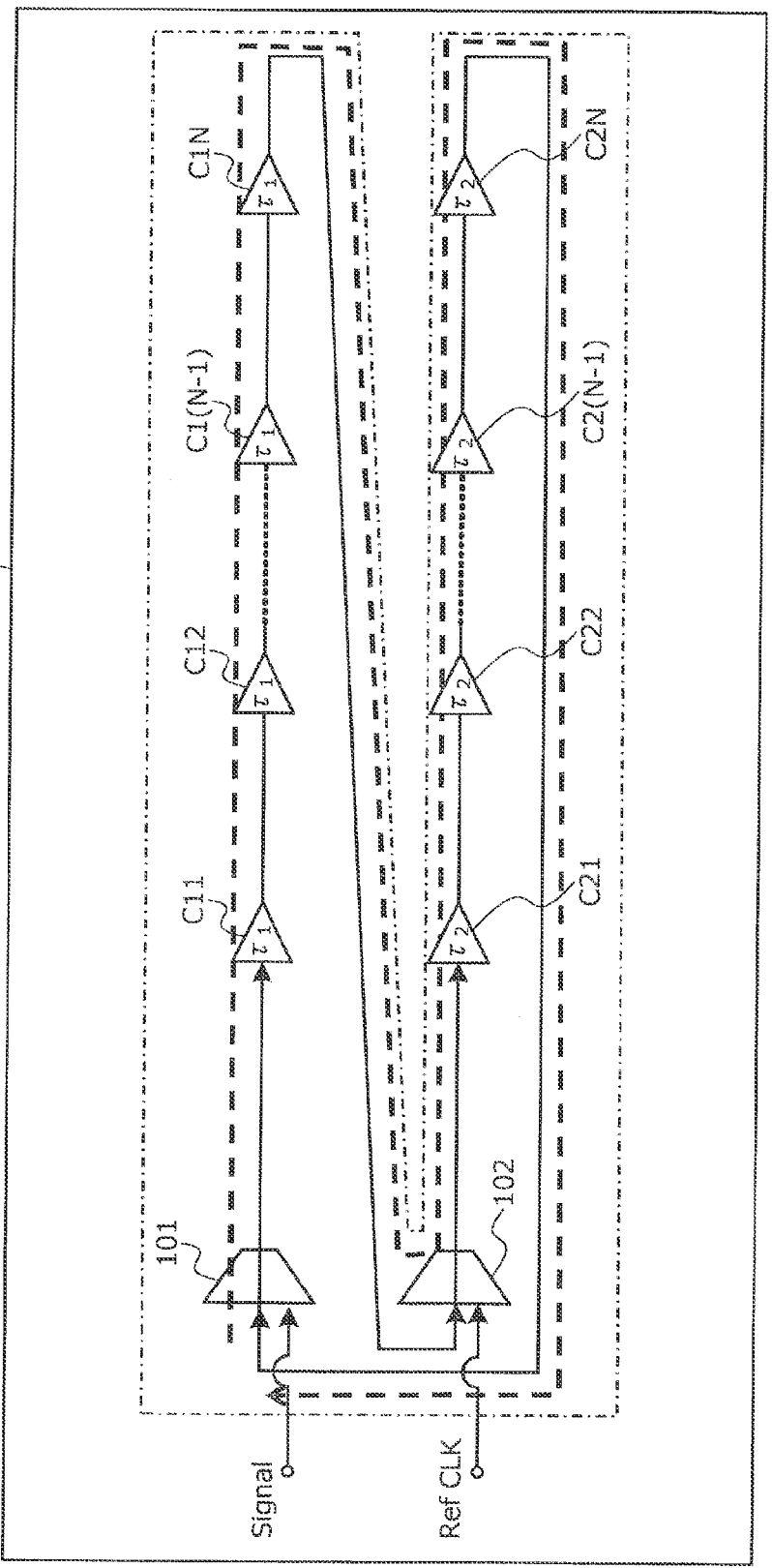
FIG. 1 is an explanatory view of an example of forming a loop in a TDC according to an embodiment.

FIG. 1 is an explanatory view of an example of forming a loop in a TDC according to the present embodiment. A TDC 100 has first delay elements C11 to C1N (N≥2) connected in series and second delay elements C21 to C2N connected in series and corresponding to the first delay elements C11 to C1N, respectively.

The TDC 100 has a flip-flop storing an input signal to the first delay element C11 in synchronization with an input signal to the second delay element C21. The TDC 100 has multiple flip-flops storing output signals of the first delay elements C11 to C1N in synchronization with respective output signals of the second delay elements C21 to C2N. A flip-flop will hereinafter be referred to as an "FF". The multiple FFs will be described later with reference to FIG. 7.

The TDC 100 has a first switching unit 101 capable of switching a first state for inputting a first clock signal_Signal input from a first input terminal IN1, and a second state for inputting to the first delay element C11, the output signal of the second delay element C2N. The TDC 100 has a second switching unit 102 capable of switching a first state for inputting a second clock signal RefCLK input from a second input terminal IN2, and a second state for inputting to the second delay element C21, the output signal of the first delay element C1N.

The TDC 100 puts the first switching unit 101 and the second switching unit 102 into the first state. As a result, the first clock signal_Signal and the second clock signal RefCLK are taken into the first delay elements C11 to C1N and the second delay elements C21 to C2N, respectively. The TDC 100 has a control unit that subsequently puts the first switching unit 101 and the second switching unit 102 into the second state. The control unit will be described later with reference to FIG. 7.

The TDC 100 has an output unit that outputs information indicating a phase difference between the first clock signal and the second clock signal, respectively obtained by decoding values stored in the multiple FFs in the second state. The output unit will be described later with reference to FIG. 7.

When the second switching unit 102 enters the second state, the output signal of the first delay element C1N at the last stage of the first delay elements C11 to C1N is input to the second delay element C21 at the front stage of the second delay elements C21 to C2N. When the first switching unit 101 enters the second state, the output signal of the second delay element C2N at the last stage of the second delay elements C21 to C2N is input to the first delay element C11 at the front stage of the first delay elements C11 to C1N. Therefore, a loop is formed such that the first clock signal_Signal and the second clock signal RefCLK alternately pass through the first delay elements C11 to C1N and the second delay elements C21 to C2N.

As a result, the same delay amount is applied to the first clock signal_Signal and the second clock signal Ref CLK. Therefore, even if the delay amounts of the delay elements vary due to PVT, deterioration can be suppressed in accuracy of phase difference detection. Since the loop is maintained by keeping the second state, the phase difference between the first clock signal_Signal and the second clock signal RefCLK is reproduced a number of times.

Before describing the TDC 100 in detail, TDC operation will briefly be described by using a conventional TDC. The TDC 100 will be described later with reference to FIG. 7 or later.

Figure 2:
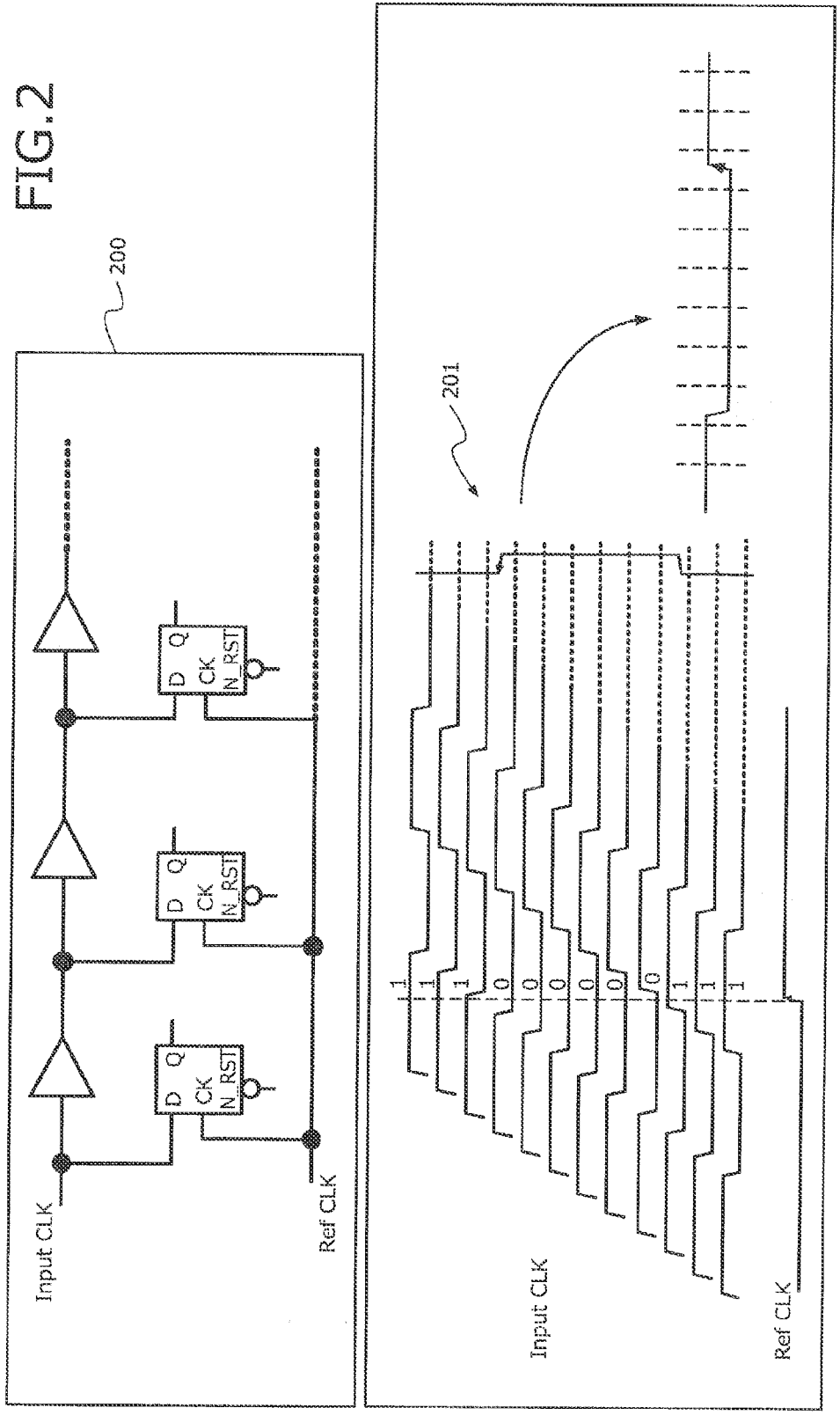
FIG. 2 is an explanatory view of an example of a one-stage TDC.

FIG. 2 is an explanatory view of an example of a one-stage TDC. FIG. 2 depicts a one-stage TDC 200. The TDC 200 has multiple FFs and multiple delay elements. In the TDC 200, an input clock Input CLK is delayed by the delay elements. In the TDC 200, the signal Input CLK delayed by the delay elements is taken in multiple FFs at the rising edge of the second clock signal Ref CLK.

A timing chart 201 represents how the input clock Input-CLK is delayed and how values stored in the multiple FFs are converted into a digital numerical value at the rising edge of a reference clock RefCLK.

Figure 3:
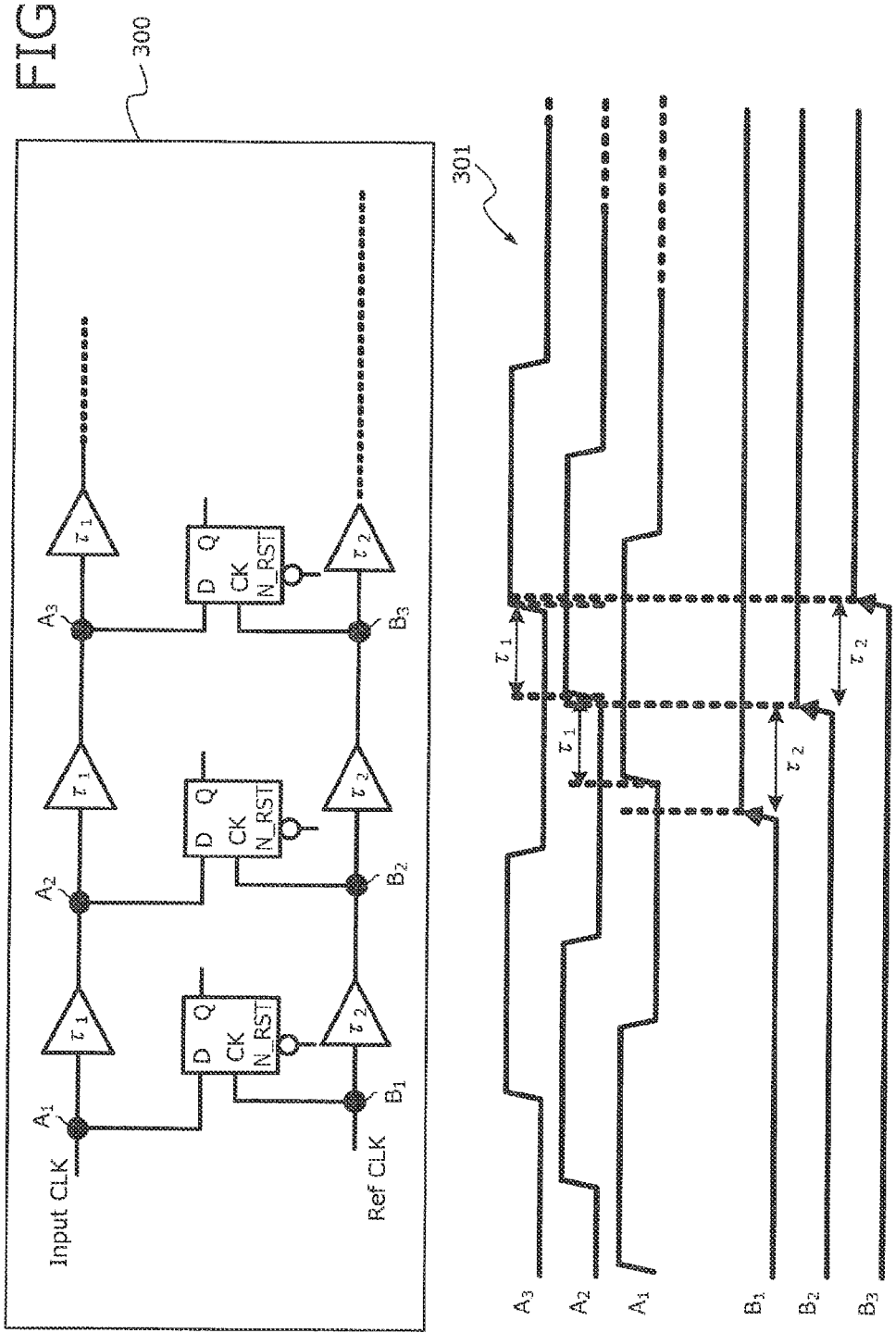
FIG. 3 is an explanatory view of another example of a one-stage TDC.

FIG. 3 is an explanatory view of another example of a one-stage TDC. FIG. 3 depicts a one-stage TDC 300. The TDC 300 has multiple FFs, multiple delay elements connected in series each having a delay amount $\tau1$, and multiple delay elements connected in series each having a delay amount $\tau2$. The multiple delay elements having the delay amount $\tau1$ delay the input clock Input CLK and the multiple delay elements having the delay amount $\tau2$ delay the reference clock Ref CLK.

Multiple FFs store output signals of the multiple delay elements having the delay amount $\tau1$ in synchronization with respective output signals of the multiple delay elements having the delay amount $\tau2$. In the example of FIG. 3, both the input clock InputCLK and the reference clock RefCLK are delayed. Therefore, the delay accuracy of the TDC 300 becomes finer than the delay accuracy of the TDC 200. A timing chart 301 represents nodes A1 to A3 and nodes B1 to B3 of the TDC 300. As indicated by the timing chart 301, the accuracy of the TDC 300 is "$\tau 2-\tau 1=\Delta\tau$".

The accuracy of the TDC 300 will be described. The accuracy of the TDC 300 depends on two factors. A first factor is a time difference of the delay elements. For example, in the TC 300 of FIG. 3, when the delay amount $\tau 2$ is 10 [ps] and a delay amount of $\tau 1$ is 10 [ps], the accuracy of the TDC 300 is $\tau 2-\tau 1=10$ [ps]. A second factor is normalization accuracy of the TDC 300. The delay amounts of the delay elements of the TDC 300 vary due to PVT and are therefore not constant. If the delay amounts of the delay elements vary, a result of the TDC 300 also varies. For example, effect of variation on delay amount will be described with reference to FIG. 4.

Figure 4:
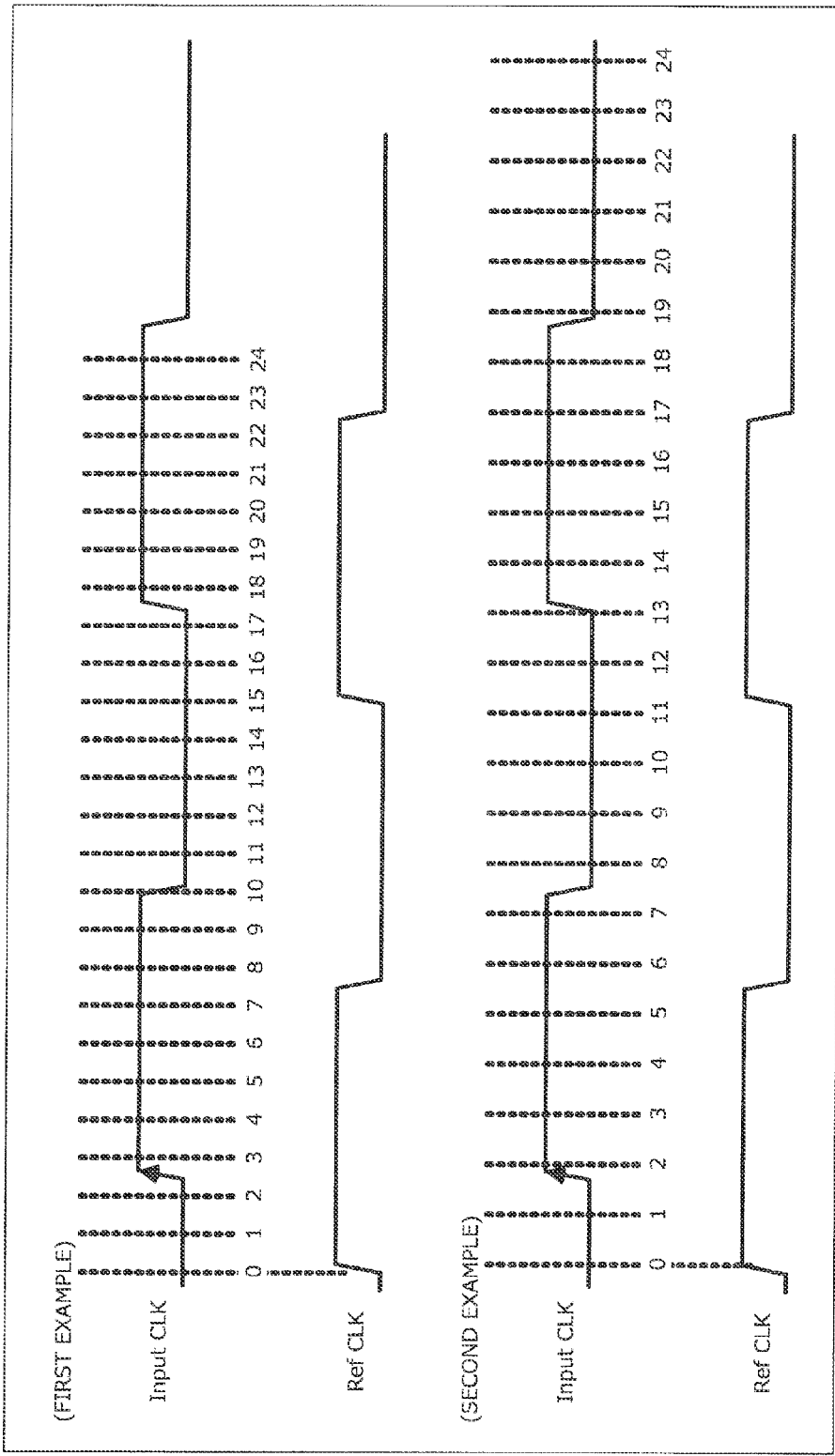
FIG. 4 is an explanatory view of examples of effect of variation on delay amount.

FIG. 4 is an explanatory view of examples of effect of variation on delay amount. In a first example of FIG. 4, a delay amount of delay elements is shorter as compared to a second example of FIG. 4 and, therefore, a phase difference between the input clock InputCLK and the reference clock RefCLK is a delay amount corresponding to three delay elements. In the second example of FIG. 4, a delay amount of delay elements are longer as compared to the first example of FIG. 4 and, therefore, a time difference between the input clock Input-CLK and the reference clock RefCLK is a delay amount corresponding to two delay elements.

Variation in delay amount may shift the phase difference between the input clock InputCLK and the reference clock RefCLK and may deteriorate the accuracy of data output from the FFs. For example, by calibrating the delay amounts of the delay elements of the TDC 200 depicted in FIG. 2 and the TDC 300 depicted in FIG. 3 with replica cells, the TDCs 200, 300 can reduce the effect of delay amount variations.

Figure 5:
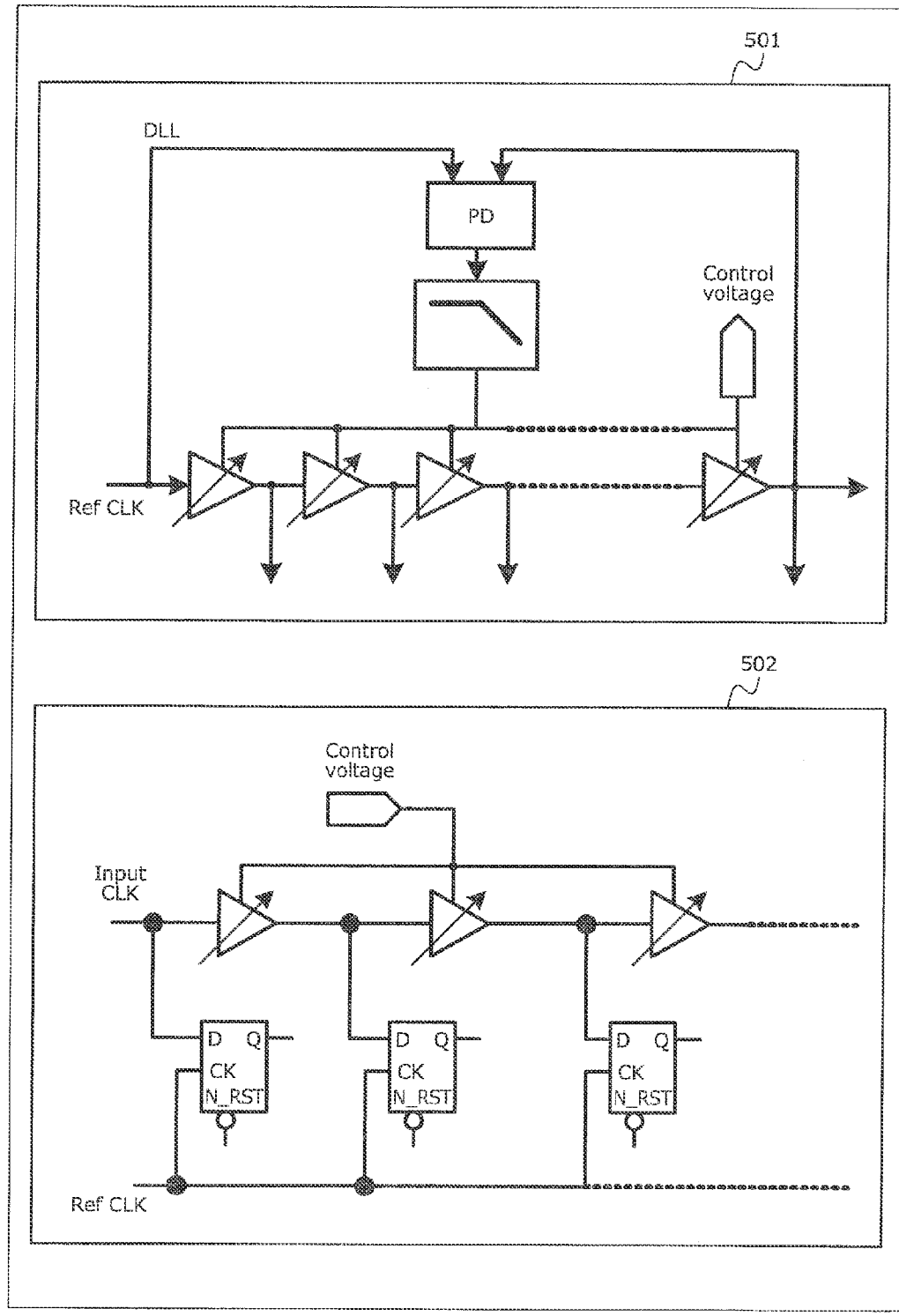
FIG. 5 is an explanatory view of a calibration example.

FIG. 5 is an explanatory view of a calibration example. An output voltage (control voltage) of a DLL 501 is applied as a source voltage of delay elements of a TDC 502. As a result, the delay amount of the delay elements of the TDC 502 is not affected by PVT and becomes stable; however, the DLL 501 has a larger area and is costly because a development time is required.

To improve the accuracy of phase detection, the number of stages of the delay elements may be increased. For example, if it is desired to improve the accuracy by one bit, the number of stages of the delay elements must be doubled. Therefore, the total area of the delay elements and the total power consumption of the delay elements are doubled.

Figure 6:
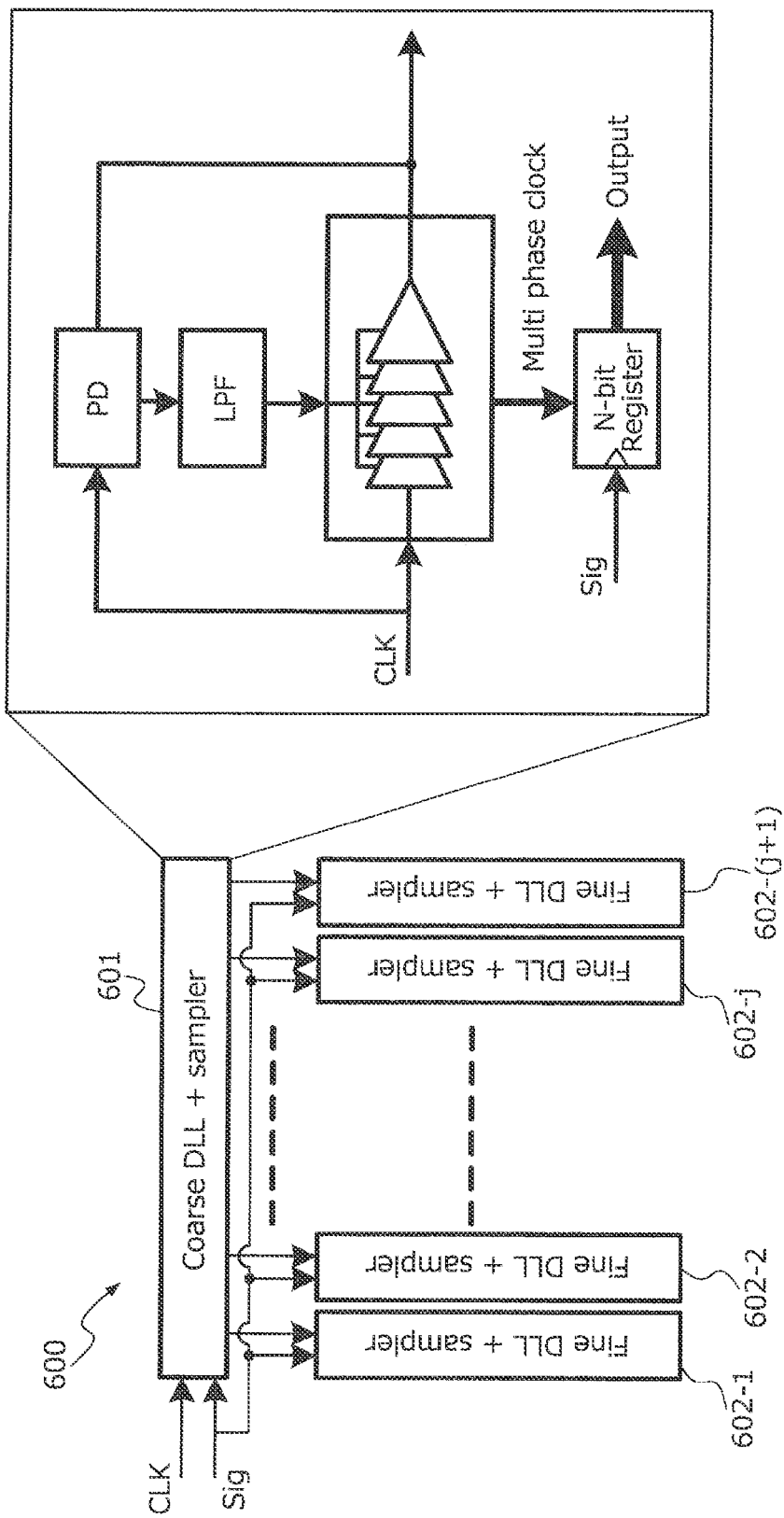
FIG. 6 is an explanatory view of an example of a 2-stage TDC.

FIG. 6 is an explanatory view of an example of a 2-stage TDC. For example, to improve the accuracy of phase detection, a 2-stage TDC 600 depicted in FIG. 6 detects a phase difference between a first clock signal CLK and a second clock signal Sig separately as a coarse delay amount and a fine delay amount. The coarse delay amount is detected by a Coarse DLL+sampler 601. The fine delay amount is detected by Fine DLL+samplers 602 (602-1 to 602-(j+1)). The Coarse DLL+sampler 601 has a phase detector (PD), a low pass filter, a delay element group, and an N-bit register.

Although the 2-stage TDC 600 depicted in FIG. 6 has a wide operation range and high phase detection accuracy, the 2-stage TDC 600 must have multiple DLLs and therefore has a complicated circuit, a large area, and large power consumption.

As described in FIGS. 2 to 6, if a TDC has a complicated circuit such as a DLL to reduce variations in delay amount of the delay elements due to PVT, the area becomes larger and the power consumption becomes larger, for example. On the other hand, the TDC 100 according to this embodiment can suppress deterioration in accuracy of phase detection due to variations in delay amount of the delay elements due to PVT rather than suppressing the variations in delay amount of the delay elements due to PVT.

Figure 7:
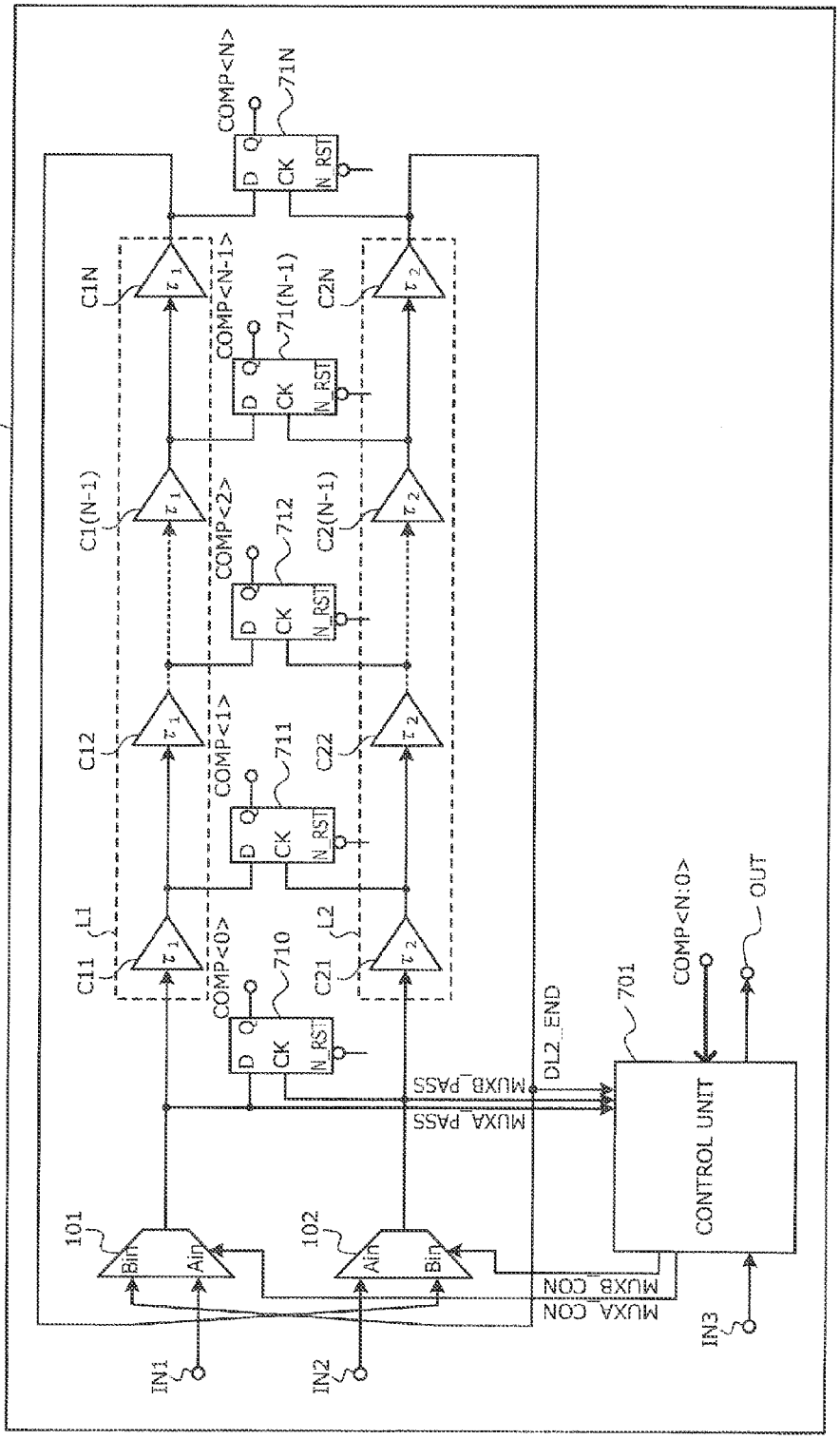
FIG. 7 is an explanatory view of a TDC 100 according to Example 1.

FIG. 7 is an explanatory view of the TDC 100 according to Example 1. The TDC 100 has the first switching unit 101, the second switching unit 102, the first delay elements C11 to C1N, the second delay elements C21 to C2N, FFs 710 to 71N, and a control unit 701.

The first delay elements C11 to C1N are connected in series. The first delay elements C11 to C1N are designed to have the same delay amount 1I. Output ends of the first delay elements C11 to C1N are connected to data input terminals of the FFs 710 to 71N, respectively. The first delay elements C11 to C1N form a first delay line L1.

The second delay elements C21 to C2N are connected in series. The second delay elements C21 to C2N are designed to have the same delay amount r2. Output ends of the second delay elements C21 to C2N are connected to clock input terminals of the FFs 710 to 71N, respectively. The second delay elements C21 to C2N form a second delay line L2.

The control unit 701 controls overall operation of the TDC 100. For example, the control unit 701 outputs a first selection signal MUXA_CON and a second selection signal MUXB_CON to the first switching unit 101 and the second switching unit 102, respectively. For example, the control unit 701 is made up of elements such as a logical product circuit AND, a negative logic circuit INVERTER, a logical sum circuit OR, and a latch circuit FF (Flip-Flop). Alternatively, for example, the control unit 701 may be implemented by a field programmable gate array (FPGA) through functional definition using descriptions in Verilog hardware description language (Verilog-HDL) etc., and logical synthesis of the descriptions.

Figure 8:
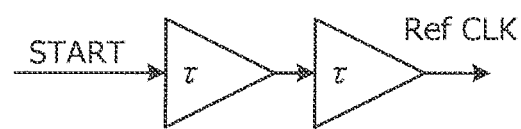
FIG. 8 is an explanatory view of an example of START.

FIG. 8 is an explanatory view of an example of START. The START input from a third input terminal IN3 may be a signal input before the second clock signal Ref CLK as depicted in FIG. 8, for example. This is not a limitation and the START may be input as a control signal by a user.

The first switching unit 101 switches the first state for inputting the first clock signal_Signal input from the first input terminal IN1, and the second state for inputting the output signal of the second delay element C2N, to the first delay element C11. For example, the first switching unit 101 is a multiplexer.

For example, the first switching unit 101 selects either the first clock signal_Signal input from the first input terminal IN1 or the output signal of the second delay element C2N based on the first selection signal MUXA_CON input from the control unit 701. The first switching unit 101 inputs the selected signal to the first delay element C11 and the data input terminal of the FF 710. For example, if a value of the first selection signal MUXA_CON is zero, the first switching unit 101 selects the first clock signal input from the first input terminal IN1. For example, if a value of the first selection signal MUXA_CON is one, the first switching unit 101 selects the output signal of the second delay element C2N.

The second switching unit 102 switches the first state for inputting the second clock signal Ref CLK input from the second input terminal IN2, and the second state for inputting the output signal of the first delay element C1N, to the second delay element C21. For example, the second switching unit 102 is a multiplexer.

The second switching unit 102 selects either the second clock signal Ref CLK input from the second input terminal IN2 or the output signal of the first delay element C1N based on the second selection signal MUXB_CON input from the control unit 701. The second switching unit 102 inputs the selected signal to the second delay element C21 and the clock input terminal of the FF 710. For example, if a value of the second selection signal MUXB_CON is zero, the second switching unit 102 selects the second clock signal Ref CLK input from the second input terminal IN2. For example, if a value of the second selection signal MUXB_CON is one, the second switching unit 102 selects the output signal of the first delay element C1N.

Overall operation of the TDC 100 will be described with reference to FIGS. 9 to 15. In FIGS. 9 to 15, to facilitate understanding, the following assumption is made. For example, a rising edge of the first clock signal_Signal having a different phase is assumed to be earlier than a rising edge of the second clock signal Ref CLK.

Figure 9:
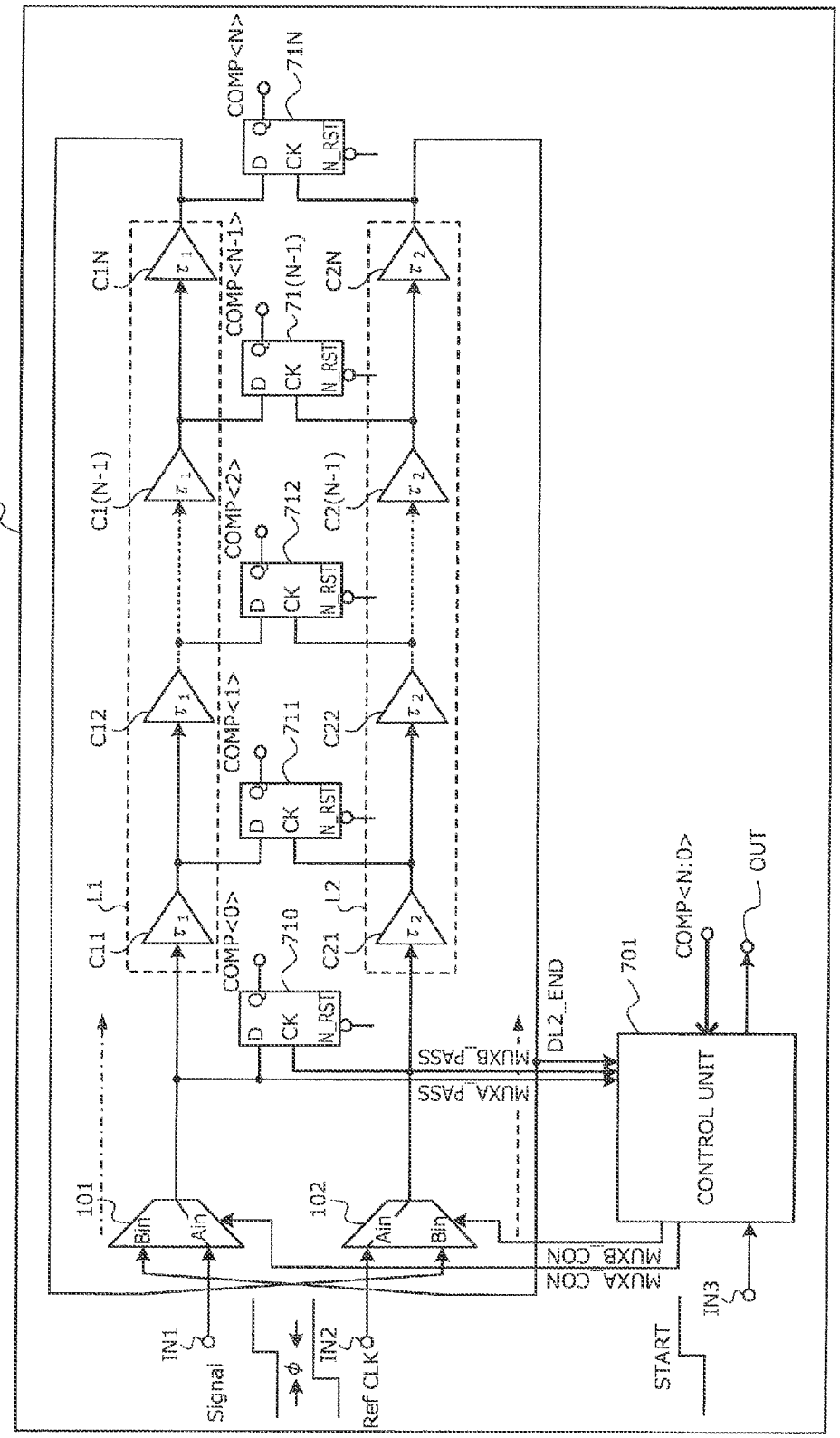
FIG. 9 is an explanatory view of a first state example.

FIG. 9 is an explanatory view of a first state example. When it is determined that an operation start condition is satisfied, the control unit 701 starts the operation. The operation start condition is satisfied, for example, when a rising edge of the START is detected.

The first clock signal_Signal is input to the first input terminal IN1 and the second clock signal Ref CLK is input to the second input terminal IN2. When detecting the rising edge of the START, the control unit 701 inputs to the first switching unit 101, the first selection signal MUXA_CON causing the first switching unit 101 to select the first clock signal input from the first input terminal IN1. The control unit 701 inputs to the second switching unit 102, the second selection signal MUXB_CON causing the second switching unit 102 to select the second clock signal input from the second input terminal IN2.

The first switching unit 101 selects the first clock signal_Signal input from the first input terminal IN1, according to the value of the first selection signal MUXA_CON input from the control unit 701 and inputs the signal to the first delay element C11 and the data input terminal of the FF 70. As a result, the first clock signal_Signal is taken in the multiple delay elements C11 to C1N.

The second switching unit 102 selects the second clock signal Ref CLK input from the second input terminal IN2, according to the value of the second selection signal MUXB_CON and inputs the signal to the second delay element C21 and the clock input terminal of the FF 710. As a result, the second clock signal Ref CLK is taken in the multiple delay elements C21 to C2N.

Figure 10:
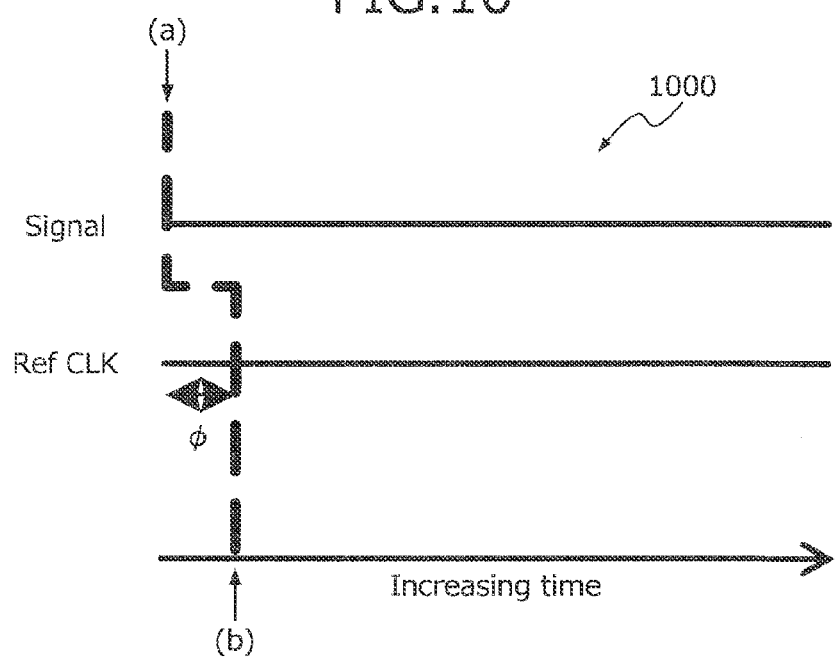
FIG. 10 is an explanatory view (part one) of a delay amount applied to taken-in first and second clock signals Signal and Ref CLK.

FIG. 10 is an explanatory view (part one) of a delay amount applied to the taken-in first and second clock signals Signal and Ref CLK. A time chart 1000 indicates a delay amount applied by the first delay elements C11 to C1N and the second delay elements C21 to C2N after the first clock signal_Signal and the second clock signal Ref CLK are taken in. For example, a time of an arrow (a) is a rising time of the first clock signal_Signal output from the first switching unit 101 for the first time after the operation start of the TDC 100. A time of an arrow (b) is a rising time of the second clock signal Ref CLK output from the second switching unit 102 for the first time after the operation start of the TDC 100. A time difference between the time of the arrow (a) and the time of the arrow (b), i.e., a phase difference between the first clock signal_Signal and the second clock signal Ref CLK is 4.

Figure 11:
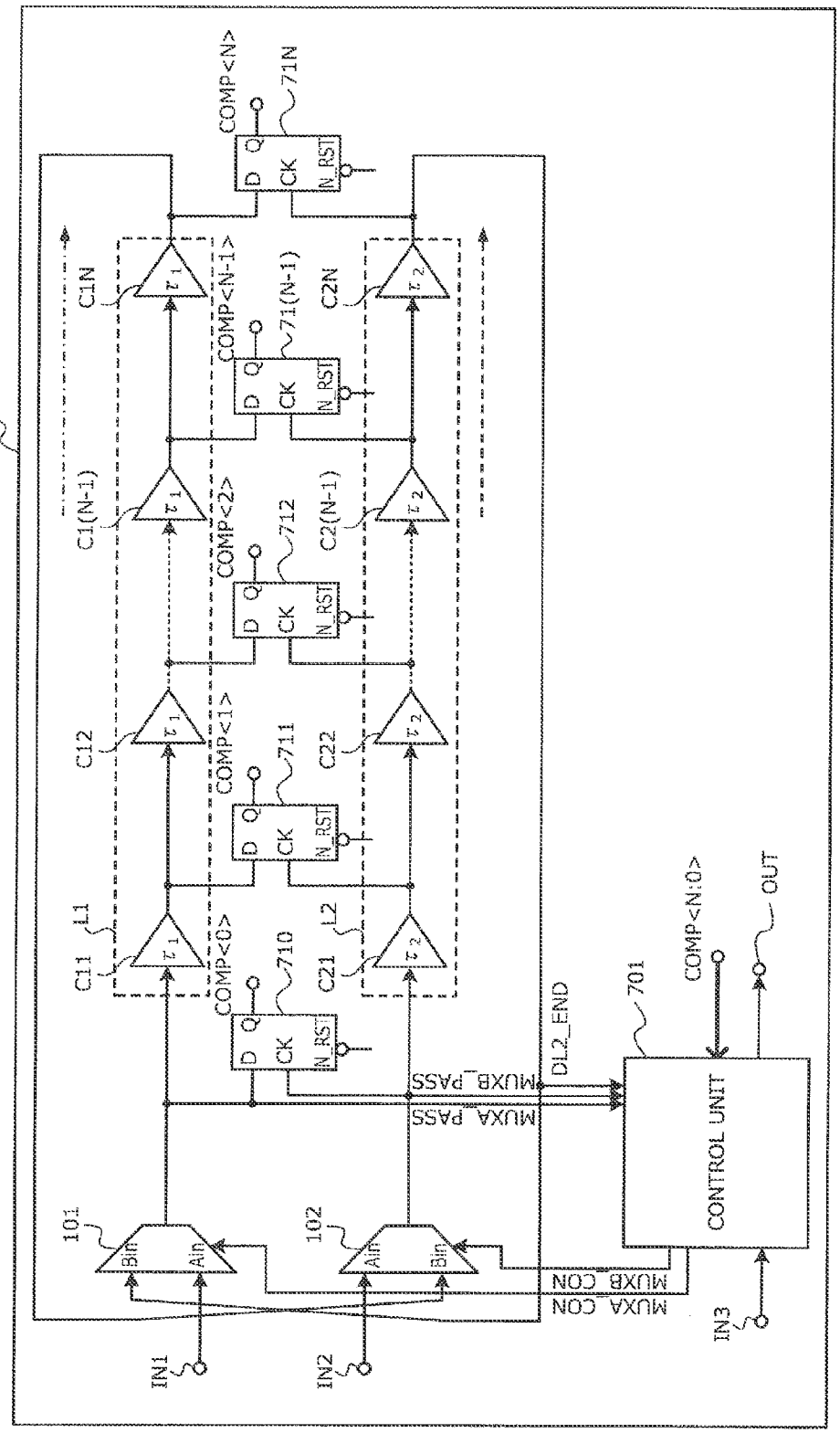
FIG. 11 is an explanatory view of an example of switching from the first state to a second state.

FIG. 11 is an explanatory view of an example of switching from the first state to the second state. When detecting a falling edge of MUXA_PASS that is an input signal to the first delay element C11, the control unit 701 inputs to the first switching unit 101 the first selection signal MUXA_CON causing the first switching unit 101 to select the output signal of the second delay element C2N.

When detecting a falling edge of MUXB_PASS that is an input signal to the second delay element C21, the control unit 701 inputs to the second switching unit 102, the second selection signal MUXB_CON causing the second switching unit 102 to select the output signal of the first delay element C1N at the last stage.

The first switching unit 101 selects the output signal of the delay element C2N, according to the first selection signal MUXA_CON input from the control unit 701. The second switching unit 102 selects the output signal of the delay element C1N, according to the second selection signal MUXB_CON input from the control unit 701.

As a result, after the first clock signal_Signal and the second clock signal Ref CLK are taken in the first delay elements C11 to C1N and the second delay elements C21 to C2N, respectively, the first switching unit 101 and the second switching unit 102 turn from the first state to the second state.

In the case described above, the control unit 701 takes in a high period of the first clock signal_Signal and the second clock signal Ref CLK. This is not a limitation and the control unit 701 may take in one cycle of the first clock signal_Signal and the second clock signal Ref CLK.

Figure 12:
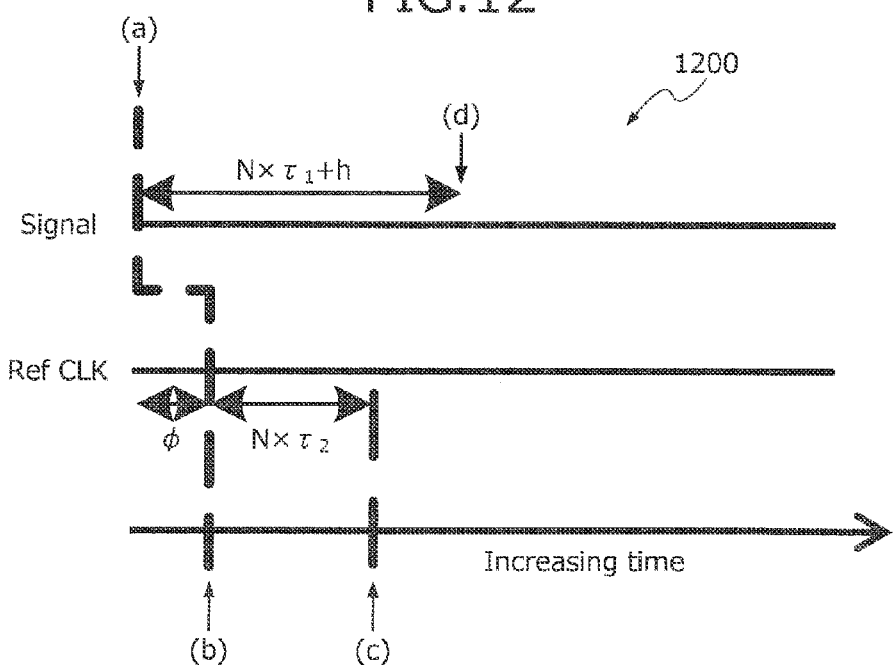
FIG. 12 is an explanatory view (part two) of a delay amount applied to the taken-in first and second clock signals Signal and Ref CLK.

FIG. 12 is an explanatory view (part two) of a delay amount applied to the taken-in first and second clock signals Signal and Ref CLK. A time chart 1200 of FIG. 12 indicates a phase difference between the first clock signal_Signal after passing through the first delay line L1 a first time and the second clock signal Ref CLK after passing through the second delay line L2 a first time. A time of an arrow (c) is the time when the second clock signal Ref CLK passes through the second delay line L2 at the first time, and a time of an arrow (d) is the time when the first clock signal_Signal passes through the first delay line L1 a first time. It is noted that $\tau1 > \tau2$ is satisfied. In this example, for example, it is assumed that the delay amount of the first delay elements C11 is "$\tau1+h$" instead of $\tau1$ because of variation. Therefore, a time difference between the time of the arrow (a) and the time of the arrow (c) is "$\phi+N\times\tau2$" and a time difference between the time of the arrow (a) and the time of the arrow (d) is "$N\times\tau1+h$".

Figure 13:
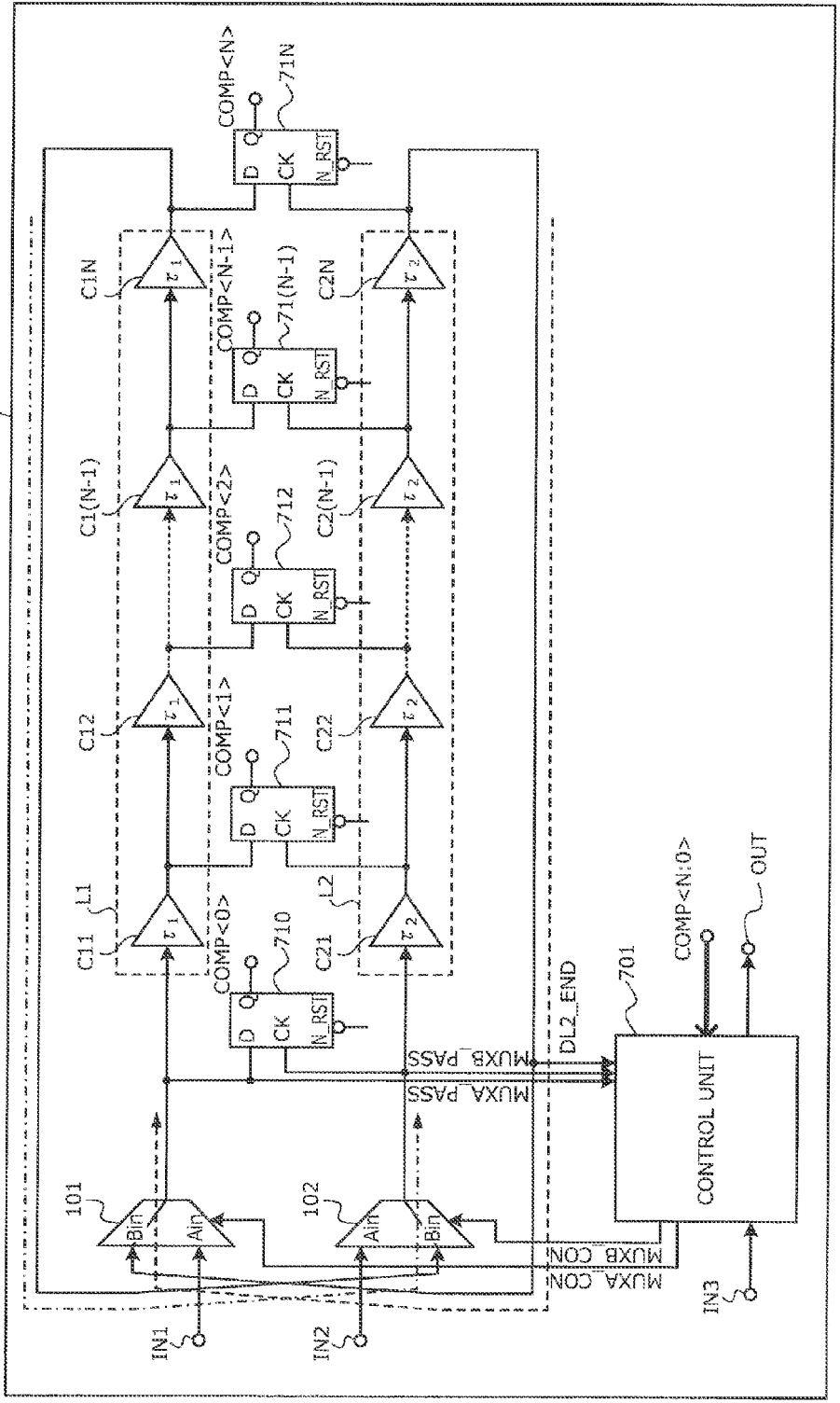
FIG. 13 is an explanatory view of a first example of looping a first clock signal_Signal and a second clock signal Ref CLK.

FIG. 13 is an explanatory view of a first example of looping the first clock signal_Signal and the second clock signal Ref CLK. The output signal of the second delay element C2N is selected by the first switching unit 101 and input to the first delay element C11 and the output signal of the first delay element C1N is selected by the second switching unit 102 and input to the second delay element C21 to form a loop.

Figure 14:
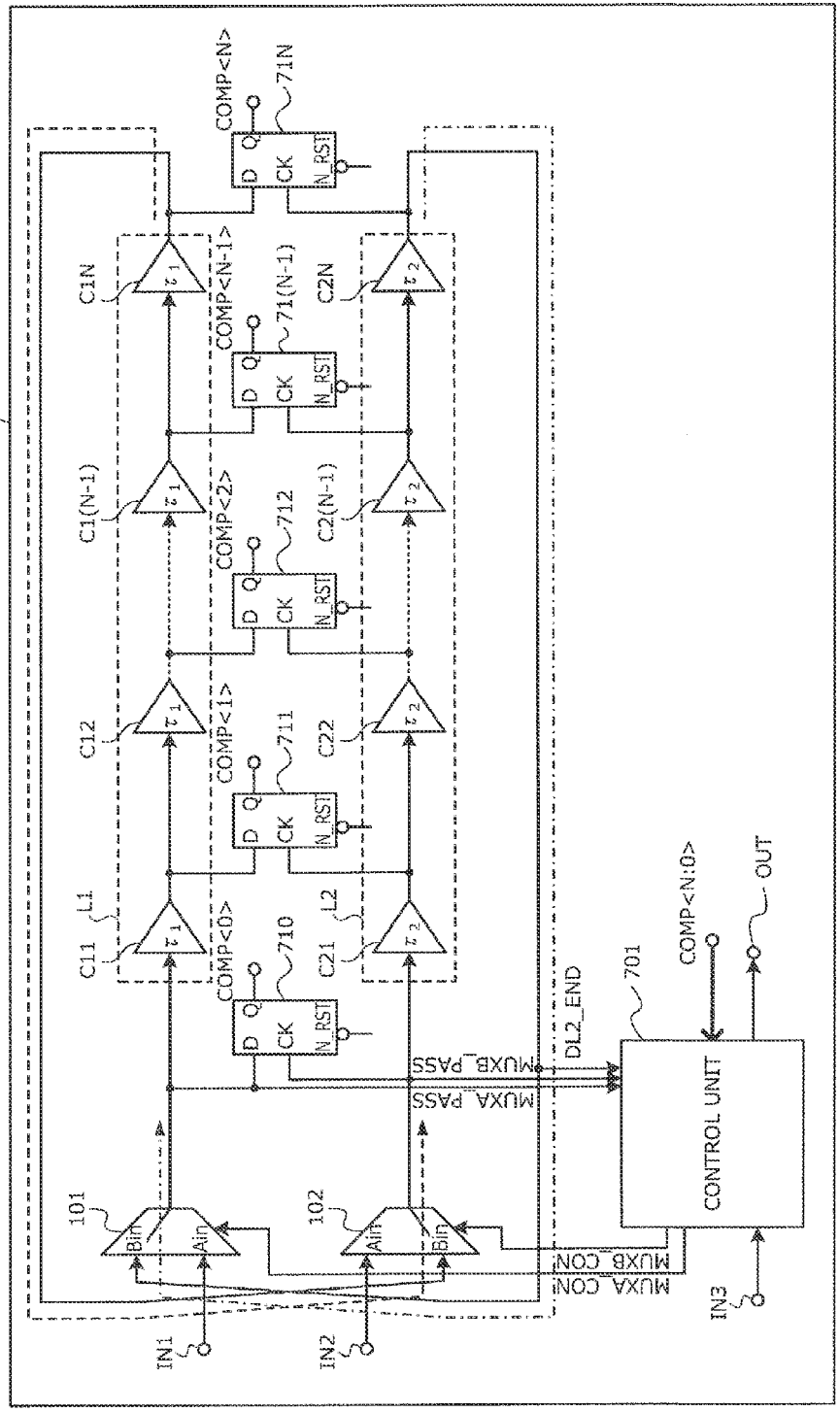
FIG. 14 is an explanatory view of a second example of looping the first clock signal_Signal and the second clock signal Ref CLK.

FIG. 14 is an explanatory view of a second example of looping the first clock signal_Signal and the second clock signal Ref CLK. In FIG. 14, the taken-in second clock signal Ref CLK passes through the second delay line L2 and then passes through the first delay line L1. In FIG. 14, the first clock signal_Signal passes through the first delay line L1 and then passes through the second delay line L2.

Figure 15:
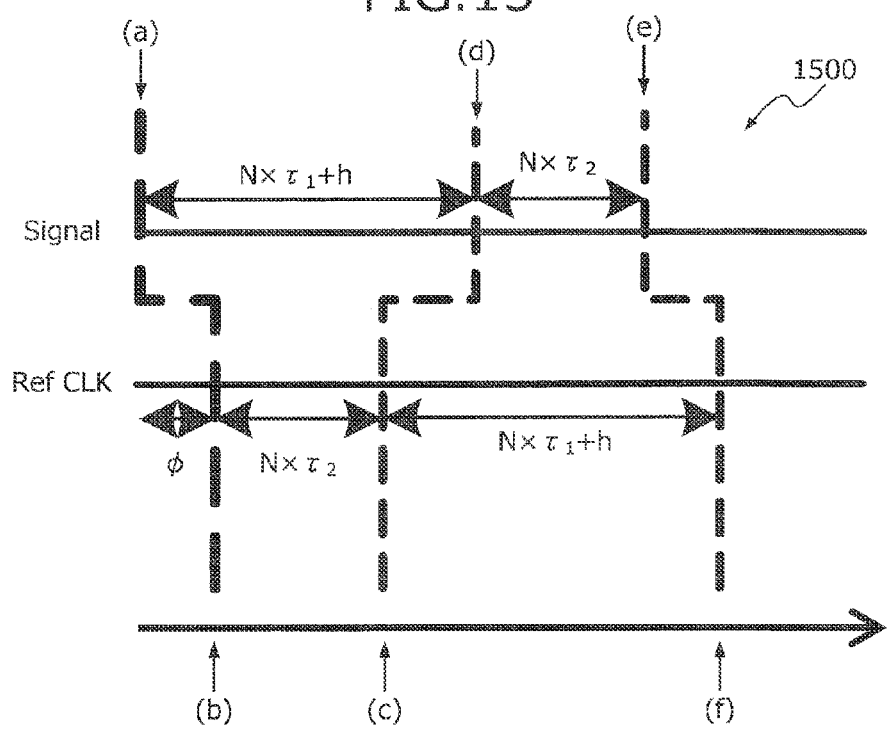
FIG. 15 is an explanatory view (part three) of a delay amount applied to the taken-in first and second clock signals Signal and Ref CLK.

FIG. 15 is an explanatory view (part three) of a delay amount applied to the taken-in first and second clock signals Signal and Ref CLK. A time chart 1500 indicates a time difference between the first clock signal_Signal after passing through the second delay line L2 at a first time and the second clock signal Ref CLK after passing through the first delay line L1 at a first time. A time of an arrow (e) is the time when the first clock signal_Signal passes through the second delay line L2 at the first time, and a time of an arrow (f) is the time when the second clock signal Ref CLK passes through the first delay line L1 at the first time.

A time difference between the time of the arrow (a) and the time of the arrow (e) is "$(N\times\tau1+h)+N\times\tau2$". A time difference between the time of the arrow (a) and the time of the arrow (f)

is "φ+N×τ2+(N×τ1+h)". The time difference between the rising of the first clock signal_Signal and the rising of the second clock signal Ref CLK becomes the same as the delay difference φ at the time of input when each of the signals goes around the formed loop even if the delay amount of the first delay element C11 varies.

Therefore, even if the delay amounts of the delay elements vary due to PVT, deterioration can be suppressed in accuracy of phase difference detection. Since the loop is maintained by keeping the second state, a phase difference between the first clock signal_Signal and the second clock signal Ref CLK is reproduced a number of times.

A TDC according to Example 2 has a variable third delay element disposed between the second switching unit 102 and the second delay element C21 and can change a delay amount of the third delay element to detect a highly accurate phase difference.

Figure 16:
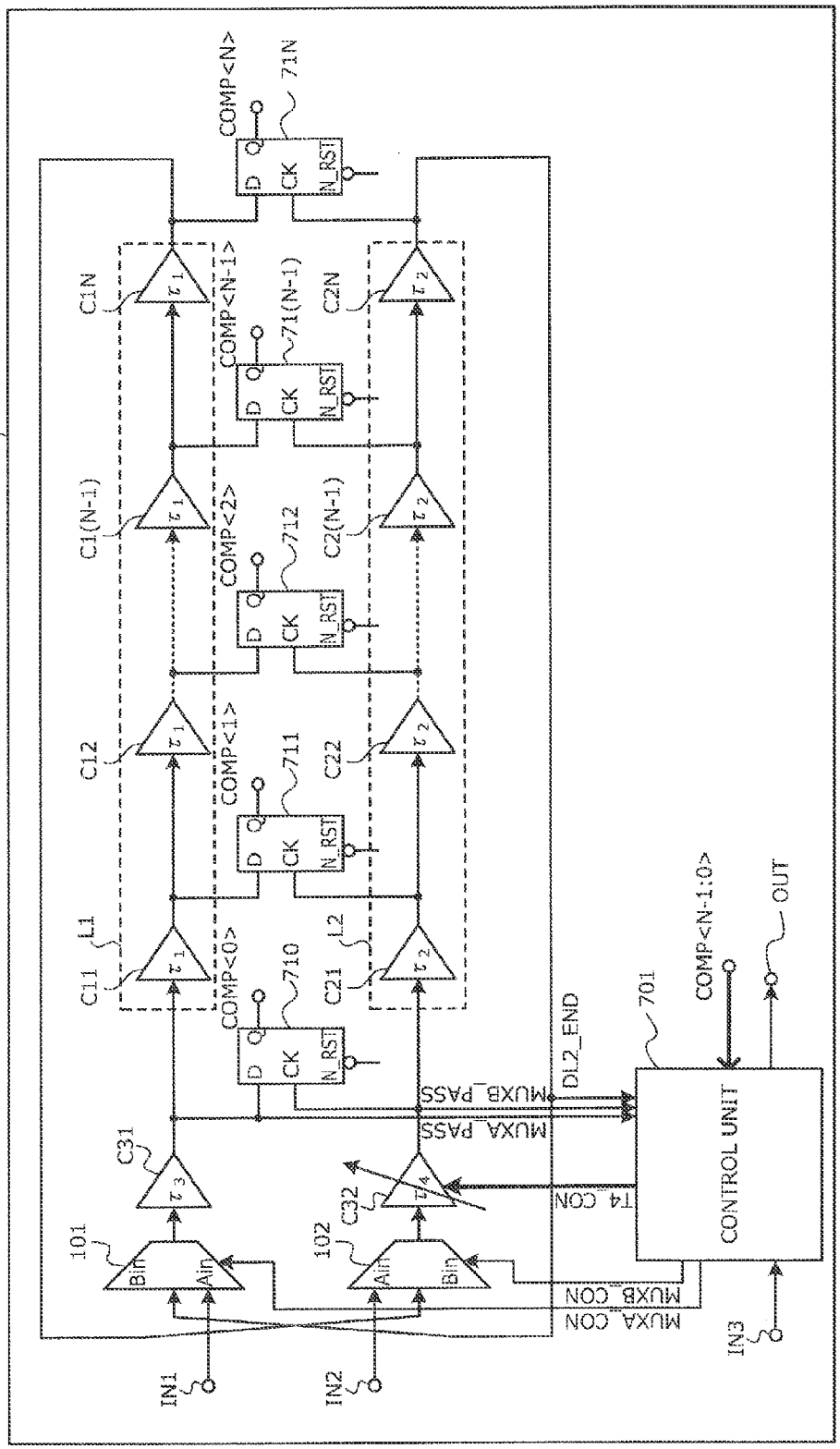
FIG. 16 is an explanatory view of the TDC according to Example 2.

FIG. 16 is an explanatory view of the TDC according to Example 2. A TDC 1600 has the first switching unit 101, the second switching unit 102, the first delay elements C11 to C1N, the second delay elements C21 to C2N, the FFs 710 to 71N, a third delay element C31, a third delay element C32, and the control unit 701.

The third delay element C31 is disposed between the first switching unit 101 and the first delay element C11. For example, the third delay element C31 delays and inputs a signal input by the first switching unit 101 to the first delay element C11 and the data input terminal of the FF 710.

The third delay element C32 is disposed between the second switching unit 102 and the second delay element C21. For example, the third delay element C32 delays and inputs a signal input by the first switching unit 101 to the second delay element C21 and the clock input terminal of the FF 710.

In the example of FIG. 16, a delay amount τ4 of the third delay element C32 is variable and the control unit 701 can increase/decrease the delay amount 4 of the third delay element C32, based on a control signal T4_CON. Although the delay amount τ4 of the third delay element C32 is variable in the example of FIG. 16, this is not a limitation and a delay amount τ3 of the third delay element C31 may be variable. A TDC in the case of the variable delay amount τ3 of the third delay element C31 will be described in Example 3.

Figure 17:
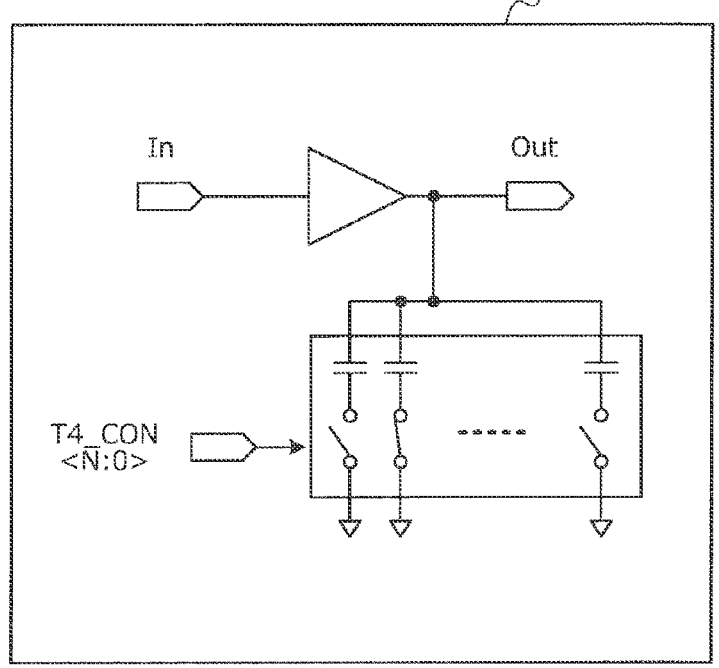
FIG. 17 is an explanatory view of a specific example of a third delay element C32.

FIG. 17 is an explanatory view of a specific example of the third delay element C32. The third delay element C32 has a basic delay element, a capacity group, and a switch group. Capacities of the capacity group are respectively correlated with switches of the switch group. An ON state and an OFF state of the switches of the switch group are switched according to the value of the control signal T4_CON and a delay amount corresponding to the capacities of the switches in the ON state is added to the delay amount 14 of the third delay element C32. As a result, the control unit 701 can change the delay amount of the third delay element C32.

The control signal T4_CON is an N-bit signal, for example. The delay amounts adjustable by signals of respective bits of the control signal T4_CON may be different and sequentially doubled in order from a least significant bit to a most significant bit of the control signal T4_CON. Alternatively, for example, all the delay amounts adjustable by signals of respective bits of the control signal T4_CON may be the same.

Figure 18:
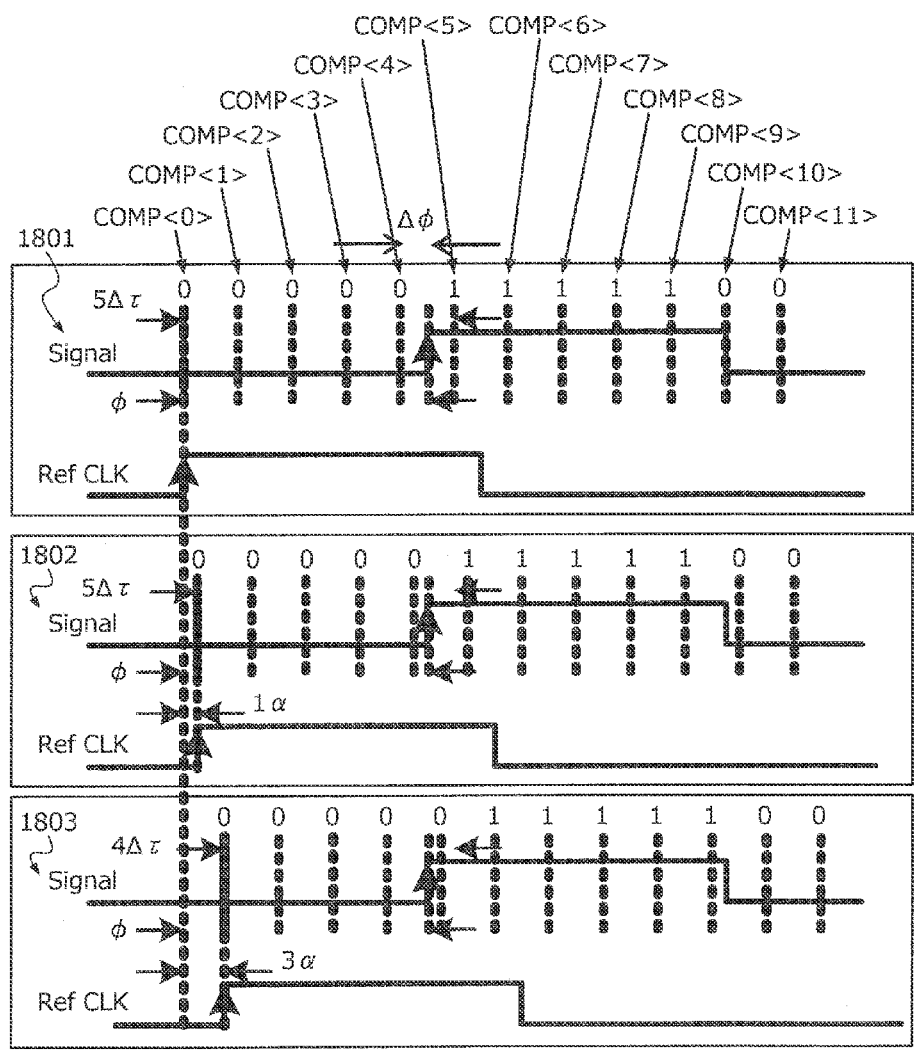
FIG. 18 is an explanatory view of a detection example of a phase difference $x_1 \Delta \tau$ and a smallest increase amount $y_1 \alpha$.

FIG. 18 is an explanatory view of a detection example of a phase difference $x_1 \Delta T$ and a smallest increase amount $y_1 \alpha$. In the example depicted in FIG. 18, the control unit 701 adjusts the delay amount τ4 of the third delay element C32 to detect a coarse delay amount and a fine delay amount.

As described above, the phase difference φ is a time difference between the rising edge of the first clock signal_Signal and the rising edge of the second clock signal Ref CLK. A value of COMP<N:0> is determined when the first clock signal_Signal passes through the first delay line L1 once and the second clock signal Ref CLK passes through the second delay line L2 once.

A waveform diagram 1801 depicts a phase difference between the first clock signal_Signal and the second clock signal Ref CLK in the first state. Values depicted above the waveform diagram 1801 are respective values of COMP<N:0>. The control unit 701 detects a phase difference in the first state obtained by decoding values stored in the FFs 710 to 71N. For example, the control unit 701 sequentially counts periods from the least significant bit of the COMP<N:0> until zero changes to one (rising) for the decoding. A decoding result x is five. Therefore, the coarse delay amount is represented by $x \times \Delta \tau$ ($\Delta \tau = \tau 1 - \tau 2$) and is $5 \Delta \tau$.

The control unit 701 changes a first increase amount for the delay amount in the first state of the third delay element C32 after the second clock signal passes through the second delay elements C21 to C2N, the first switching unit 101, and the first delay elements C11 to C1N and passes through the second switching unit 102.

For example, the control unit 701 counts up B_FALL each time a rising edge of the output MUXB_PASS of the third delay element C32 is detected. B_FALL is a variable. If the value of B_FALL is an odd number, the control unit 701 determines that the first clock signal_Signal is passing through the first delay line L1. If the value of B_FALL is an even number, the control unit 701 determines that the first clock signal_Signal is passing through the second delay line L2. If the value of B_FALL is an even number, the control unit 701 changes a value of the control signal T4_CON. As a result, the control unit 701 can change the first increase amount for the delay amount in the first state of the third delay element C32 after the second clock signal goes around the loop.

Out of the changed first increase amounts, the control unit 701 identifies a smallest first increase amount $y_1 \alpha$ at which the phase difference obtained by decoding the values stored in the FFs 710 to 71N becomes smaller than a phase difference $x_1$ in the first state. A change in the increased amount is not particularly limited. For example, the control unit 701 may gradually increase the increase amount by a smallest amount by which the increase amount can be increased or may change the increase amount to the maximum value to which the increase amount can be increased and may then reduce the increase amount.

A waveform diagram 1802 depicts the case that the increase amount for the delay amount in the first state of the third delay element C32 is $1 \alpha$. A phase difference obtained by subtracting the smallest increase amount from a phase difference in the first state and a phase difference in the case of the increase amount of $1 \alpha$ are both $5 \Delta \tau$ and are identical.

A waveform diagram 1803 depicts the case that the increase amount for the delay amount in the first state of the third delay element C32 is $3 \alpha$. A phase difference obtained by subtracting the smallest first increase amount $y_1 \alpha$ from the phase difference $x_1 \Delta \tau$ in the first state is $5 \Delta \tau$ and a phase difference in the case of the increase amount of $3 \alpha$ is $4 \Delta \tau$. In this case, out of the changed first increase amounts, the control unit 701 identifies $3 \alpha$ as the smallest first increase amount $y_1 \alpha$ at which the phase difference obtained by decoding the values stored in the FFs 710 to 71N becomes smaller than the phase difference $x_1 \Delta \tau$ in the first state.

The control unit 701 calculates the phase difference φ by subtracting the smallest first increase amount $y_1\alpha$ from the phase difference $x_1\Delta\tau$ in the first state. For example, the control unit 701 calculates "φ=5Δτ−3α". An output unit OUT outputs information indicating the phase difference calculated by the control unit 701.

Although the delay amount τ4 of the delay element C32 increases by 1α each time a value of the control signal T4_CON increases by one bit in the example of FIG. 16, the adjustable delay amount may be doubled each time a value of the control signal T4_CON increases by one bit as described above. For example, if the adjustable delay amount is 16α, the delay amount is first increased by 8α. The delay amount is then increased by 4α and increased by 2α. In this case, the control unit 701 can detect Δφ in log 2×B times. B is an available total delay amount. For example, in the case of "B=16", the control unit 701 can obtain a value of Δφ within at most four times.

FIGS. 19, 20, 21, 22, and 23 are flowcharts of a first exemplary control process procedure executed by the control unit 701 according to Example 2. In the first exemplary control process procedure, the delay amounts adjustable by signals of respective bits of the control signal T4_CON are different and sequentially doubled in order from the least significant bit to the most significant bit of the control signal T4_CON. First, FIGS. 19 and 20 will be described. The control unit 701 determines whether the rising edge of START is detected (step S1901). If the rising edge of START is not detected (step S1901: NO), the control unit 701 returns to step S1901.

On the other hand, if the rising edge of START is detected (step S1901: YES), the control unit 701 sets MUXA_CON=0 and MUXB_CON=0 (step S1902). As a result, the first switching unit 101 selects and outputs the first clock signal_Signal based on the value of the first selection signal MUXA_CON to achieve the first state. The second switching unit 102 selects and outputs the second clock signal RefCLK based on the value of the second selection signal MUXB_CON to achieve the first state. A change from the first state to the second state by the control unit 701 will be described with reference to FIGS. 21 and 22.

The control unit 701 sets B_FALL=0 (step S1903) and T4_CON=0 (step S1904). At step S1904, the values of all the bits of the T4_CON are set to zero.

The control unit 701 determines whether the falling edge of MUXB_PASS is detected (step S1905). If the falling edge of MUXB_PASS is not detected (step S1905: NO), the control unit 701 returns to step S1905. On the other hand, if the falling edge of MUXB_PASS is detected (step S1905: YES), the control unit 701 sets B_FALL-B_FALL+1 (step S1906).

The control unit 701 determines whether B_FALL is two (step S1907). If B_FALL is not two (step S1907: NO), the control unit 701 sets COMP_ARRAY(1)=COMP<N:0> (step S1908) and decodes COMP_ARRAY(1) to detect the phase difference $x_1\Delta\tau$ (step S1909).

On the other hand, if B_FALL is two (step S1907: YES), the control unit 701 sets M=N−1 (step S1910) and sets $y_1=2^{\hat{}}$(M) (step S1911). It is noted that "^" indicates a multiplier. The control unit 701 sets T4_CON<M>=1 (step S1912). In this case, since M is the maximum value, the most significant bit of T4_CON is set to one.

The control unit 701 determines whether the falling edge of MUXB_PASS is detected (step S1913). If the falling edge of MUXB_PASS is not detected (step S1913: NO), the control unit 701 returns to step S1913. On the other hand, if the falling edge of MUXB_PASS is detected (step S1913: YES), the control unit 701 sets B_FALL-B_FALL+1 (step S1914).

The control unit 701 determines whether B_FALL is an even number (step S1915). If B_FALL is not an even number (step S1915: NO), the control unit 701 returns to step S1913. If B_FALL is an even number (step S1915: YES), the control unit 701 sets M=M−1 (step S1916). The control unit 701 determines whether M≥0 is satisfied (step S1917).

If M≥0 is satisfied (step S1917: YES), the control unit 701 decodes COMP_ARRAY(X) to detect a phase difference (step S1918). For COMP_ARRAY(X), as described in a flowchart of FIG. 23, X is B_FALL and a value of COMP<N:0> is substituted that is obtained when the rising edge of DL2_END is detected. The control unit 701 makes a comparison between a phase difference obtained by decoding COMP_ARRAY(X) and the phase difference $x_1\Delta\tau$ (step S1919).

If the phase differences are the same (step S1919: =), the control unit 701 sets $y_1=y_1+2^{\hat{}}$(M) (step S1921) and goes to step S1912. If the phase difference obtained by decoding COMP_ARRAY(X) is smaller than the phase difference $x_1\Delta\tau$ (step S1919: <), the control unit 701 sets T4_CON<M+1>=0 (step S1920) and goes to step S1912. In the first exemplary control process procedure, the phase difference obtained by decoding COMP_ARRAY(X) is not larger than the phase difference $x_1\Delta\tau$ in any case.

On the other hand, if M≥0 is not satisfied (step S1917: NO), the control unit 701 sets φ=$x_1\Delta\tau-y_1\alpha$ (step S1922) and terminates a series of the processes. A method of increasing the delay amount τ4 of the third delay element C32 can variously be changed.

Figure 21:
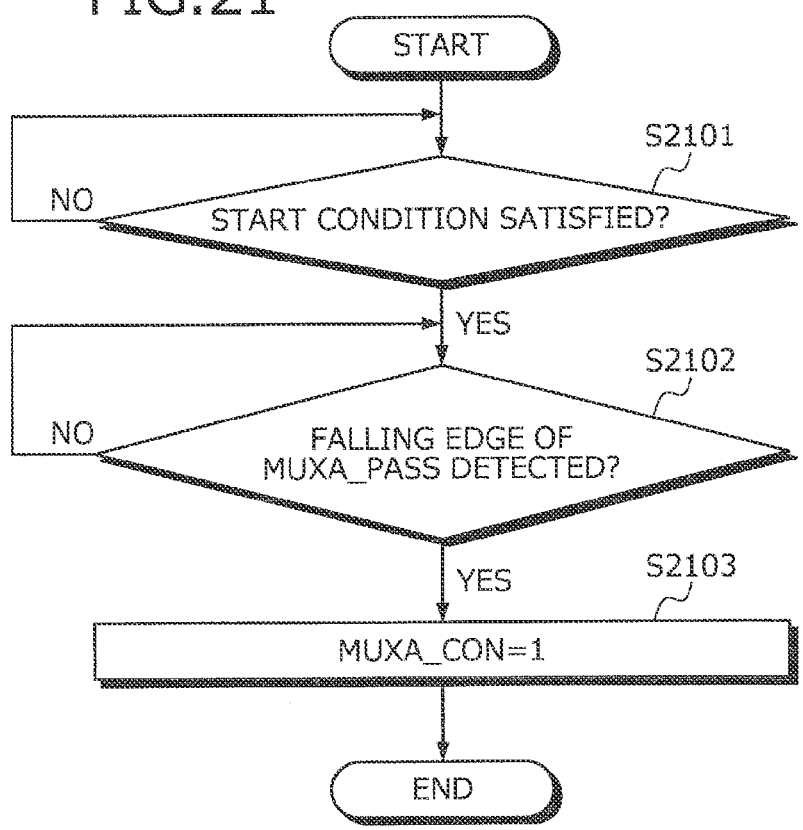

FIG. 21 will be described. The control unit 701 determines whether a start condition is satisfied (step S2101). At step S2101, the start condition is execution of the process of step S1902. The processes of steps S2101 to S2103 are performed after execution of the process of step S1902. If the start condition is not satisfied (step S2101: NO), the control unit 701 returns to step S2101.

On the other hand, if the start condition is satisfied (step S2101: YES), the control unit 701 determines whether the falling edge of MUXA_PASS is detected (step S2102). If the falling edge of MUXA_PASS is not detected (step S2102: NO), the control unit 701 returns to step S2102.

On the other hand, if the falling edge of MUXA_PASS is detected (step S2102: YES), the control unit 701 sets MUXA_CON=1 (step S2103) and terminates a series of the processes. As a result, the first switching unit 101 selects a signal of Bin according to a value of the first selection signal MUXA_CON. The signal of Bin of MUXA is an output signal of the second delay element C2N at the last stage of the second delay line L2. As a result, the control unit 701 takes the high period corresponding to a half cycle of the first clock signal_Signal into the TDC 1600.

Figure 22:
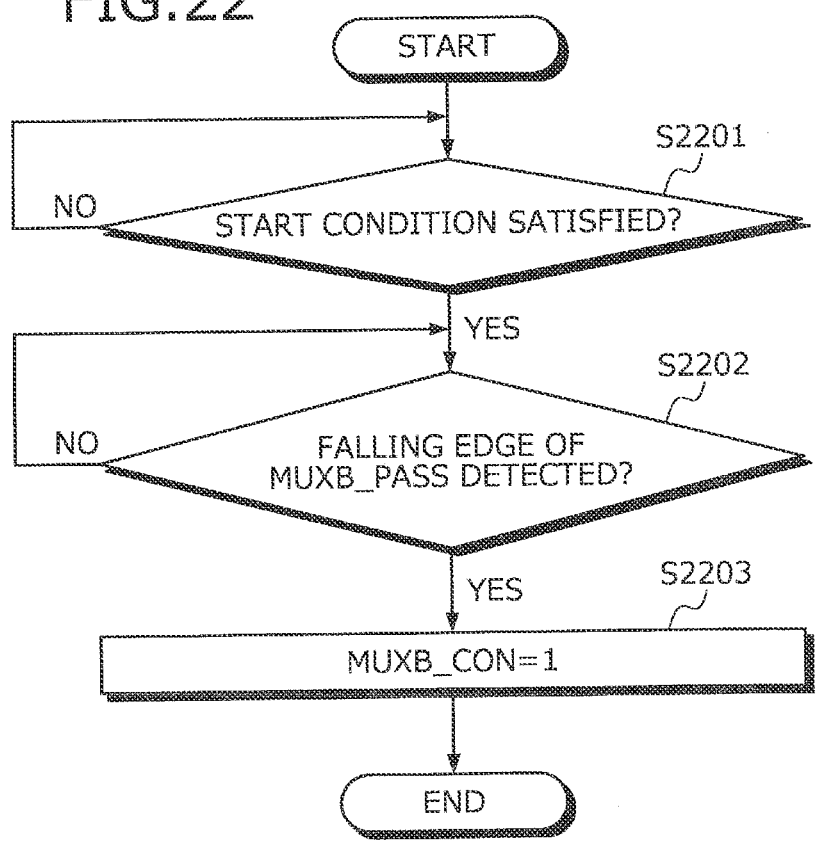

FIG. 22 will be described. The control unit 701 determines whether a start condition is satisfied (step S2201). At step S2201, the start condition is execution of the process of step S1902. The processes of steps S2201 to S2203 are performed after execution of the process of step S1902. At step S2201, if the start condition is not satisfied (step S2201: NO), the control unit 701 returns to step S2201.

On the other hand, if the start condition is satisfied (step S2201: YES), the control unit 701 determines whether the falling edge of MUXB_PASS is detected (step S2202). If the falling edge of MUXB_PASS is not detected (step S2202: NO), the control unit 701 returns to step S2202.

On the other hand, if the falling edge of MUXB_PASS is detected (step S2202: YES), the control unit 701 sets MUXB_CON=1 (step S2203) and terminates a series of the processes. As a result, the second switching unit 102 selects an output signal of the delay element at the last stage of the first delay line L1, based on the value of the second selection signal MUXB_CON. As a result, the control unit 701 takes the high period corresponding to a half cycle of the second clock signal Ref CLK into the TDC 1600.

Figure 23:
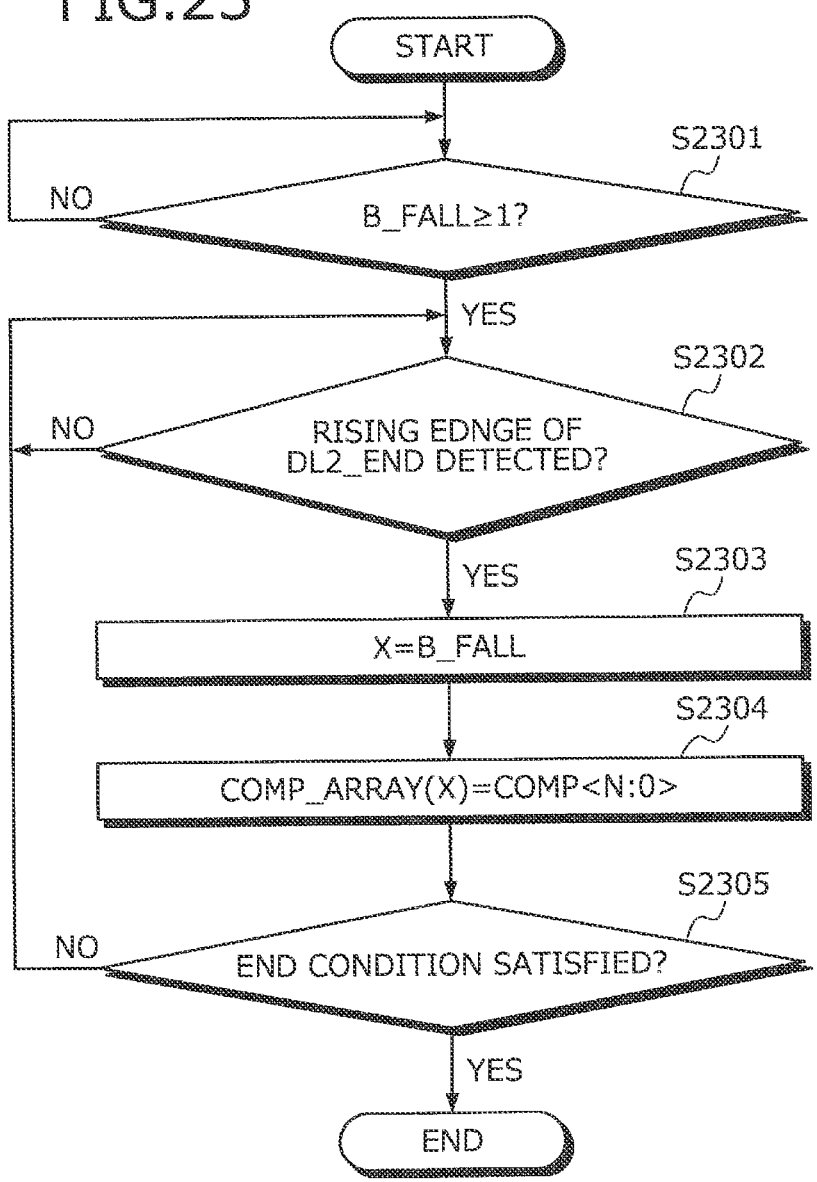

FIG. 23 will be described. The control unit 701 determines whether B_FALL≥1 is satisfied (step S2301). If B_FALL≥1 is not satisfied (step S2301: NO), the control unit 701 returns to step S2301.

On the other hand, if B_FALL≥1 is satisfied (step S2301: YES), the control unit 701 determines whether the rising edge of the DL2_END is detected (step S2302). If the rising edge of the DL2_END is not detected (step S2302: NO), the control unit 701 returns to step S2302.

Figure 20:
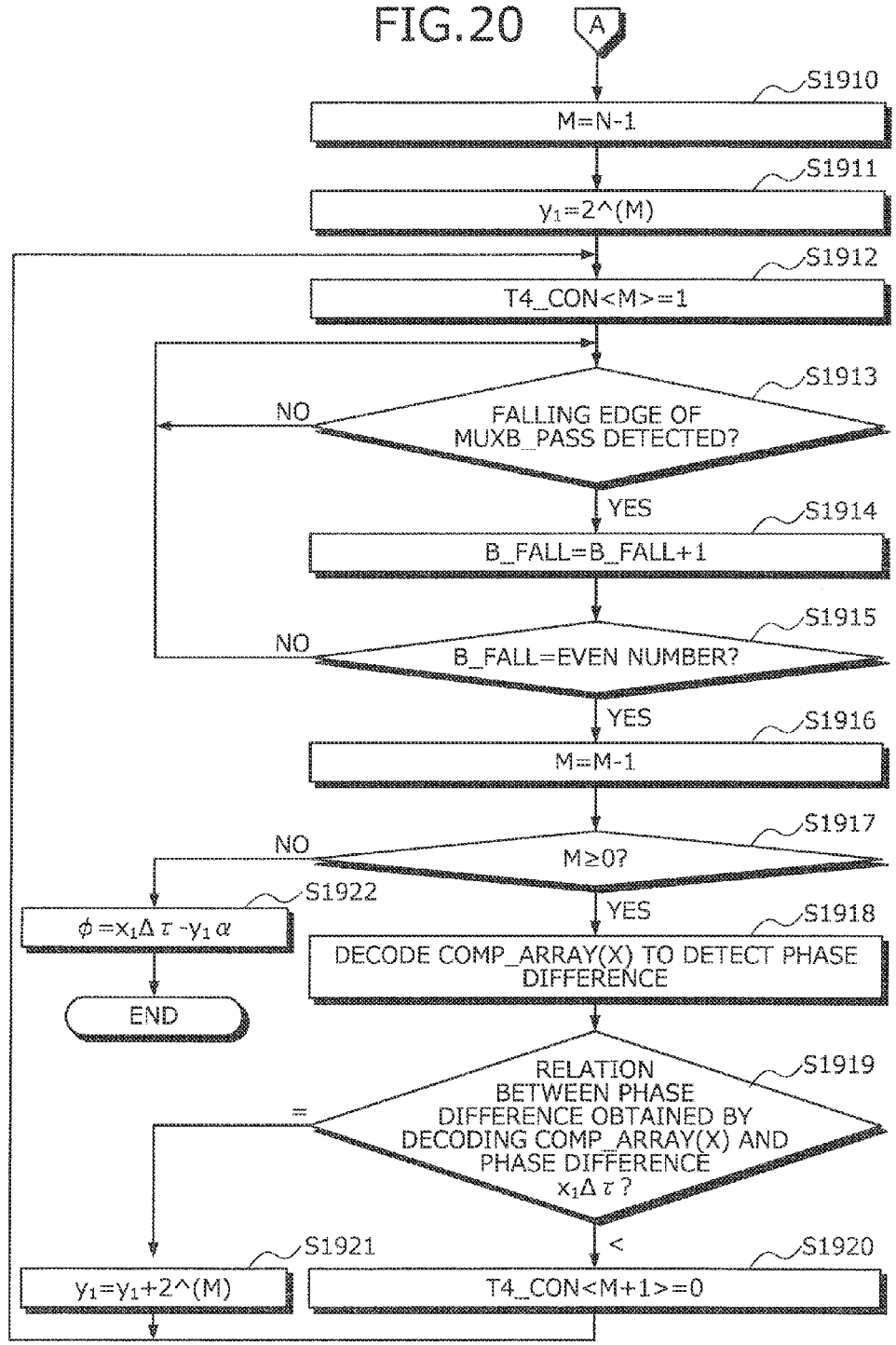

If the rising edge of the DL2_END is detected (step S2302: YES), the controlling unit 701 sets X=B_FALL (step S2303) and sets COMP_ARRAY(X)=COMP<N:0> (step S2304). The control unit 701 determines whether an end condition is satisfied (step S2305). For example, the end condition may be satisfied when the process of step S1922 depicted in FIG. 20 is executed.

If the end condition is not satisfied (step S2305: NO), the control unit 701 returns to step S2302. If the end condition is satisfied (step S2305: YES), a series of the processes is terminated.

Figure 24:
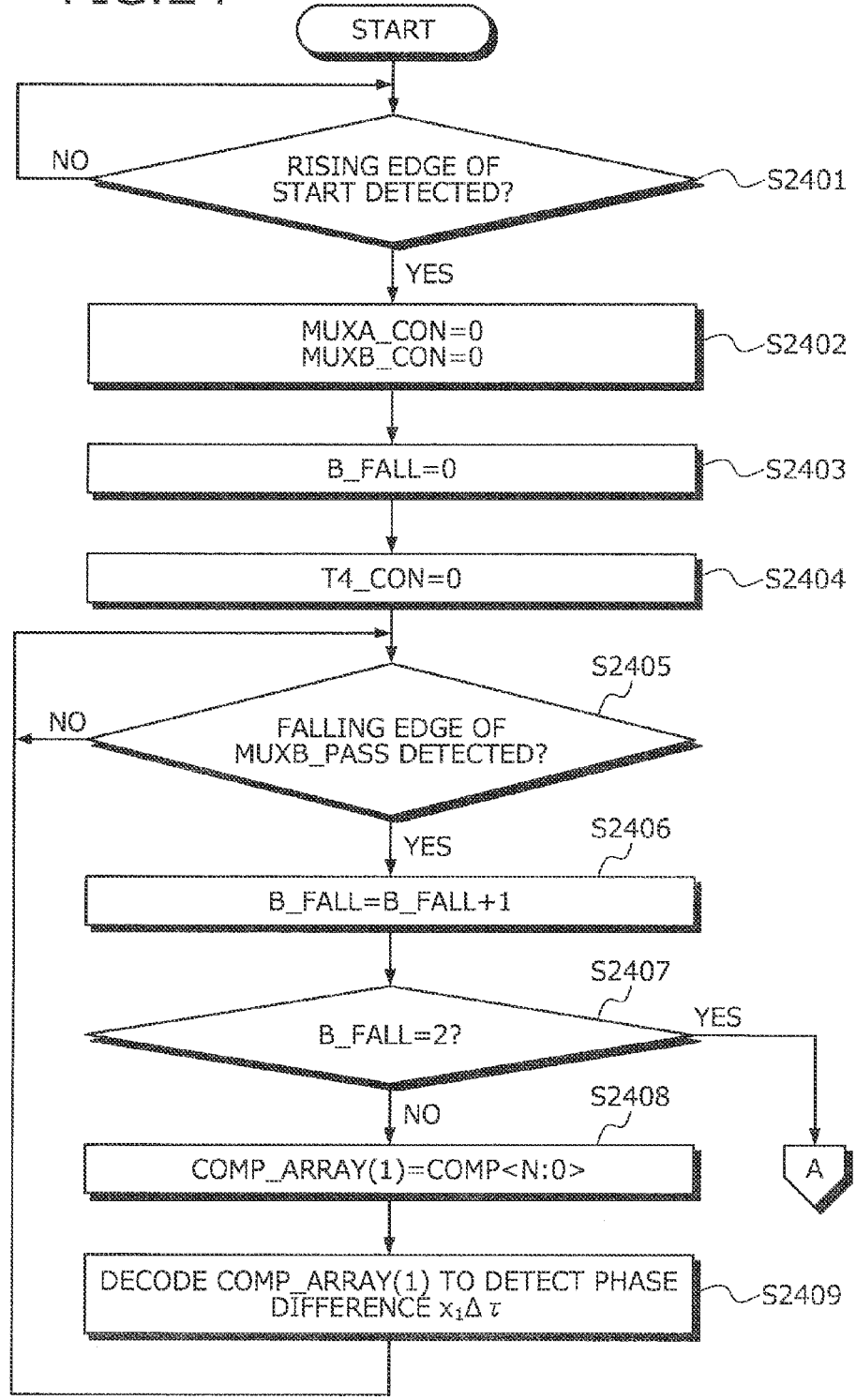
FIGS. 24 and 25 are explanatory views of a second exemplary control process procedure executed by the control unit 701 according to Example 2.
Figure 25:
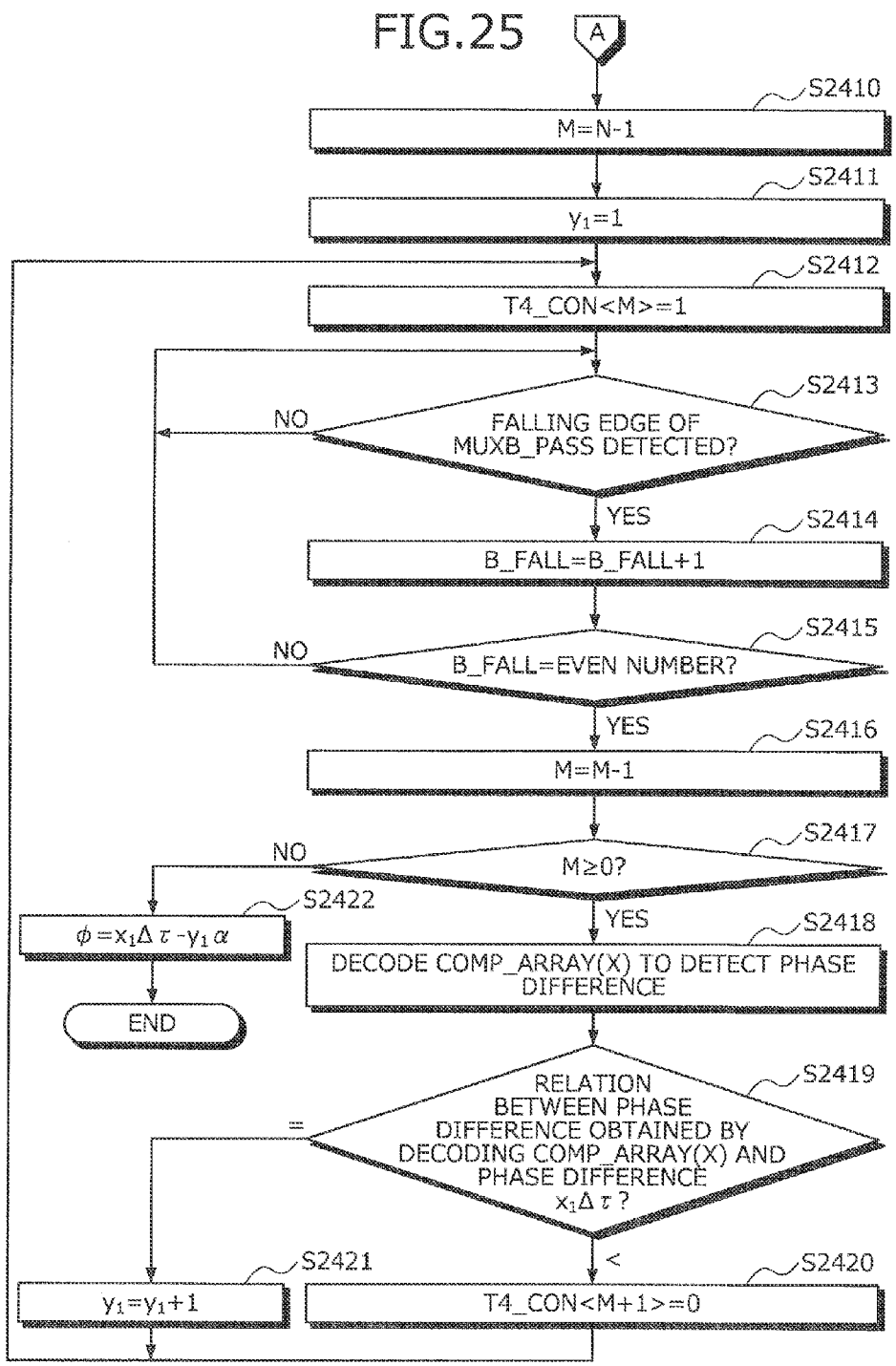

FIGS. 24 and 25 are explanatory views of a second exemplary control process procedure executed by the control unit 701 according to Example 2. In the second exemplary control process procedure, all the delay amounts adjustable by signals of respective bits of the control signal T4_CON are the same. In the second exemplary control process procedure, the switching timing of the first switching unit 101 and the second switching unit 102 is the same as the first exemplary control process procedure and therefore, will not be described in detail. Steps S2401 to S2409 are the same as steps S1901 to S1909, respectively, depicted in FIG. 19 and therefore, will not be described in detail.

At step S2407, if B_FALL is two (step S2407: YES), the control unit 701 sets M=N−1 (step S2410) and sets $y_1$=1 (step S2411). The control unit 701 sets T4_CON<M>=1 (step S2412) and determines whether the falling edge of MUXB_PASS is detected (step S2413). If the falling edge of MUXB_PASS is not detected (step S2413: NO), the control unit 701 returns to step S2413.

If the falling edge of MUXB_PASS is detected (step S2413: YES), the control unit 701 sets B_FALL=B_FALL+1 (step S2414) and determines whether B_FALL is an even number (step S2415). If B_FALL is an odd number (step S2415: NO), the control unit 701 returns to step S2413. On the other hand, if B_FALL is an even number (step S2415: YES), the control unit 701 sets M=M−1 (step S2416) and determines whether M20 is satisfied (step S2417).

If M≥0 is satisfied (step S2417: YES), the control unit 701 decodes COMP_ARRAY(X) to detect a phase difference (step S2418). The control unit 701 makes a comparison between a phase difference obtained by decoding COMP_ARRAY(X) and the phase difference $x_1\Delta\tau$ (step S2419). If the phase differences are the same (step S2419: =), the control unit 701 sets $y_1=y_1+1$ (step S2421) and returns to step S2412.

On the other hand, if the phase difference obtained by decoding COMP_ARRAY(X) is smaller than the phase difference $x_1\Delta\tau$ (step S2419: <), the control unit 701 sets T4_CON<M+1>=0 (step S2420) and goes to step S2412.

At step S2417, if M20 is not satisfied (step S2417: NO), the control unit 701 sets $\phi=x_1\Delta\tau-y_1\alpha$ (step S2422) and terminates a series of the processes.

The process of switching from the first state to the second state and the process of substituting COMP<N:0> for COMP_ARRAY(X) are the same as the first exemplary control process procedure and will not be described in detail.

FIGS. 26, 27, 28, 29, 30, and 31 are flowcharts of a third exemplary control process procedure executed by the control unit 701 according to Example 2. In the third exemplary control process procedure, the delay amounts adjustable by signals of respective bits of the control signal T4_CON are different and sequentially doubled in order from the least significant bit to the most significant bit of the control signal T4_CON. In the third exemplary control process procedure, the control unit 701 takes in each of the first clock signal_Signal and the second clock signal Ref CLK for one cycle.

Figure 28:
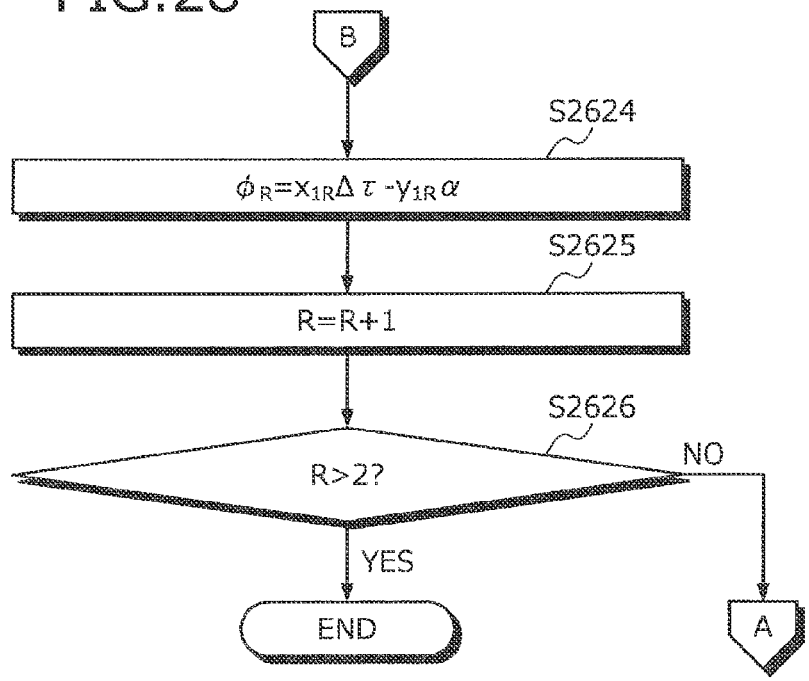

First, FIGS. 26 and 28 will be described. The control unit 701 determines whether the rising edge of START is detected (step S2601). If the rising edge of START is not detected (step S2601: NO), the control unit 701 returns to step S2601.

On the other hand, if the rising edge of START is detected (step S2601: YES), the control unit 701 sets MUXA_CON=0 and MUXB_CON=0 (step S2602). As a result, the first switching unit 101 selects and outputs the first clock signal_Signal based on the value of the first selection signal MUXA_CON to achieve the first state. The second switching unit 102 selects and outputs the second clock signal Ref CLK based on the value of the second selection signal MUXB_CON to achieve the first state. A change from the first state to the second state by the control unit 701 will be described with reference to FIGS. 29 and 30.

The control unit 701 sets R=1 (step S2603) and B_RISE=0 (step S2604) and the control unit 701 determines whether a second rising edge of MUXB_PASS is detected (step S2605). In the third exemplary control process procedure, since each of the first clock signal_Signal and the second clock signal Ref CLK is taken in for one cycle, two rising edges are generated when a takin-in clock signal passes through the first delay line L1 and the second delay line L2 only once. Therefore, for example, the controlling unit counts the rising edges to determine whether a rising edge is the second rising edge or not.

If the second rising edge of MUXB_PASS is not detected (step S2605: NO), the control unit 701 returns to step S2605. On the other hand, if the second rising edge of MUXB_PASS is detected (step S2605: YES), the control unit 701 sets B_RISE=B_RISE+1 (step S2606).

The control unit 701 determines whether B_RISE is two (step S2607). If B_RISE is not two (step S2607: NO), the control unit 701 sets COMP_ARRAY(1)=COMP<N:0> (step S2608) and decodes COMP_ARRAY(1) based on the first rising to detect a phase difference $x_{11}\Delta\tau$ (step S2609). The control unit 701 decodes COMP_ARRAY(1) based on the second rising edge to detect a phase difference $x_{12}\Delta\tau$ (step S2610) and returns to step S2605.

On the other hand, if B_FALL is two (step S2607: YES), the control unit 701 sets T4_CON=0 (step S2611). At step S2611, the values of all the bits of T4_CON are set to zero. The control unit 701 sets M=N−1 (step S2612) and sets $y_{1R}=2^\wedge(M)$ (step S2613).

The control unit 701 sets T4_CON<M>=1 (step S2614). In this case, since M is the maximum value, the most significant bit of T4_CON is set to one. The control unit 701 determines whether the second rising edge of MUXB_PASS is detected (step S2615). If the second rising edge of MUXB_PASS is not detected (step S2615: NO), the control unit 701 returns to step S2615. On the other hand, if an R-th rising edge of MUXB_PASS is detected (step S2615: YES), the control unit 701 sets B_RISE-B_RISE+1 (step S2616).

The control unit 701 determines whether B_RISE is an even number (step S2617). If B_RISE is not an even number (step S2617: NO), the control unit 701 returns to step S2615. If B_FALL is an even number (step S2617: YES), the control unit 701 sets M=M−1 (step S2618). The control unit 701 determines whether M20 is satisfied (step S2619).

If M≥0 is satisfied (step S2619: YES), the control unit 701 decodes COMP_ARRAY(X) based on the R-th rising to detect a phase difference (step S2620). For COMP_ARRAY (X), as described in a flowchart of FIG. 31, a value of COMP<N:0> is substituted that is obtained when the rising edge of DL2_END is detected. X is B_RISE. The control unit 701 makes a comparison between a phase difference obtained by decoding COMP_ARRAY(X) based on the R-th rising and the phase difference $x_{1R}\Delta\tau$ (step S2621).

In the case of the same values (step S2621:=), the control unit 701 sets $y_{1R}=y_{1R}+2^{\wedge}(M)$ (step S2623) and goes to step S2614. If the phase difference obtained by decoding COMP_ARRAY(X) based on the R-th rising is smaller than the phase difference $x_{1R}\Delta\tau$ (step S2621:<), the control unit 701 sets T4_CON<M+1>=0 (step S2622) and goes to step S2614.

On the other hand, if M20 is not satisfied (step S2619: NO), the control unit 701 sets $\phi_R=x_{1R}\Delta\tau-y_{1R}\alpha$ (step S2624) and sets R=R+1 (step S2625) to determines whether R>2 is satisfied (step S2626). If R>2 is not satisfied (step S2626: NO), the control unit 701 returns to step S2611. On the other hand, if R>2 is satisfied (step S2626: YES), the control unit 701 terminates a series of the processes. A method of increasing the delay amount τ4 of the third delay element C32 can variously be changed.

Figure 29:
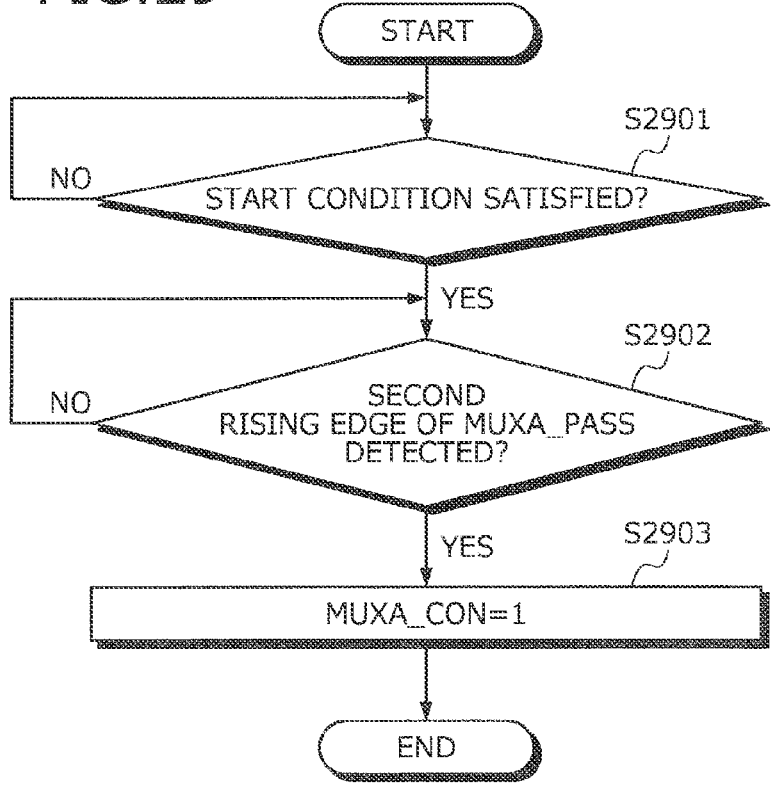

FIG. 29 will be described. In FIG. 29, the control unit 701 switches the first switching unit 101 from the first state to the second state. The control unit 701 determines whether a start condition is satisfied (step S2901). At step S2901, the start condition is execution of the process of step S2602. The processes of steps S2902 to S2903 are performed after execution of the process of step S2602. If the start condition is not satisfied (step S2901: NO), the control unit 701 returns to step S2901.

On the other hand, if the start condition is satisfied (step S2901: YES), the control unit 701 determines whether the second rising edge of MUXA_PASS is detected (step S2902). If the second rising edge of MUXA_PASS is not detected (step S2902: NO), the control unit 701 returns to step S2902.

On the other hand, if the second rising edge of MUXA_PASS is detected (step S2902: YES), the control unit 701 sets the first selection signal MUXA_CON=1 (step S2903) and terminates a series of the processes. As a result, the first switching unit 101 selects and outputs an output signal of the delay element at the last stage of the second delay line L2 according to a value of the first selection signal MUXA_CON. As a result, the control unit 701 takes the high period corresponding to a half cycle of the first clock signal_Signal into the TDC 1600.

Figure 30:
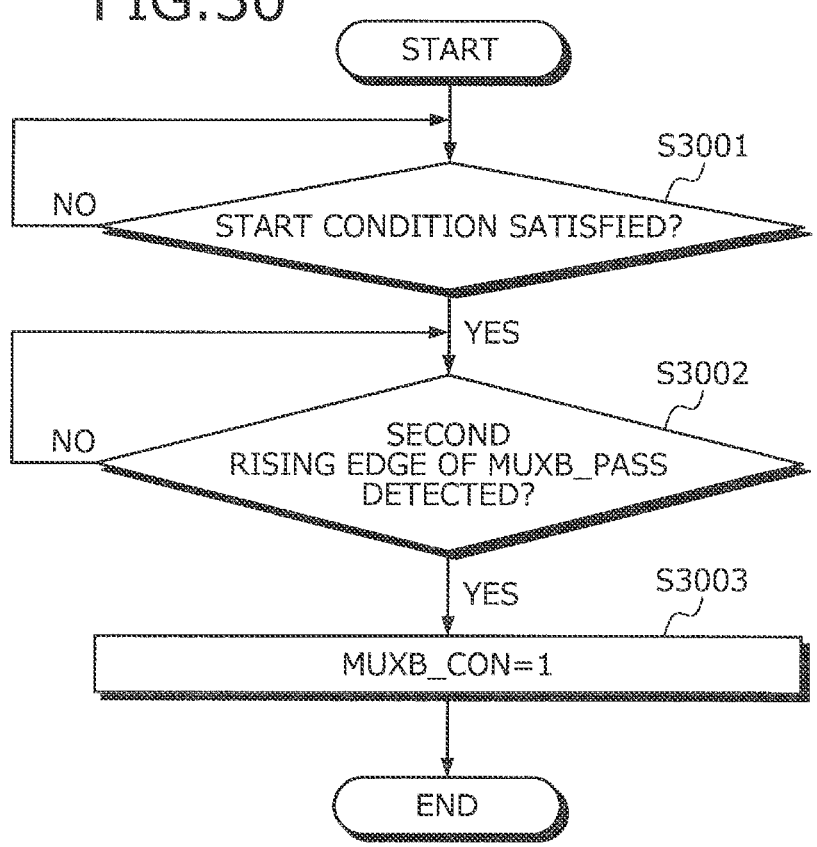

FIG. 30 will be described. In FIG. 30, the control unit 701 switches the second switching unit 102 from the first state to the second state. The control unit 701 determines whether a start condition is satisfied (step S3001). At step S3001, the start condition is execution of the process of step S2602. The processes of steps S3002 to S3003 are performed after execution of the process of step S2602. If the start condition is not satisfied (step S3001: NO), the control unit 701 returns to step S3001.

On the other hand, if the start condition is satisfied (step S3001: YES), the control unit 701 determines whether the second rising edge of MUXB_PASS is detected (step S3002).

If the second rising edge of MUXB_PASS is not detected (step S3002: NO), the control unit 701 returns to step S3002.

On the other hand, if the second rising edge of MUXB_PASS is detected (step S3002: YES), the control unit 701 sets the second selection signal MUXB_CON=1 (step S3003) and terminates a series of the processes. As a result, the second switching unit 102 selects and outputs an output signal of the delay element at the last stage of the first delay line L1, according to a value of the second selection signal MUXB_CON. As a result, the control unit 701 takes the high period corresponding to a half cycle of the second clock signal Ref CLK into the TDC 1600.

Figure 31:
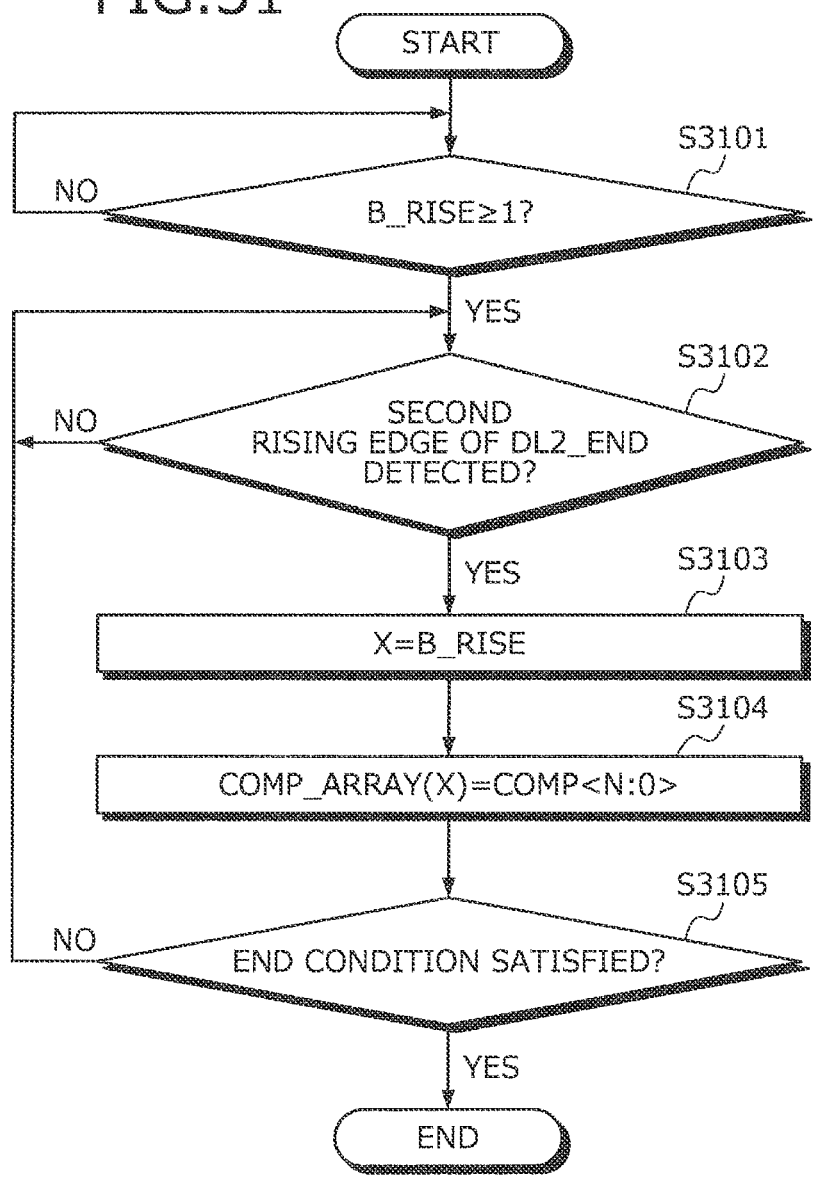

FIG. 31 will be described. The control unit 701 determines whether B_RISE≥1 is satisfied (step S3101). If B_RISE≥1 is not satisfied (step S3101: NO), the control unit 701 returns to step S3101.

On the other hand, if B_FALL≥1 is satisfied (step S3101: YES), the control unit 701 determines whether the second rising edge of DL2_END is detected (step S3102). If the second rising edge of DL2_END is not detected (step S3102: NO), the control unit 701 returns to step S3102.

If the second rising edge of the DL2_END is detected (step S3102: YES), the controlling unit 701 sets X=B_RISE (step S3103) and sets "COMP_ARRAY(X)=COMP<N:0>" (step S3104). The control unit 701 determines whether an end condition is satisfied (step S3105). For example, the end condition may be satisfied when the determination is YES at step S2626 depicted in FIG. 28.

If the end condition is not satisfied (step S3105: NO), the control unit 701 returns to step S3102. On the other hand if the end condition is satisfied (step S3105: YES), a series of the processes is terminated.

Figure 32:
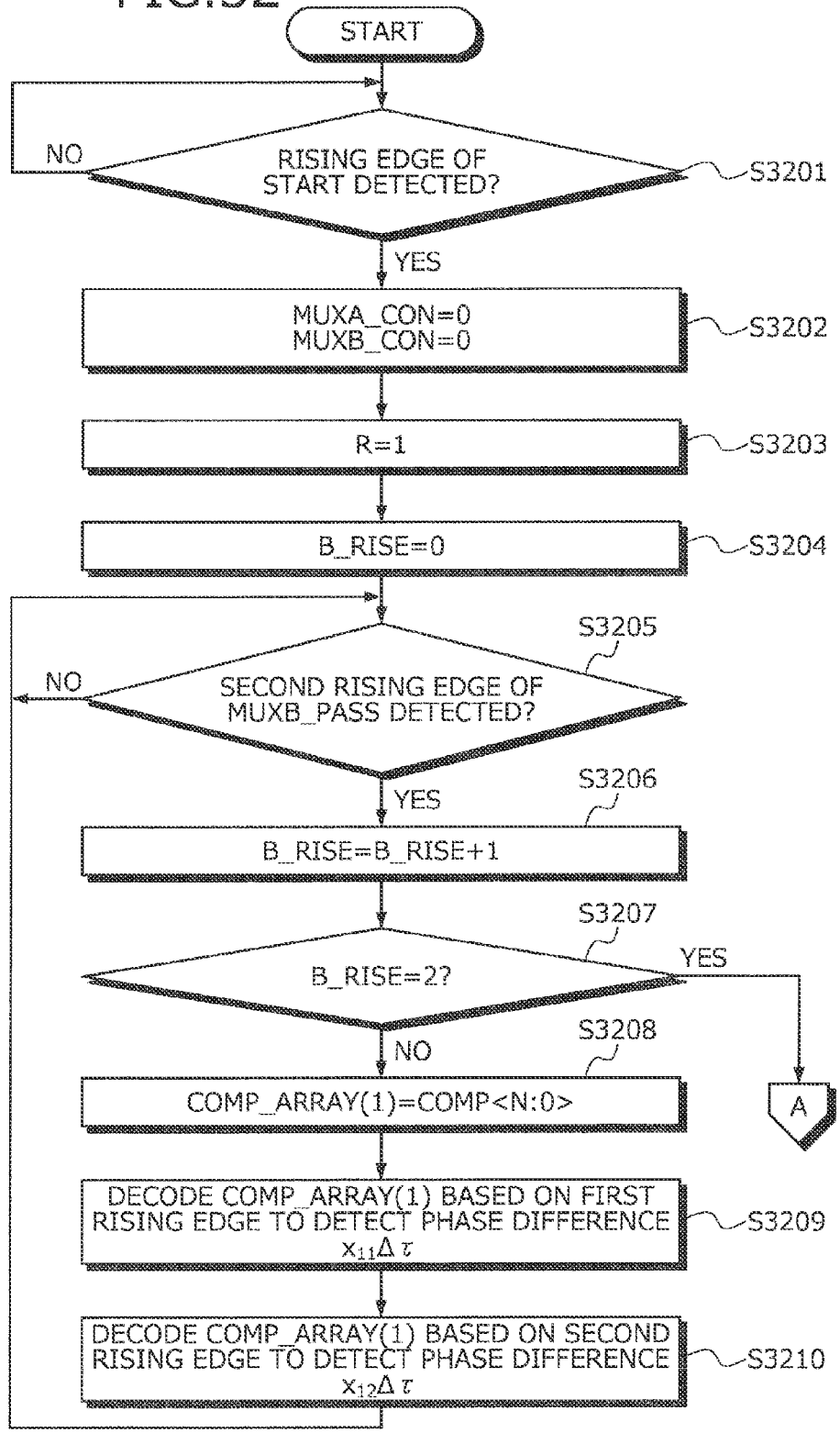
FIGS. 32, 33, and 34 are flowcharts of a fourth exemplary control process procedure executed by the control unit 701 according to Example 2.
Figure 33:
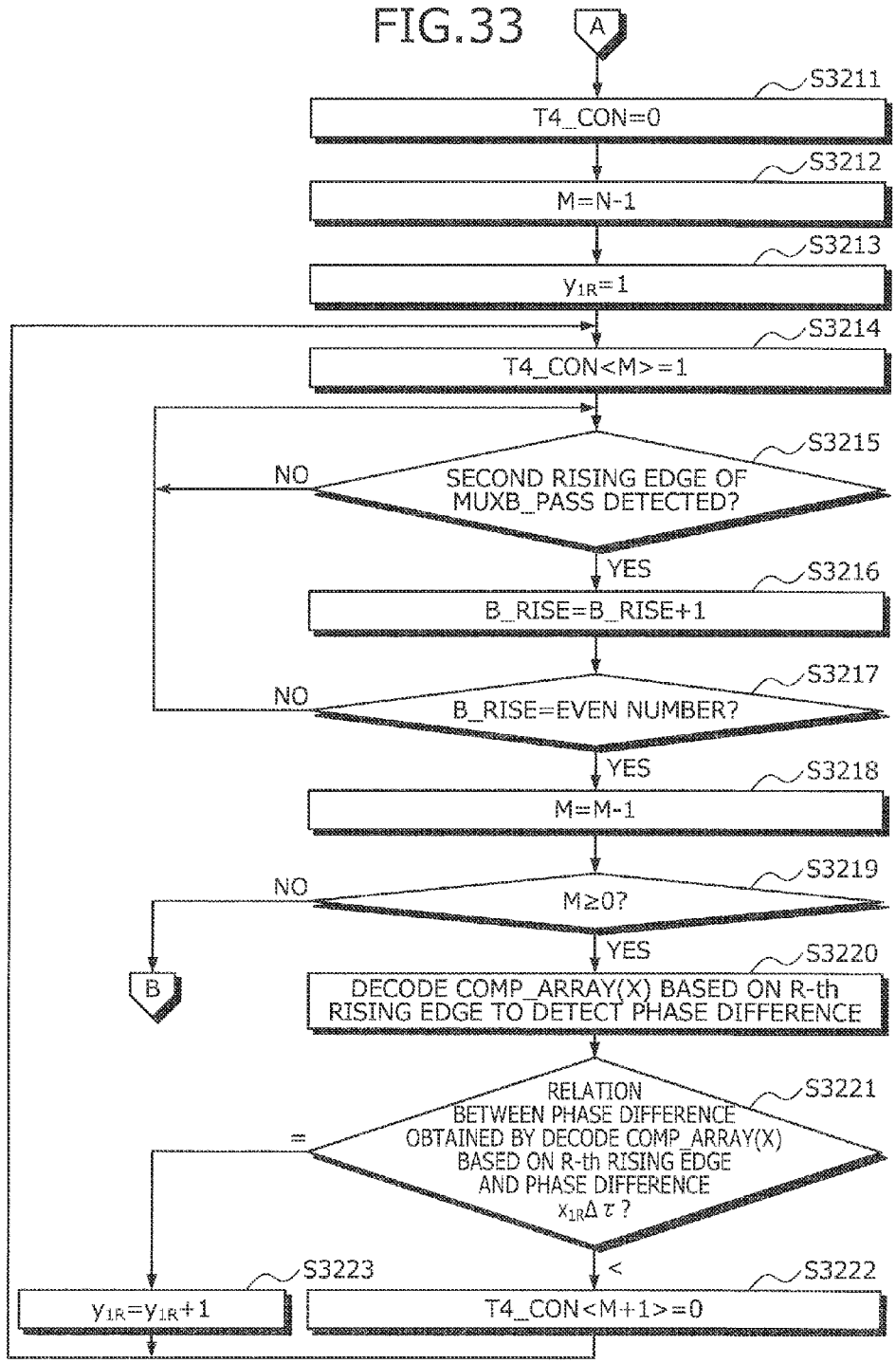
Figure 34:
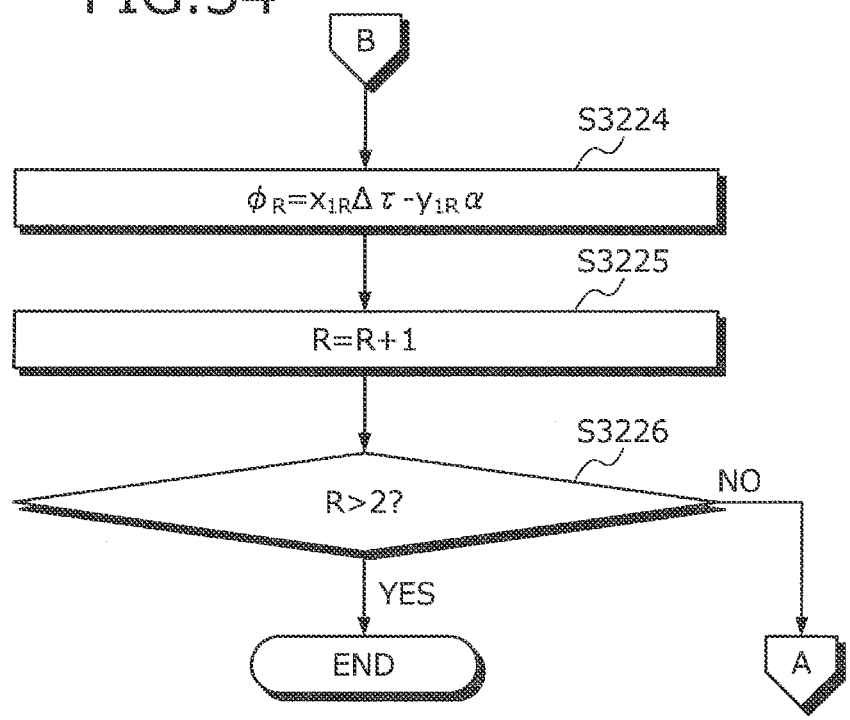

FIGS. 32, 33, and 34 are flowcharts of a fourth exemplary control process procedure executed by the control unit 701 according to Example 2. In the fourth exemplary control process procedure, all the delay amounts adjustable by signals of respective bits of the control signal T4_CON are the same. In the fourth exemplary control process procedure, the control unit 701 takes in each of the first clock signal_Signal and the second clock signal Ref CLK for one cycle.

Figure 26:
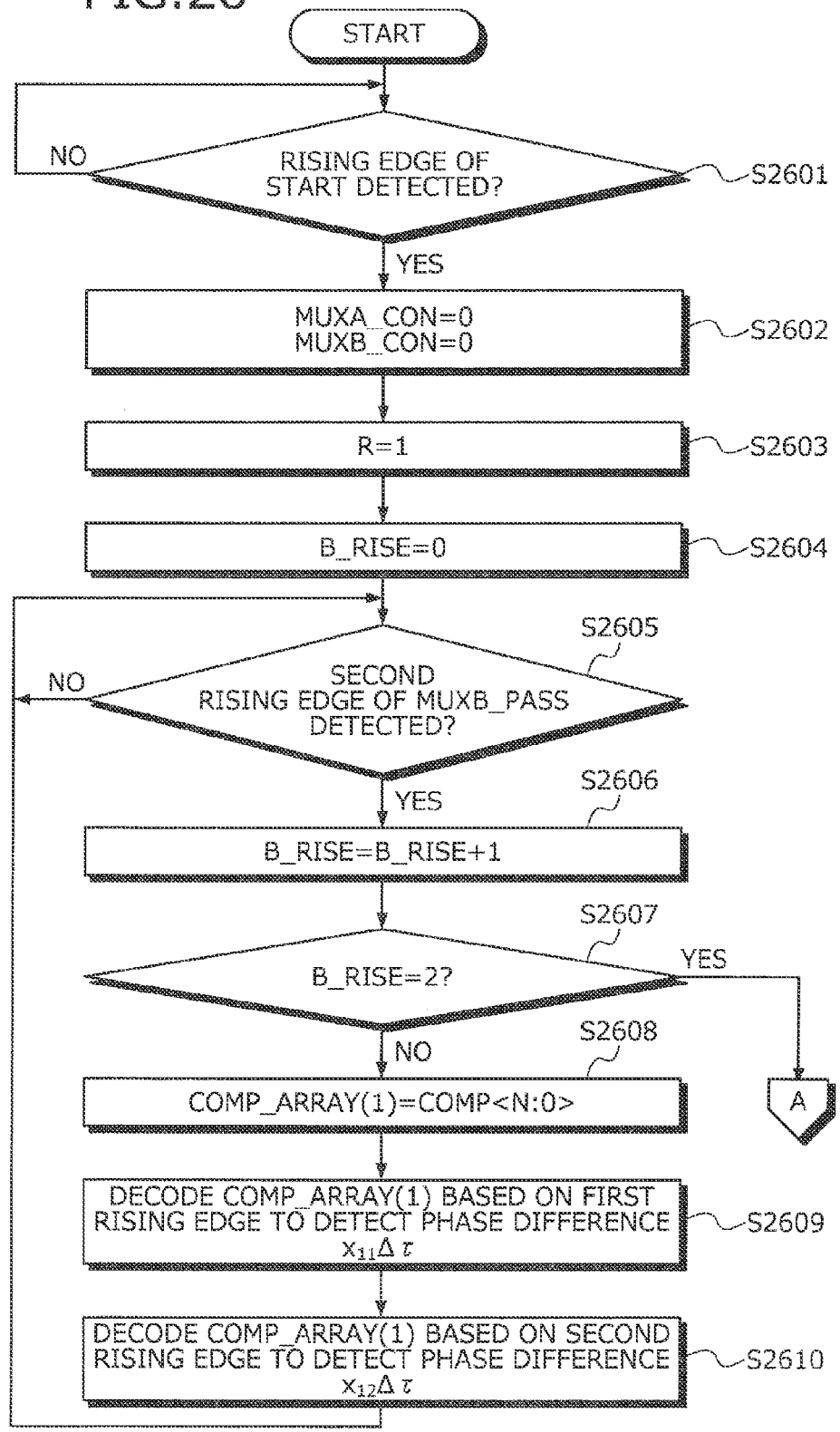
FIGS. 26, 27, 28, 29, 30, and 31 are flowcharts of a third exemplary control process procedure executed by the control unit 701 according to Example 2.

Operations at steps S3201 to S3210 are the same operations as at steps S2601 to S2610, respectively, depicted in FIG. 26. Operations at steps S3211, S3212, and S3214 to S3221 are the same operations as at steps S2611, S2612, and S2614 to S2621, respectively, depicted in FIG. 27.

Figure 27:
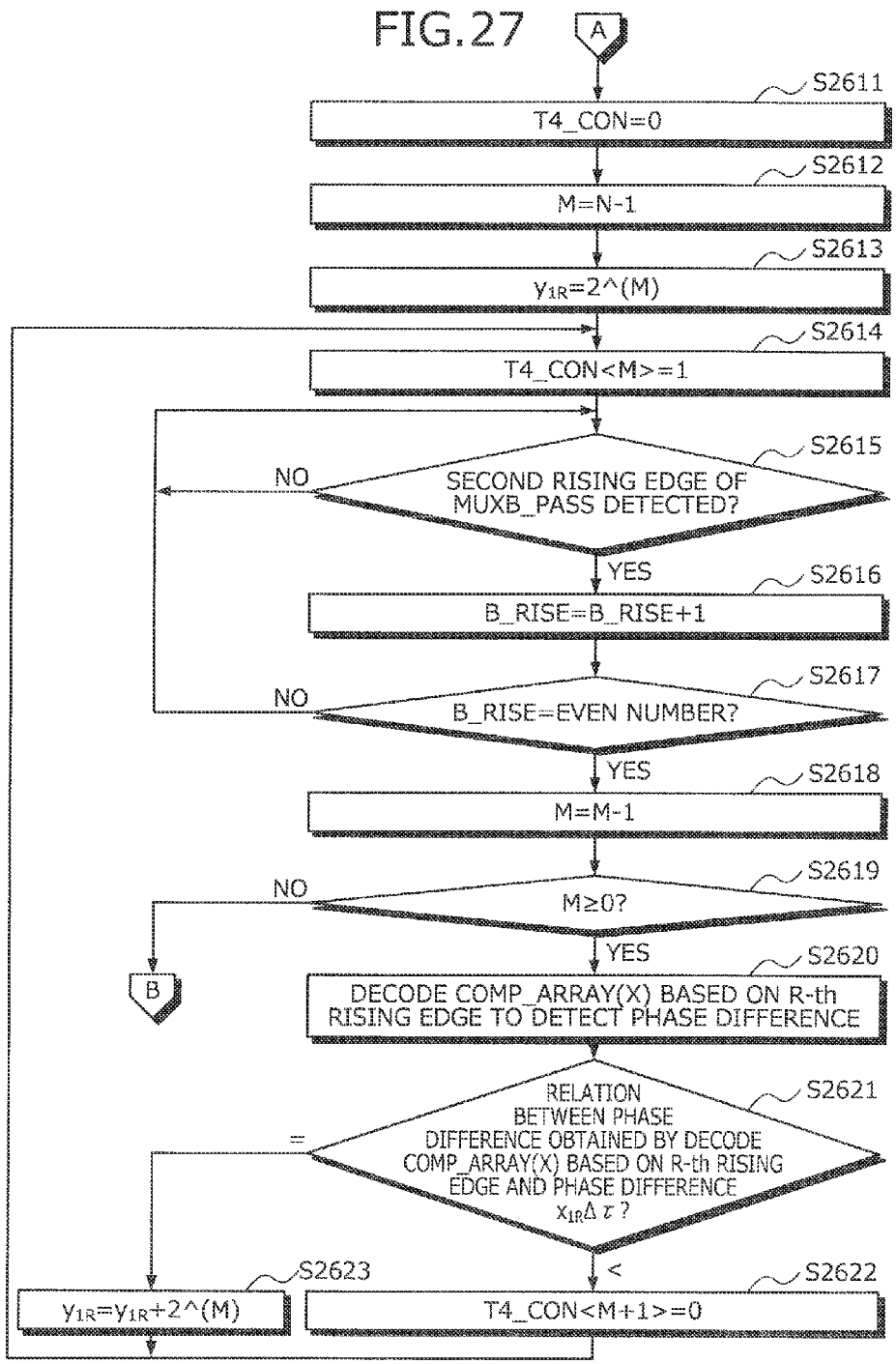

Operations at steps S3211 to S3213 and S3214 to S3221 are the same operations as at steps S2611 to S2613 and S2614 to S2621, respectively, depicted in FIG. 27. Steps S3224 to S3226 are the same processes as steps S2624 to S2626, respectively, depicted in FIG. 28.

At step S3213, the control unit 701 sets $y_{1R}=1$ (step S3213) and goes to step S3214. At step S3223, the control unit 701 sets $y_{1R}=y_{1R}+1$ (step S3223) and returns to step S3214.

The phase difference ϕ described above is expressed by Δτ and α, which is a unit delay amount of the third delay element. Therefore, the control unit 701 corrects Δτ with α, which is a delay amount smaller than Δτ, to enable the TDC 1600 to improve the accuracy of the phase difference detection. The control unit 701 also normalizes the phase difference ϕ. As a result, the TDC 1600 can improve the accuracy of phase difference detection.

The normalization is to divide a phase difference by a cycle period. Even when the phase difference changes, if one cycle period changes to the same multiple number and sufficient accuracy is obtained, a variation of a normalized phase difference is small. For example, when a normalized phase difference is 3/13, if a delay amount of a delay element is halved, the phase difference is 6/26 and the normalized phase difference does not vary.

Figure 35:
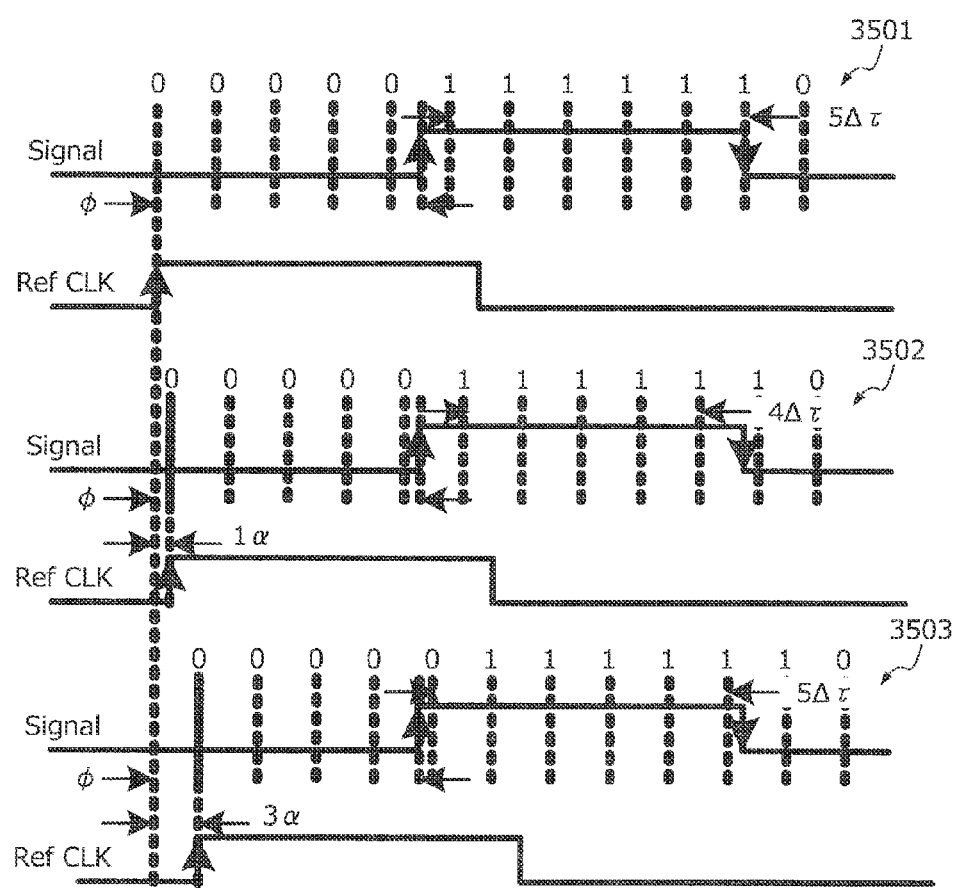
FIG. 35 is an explanatory view of a detection example of a cycle period of first and second clocks according to Example 2.

FIG. 35 is an explanatory view of a detection example of a cycle period of first and second clocks according to Example 2. In a waveform diagram 3501, the control unit 701 decodes COMP<N:0> in the first state to detect the phase difference $x_1\Delta\tau$ and decodes COMP<N:0> in the first state based on the falling edge to detect the delay amount $x_2\Delta\tau$. For example, the control unit 701 sequentially counts periods from the least significant bit of COMP<N:0> in the first state until zero changes to one (rising) for the decoding. In the waveform diagram 3501, $x_1$ is five and the phase difference $x_1\Delta\tau$ is 5ΔΔ. For example, the control unit 701 sequentially counts periods from the least significant bit of COMP<N:0> in the first state until one changes to zero (falling) for the decoding. In the waveform diagram 3501, $x_2$ is ten and the phase difference $x_2\Delta\tau$ is $10\Delta\tau$.

In a waveform diagram 3502, the control unit 701 changes an increase amount for the delay amount in the first state of the third delay element C32 after the second clock signal Ref CLK passes through the first delay element C1N and passes through the second switching unit 102. In the waveform diagram 3502, out of the changed increase amounts, the control unit 701 identifies a smallest increase amount $y_2\alpha$ at which the delay amount obtained by decoding COMP<N:0> in the first state based on the falling edge becomes smaller than a delay amount $x_2\Delta\tau$. In the waveform diagram 3502, the smallest increase amount $y_2\alpha$ is $1\alpha$.

In a waveform diagram 3503, the control unit 701 changes an increase amount for the delay amount in the first state of the third delay element C32 after the second clock signal Ref CLK passes through the first delay element C1N and passes through the second switching unit 102. In the waveform diagram 3503, out of the changed increase amounts, the control unit 701 identifies the smallest first increase amount $y_1\alpha$ at which the phase difference obtained by decoding COMP<N:0> in the first state becomes smaller than the phase difference $x_1\Delta\tau$. In the waveform diagram 3503, the smallest increase amount $y_1\alpha$ is $3\alpha$.

The control unit 701 identifies the cycle period of the first clock signal and the second clock signal from following Equations (1) and (2).

Phase difference $\phi=x_1\Delta\tau-y_1\alpha$

Delay amount $dl=x_2\Delta\tau-y_2\alpha$ $$High\_Time = \text{delay amount } dl - \text{phase difference}$$
$$\phi=(x_2\Delta\tau-y_2\alpha)-(x_1\Delta\tau-y_1\alpha) \quad (1)$$

Cycle period_Period of the first clock signal and the second clock signal$=2\times$High_Time (2)

In the example of FIG. 35, the cycle period_Period is "$2\times((10\Delta\tau-1\alpha)-(5\Delta\tau-3\alpha))$" and is "$10\Delta\tau+4\alpha$".

Figure 36:
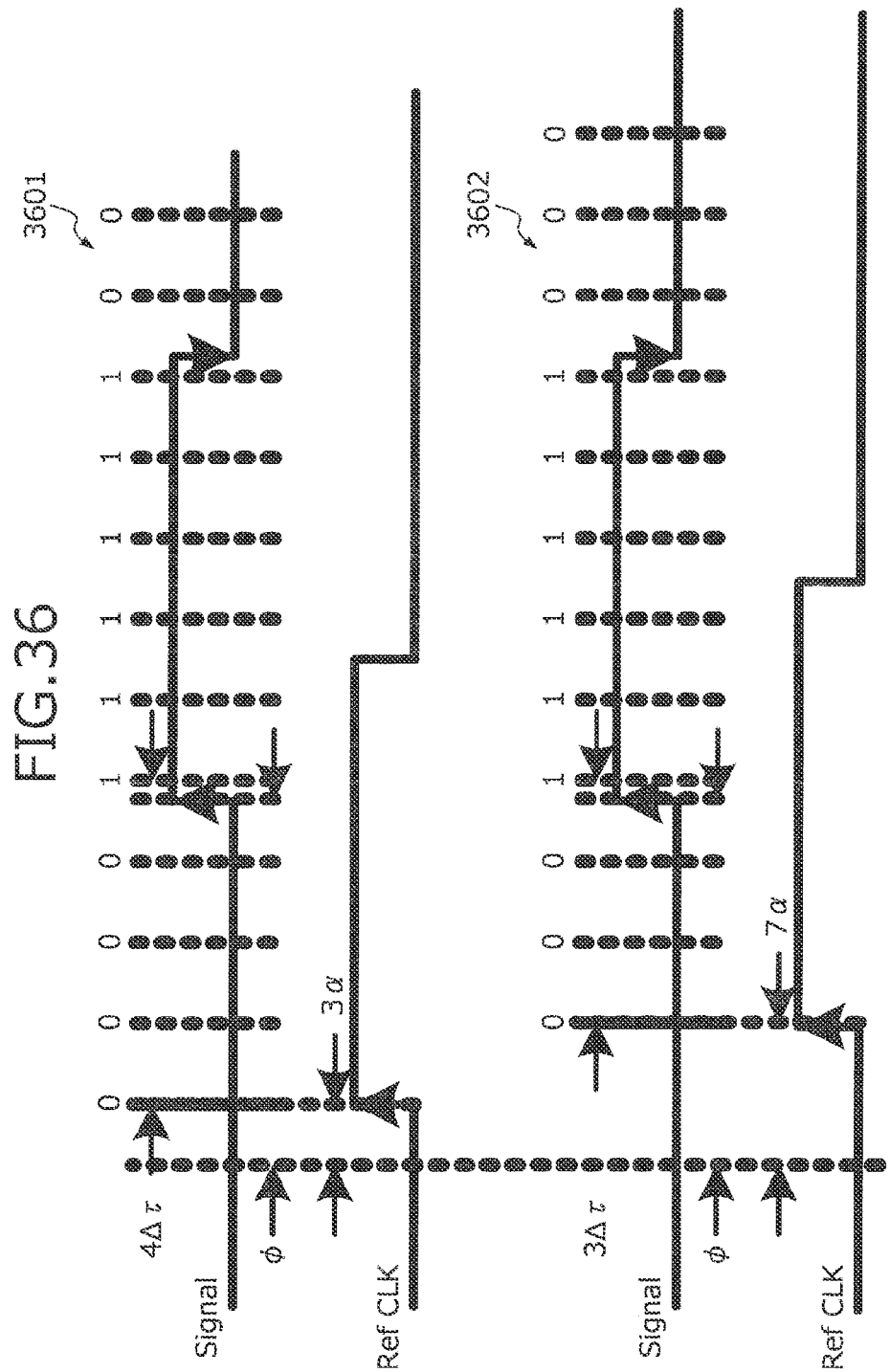
FIG. 36 is an explanatory view of an identification example of $\Delta\tau$ in Example 2.

FIG. 36 is an explanatory view of an identification example of $\Delta\tau$ in Example 2. In the example of FIG. 12, the control unit 701 represents $\Delta\tau$ in terms of $\alpha$. Out of the changed increase amounts, the control unit 701 identifies a smallest second increase amount $y_3\alpha$ at which the phase difference obtained by decoding the values stored in the FFs 710 to 71N becomes smaller than a phase difference while the identified smallest first increase amount $y_1\alpha$ is changed.

For example, the control unit 701 increases the increase amount from the smallest first increase amount $y_1\alpha$. As described above, the smallest first increase amount $y_1\alpha$ identified in the example of FIG. 18 is $3\alpha$, and the phase difference after changing the identified smallest first increase amount $y_1\alpha$ is $4\Delta\tau$. In FIG. 36, the phase difference at an increase amount of $7\alpha$ is smaller than the phase difference at an increase amount of $3\alpha$.

The control unit 701 subtracts the smallest first increase amount $y_1\alpha$ from the smallest second increase amount $y_3\alpha$. Although $\Delta\tau$ described above is a value preset at the time of designing, a more accurate value of $\Delta\tau$ is obtained in this case. In the example of FIG. 36, $\Delta\tau$ is $7\alpha-3\alpha$, i.e., $4\alpha$.

The control unit 701 corrects the calculated phase difference with the subtraction result. For example, the control unit 701 replaces $\Delta\tau$ with $4\alpha$ as follows.

$\phi=5\Delta\tau-3\alpha$
$=5\times4\alpha-3\alpha$
$=17\alpha$

The output unit OUT may output the phase difference $\phi$ after the correction. As a result, the TDC 1600 can improve the accuracy of phase difference detection.

The control unit 701 corrects the cycle period of the first and second clock signals with the subtraction result. For example, the control unit 701 replaces $\Delta\tau$ with $4\alpha$ as follows.

Period$=10\Delta\tau+4\alpha$
$=10\times4\alpha+4\alpha$
$=44\alpha$

The control unit 701 calculates a phase difference by dividing the corrected phase difference by the corrected cycle period. For example, the control unit 701 calculates "divided phase difference=corrected $\phi$/corrected cycle period". The output unit OUT outputs the phase difference divided by the control unit 701. As a result the TDC 1600 can normalize the phase difference. Therefore, the TDC 1600 can improve the accuracy of phase difference detection.

Figure 37:
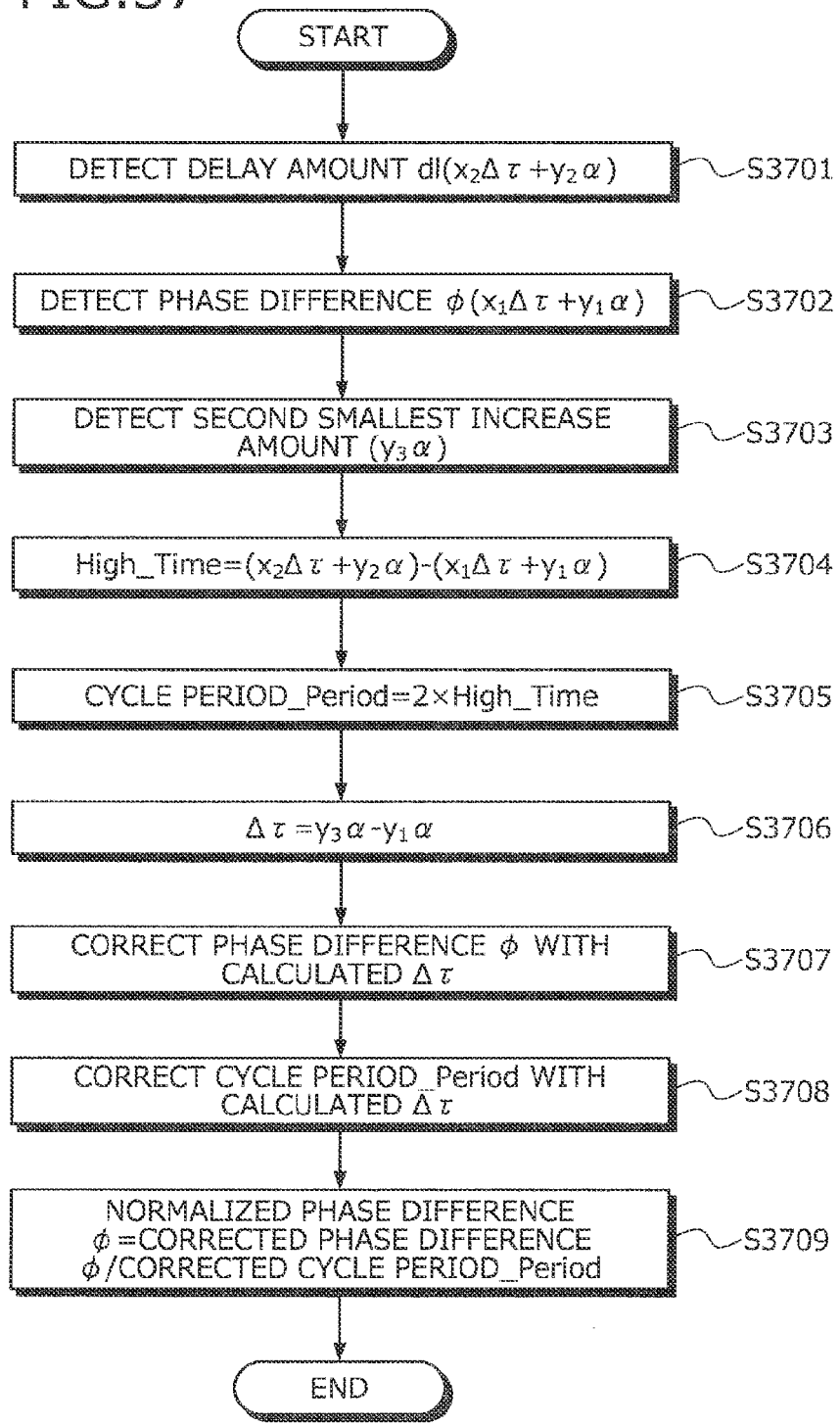
FIG. 37 is a flowchart of a normalization process procedure by the control unit 701 according to Example 2.

FIG. 37 is a flowchart of a normalization process procedure by the control unit 701 according to Example 2. First, the control unit 701 detects a delay amount dl ($x_2\Delta\tau+y_2\alpha$) (step S3701). At step S3701, the same process as the process depicted in FIG. 35 is executed. The control unit 701 detects the phase difference $\phi$ ($x_1\Delta\tau+y_1\alpha$) (step S3702). At step S3702, the same process as the process depicted in FIG. 35 is executed. The control unit 701 detects the smallest second increase amount $y_3\alpha$ (step S3703). At step S3703, the same process as the process depicted in FIG. 36 is executed.

The control unit 701 sets High_Time=($x_2\Delta\tau+y_2\alpha$)−($x_1\Delta\tau+y_1\alpha$) (step S3704) and sets the cycle period_Period=2× High_Time (step S3705). The control unit 701 corrects the phase difference $\phi$ with the calculated $\Delta\tau$ (step S3707). The control unit 701 corrects the cycle period_Period with the calculated $\Delta\tau$ (step S3708).

The control unit 701 sets the normalized phase difference $\phi$=corrected phase difference $\phi$/corrected cycle period_Period (step S3709). The output unit OUT outputs the normalized phase difference $\phi$.

Figure 38:
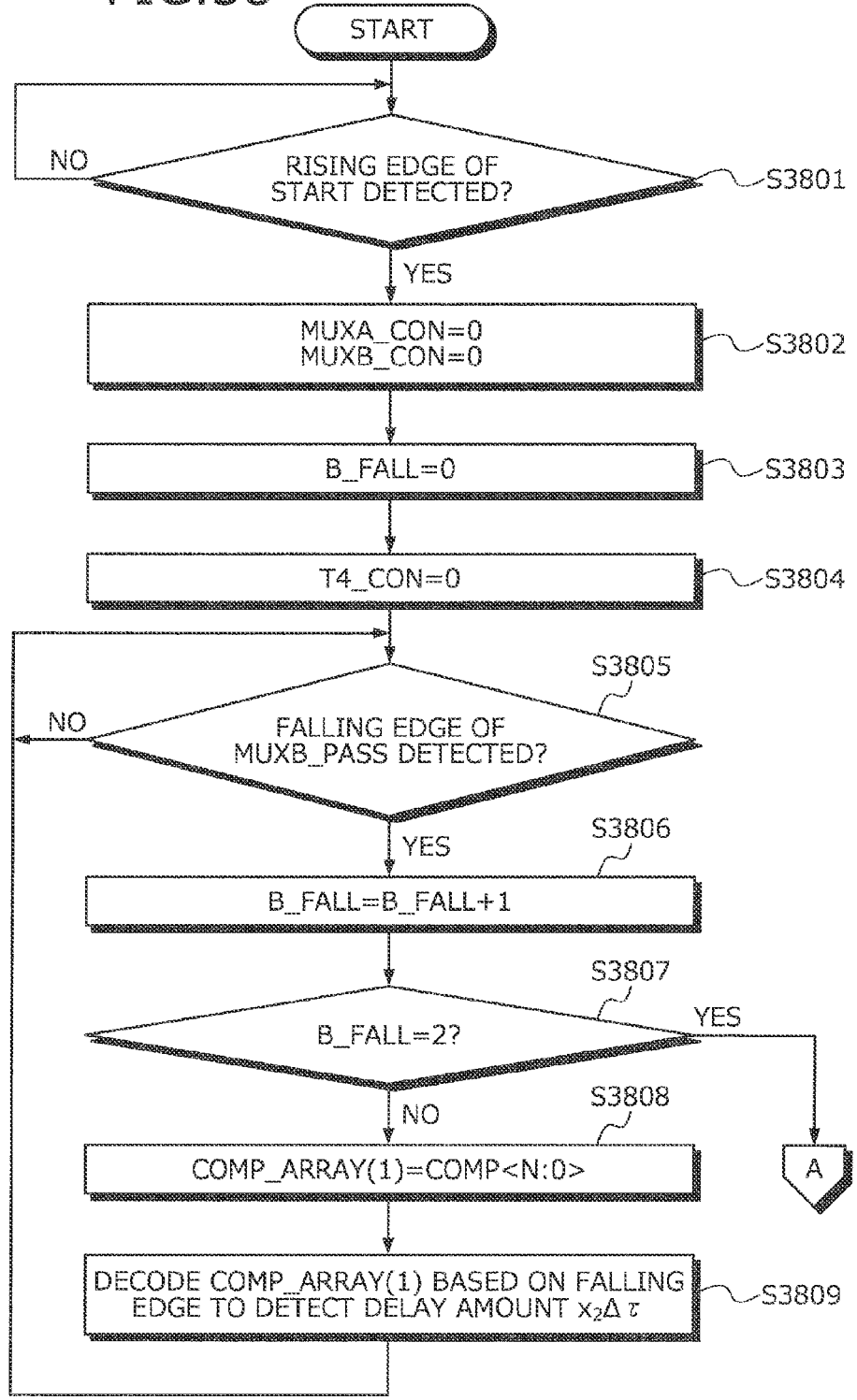
FIGS. 38 and 39 are flowcharts of a first exemplary detection process procedure for a delay amount dl by the control unit 701.
Figure 39:
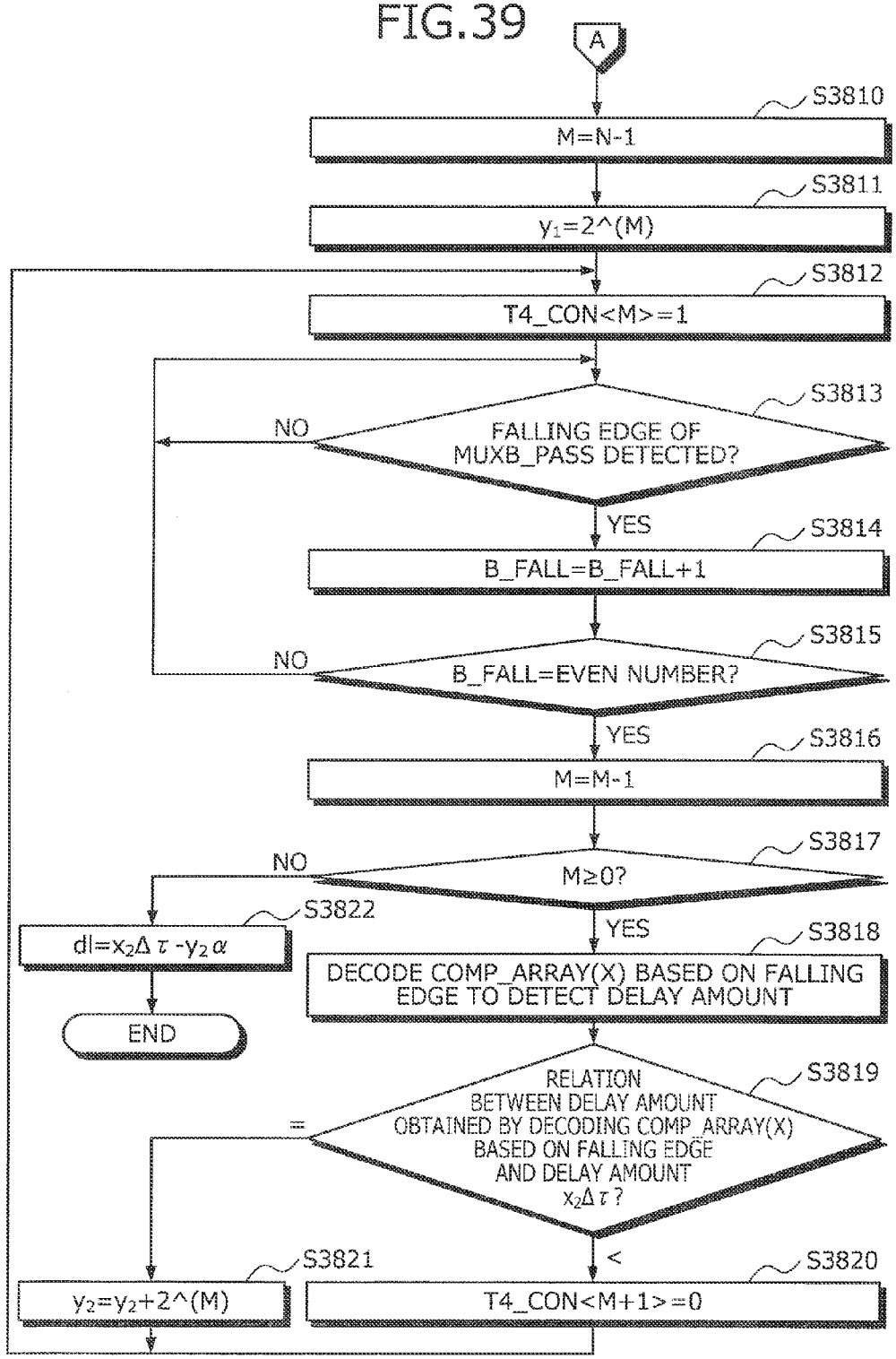

FIGS. 38 and 39 are flowcharts of a first exemplary detection process procedure for the delay amount dl by the control unit 701. In the first exemplary detection process procedure for the delay amount dl, the delay amounts adjustable by signals of respective bits of the control signal T4_CON are different and sequentially doubled in order from the least significant bit to the most significant bit of the control signal T4_CON.

Figure 19:
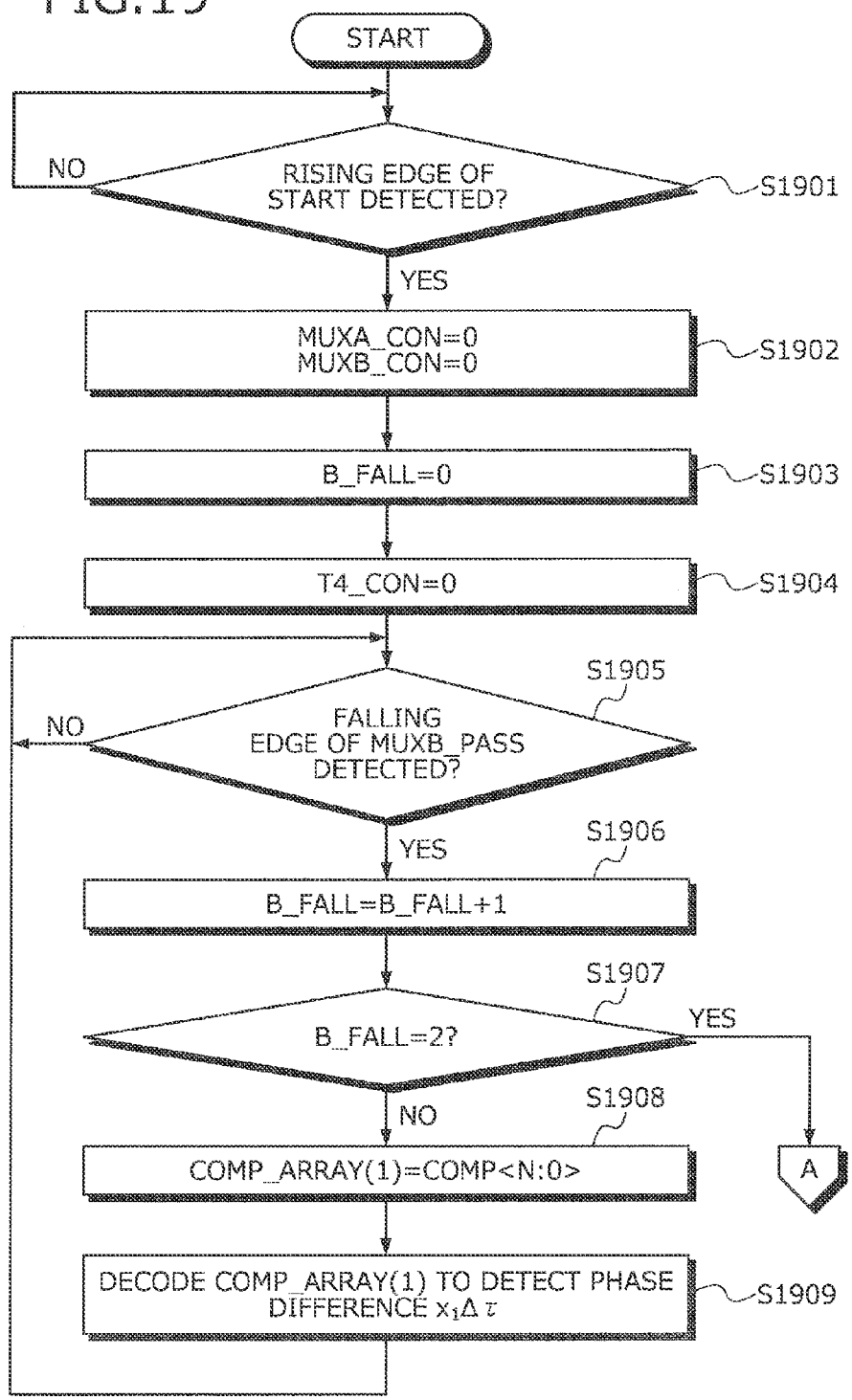
FIGS. 19, 20, 21, 22, and 23 are flowcharts of a first exemplary control process procedure executed by a control unit 701 according to Example 2.

Operations at steps S3801 to S3808 depicted in FIGS. 38 and 39 are the same operations as at S1901 to S1908, respectively, depicted in FIG. 19 and therefore, will not be described in detail. Operations at steps S3810 to S3817 and S3820 are the same operations as at steps S1910 to S1917 and S1920, respectively, depicted in FIG. 20 and therefore, will not be described in detail.

At step S3809, the control unit 701 decodes COMP_ARRAY(1) based on the falling edge to detect the delay amount $x_2\Delta\tau$ (step S3809) and returns to step S3805.

At step S3818, the control unit 701 decodes COMP_ARRAY(X) based on the falling edge to detect the delay amount (step S3818). The control unit 701 makes a comparison between the delay amount obtained by decoding COMP_ARRAY(X) based on the falling edge and the delay amount $x_2\Delta\tau$ (step S3819). If the delay amounts are the same (step S3819:=), the control unit 701 sets $y_2=y_2+2^{\wedge}(M)$ (step S3821) and returns to step S3812. If the delay amount obtained by decoding COMP_ARRAY(X) based on the falling edge is smaller than the delay amount $x_2\Delta\tau$ (step S3819:<), the control unit 701 goes to step S3820.

At step S3822, the control unit 701 sets the delay amount $dl=x_2\Delta\tau-y_2\alpha$ (step S3822) and terminates a series of the processes.

Figure 40:
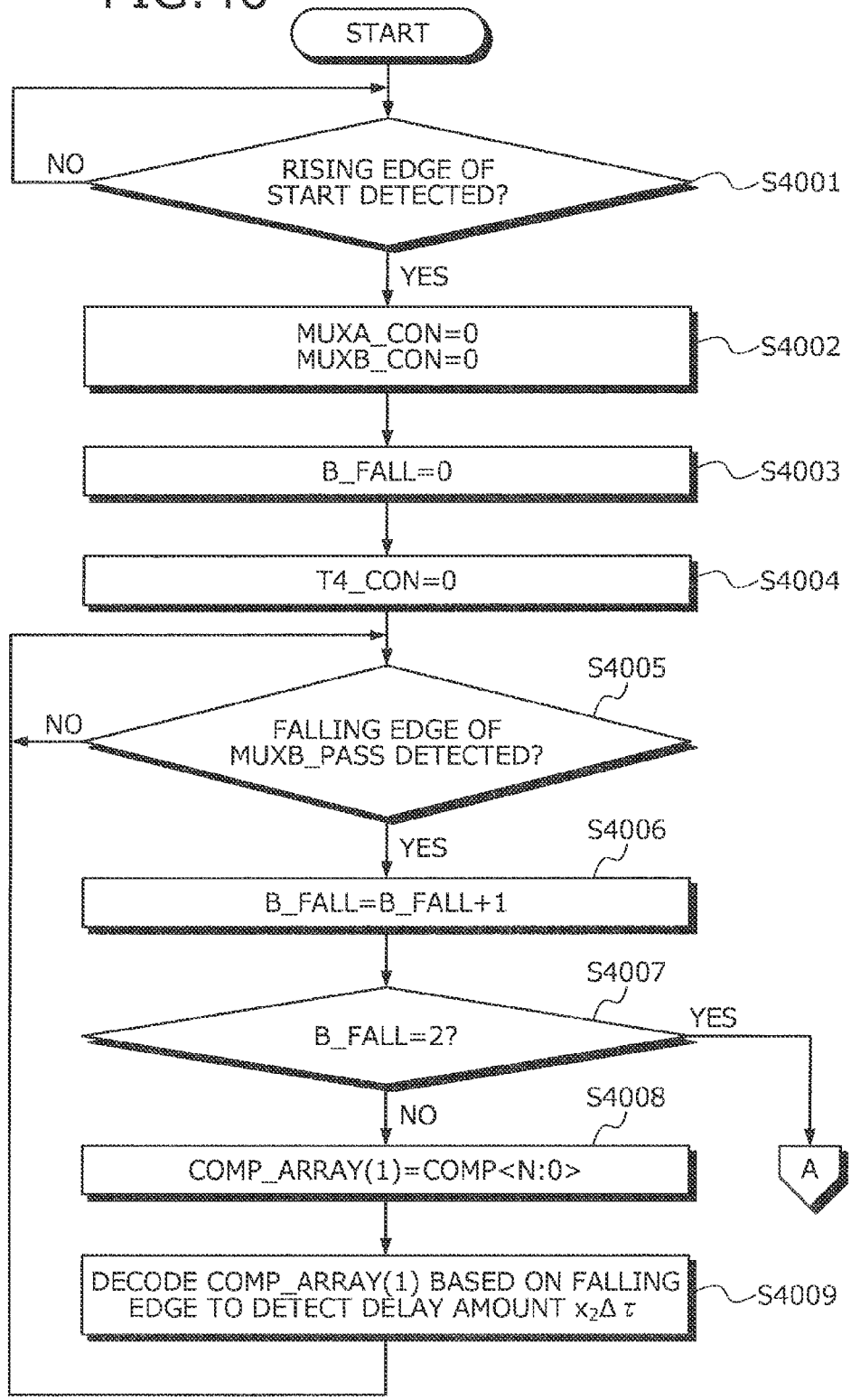
FIGS. 40 and 41 are flowcharts of a second exemplary detection process procedure for the delay amount dl by the control unit 701 according to Example 2.
Figure 41:
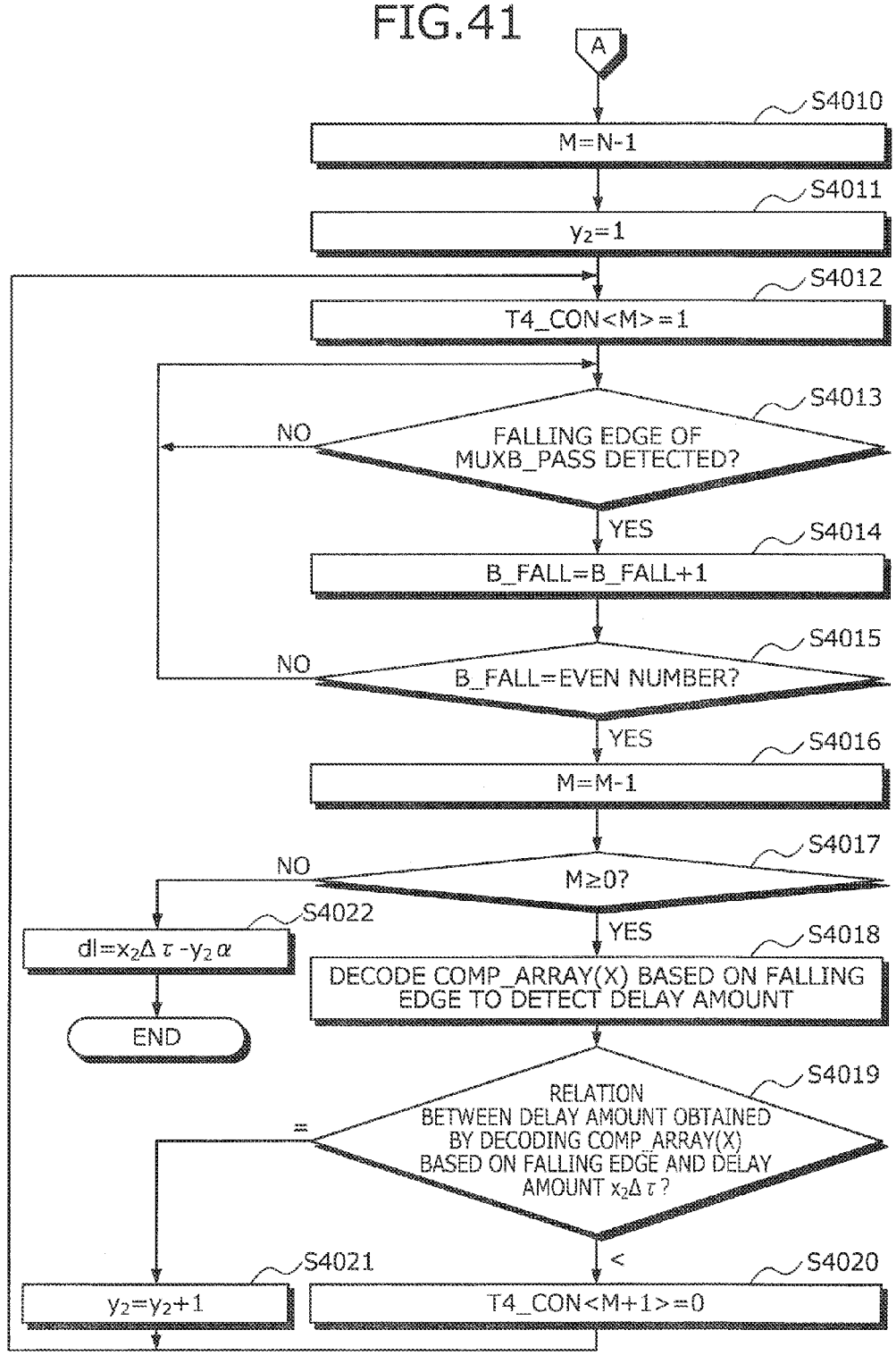

FIGS. 40 and 41 are flowcharts of a second exemplary detection process procedure for the delay amount dl by the control unit 701 according to Example 2. In the second exemplary detection process procedure for the delay amount dl, all the delay amounts adjustable by signals of respective bits of the control signal T4_CON are the same.

Operations at steps S4001 to S4009 are the same operations as at steps S3801 to S3809, respectively, depicted in FIG. 38 and therefore, will not be described in detail. Operations at steps S4010, S4012 to S4020, and S4022 are the same operations as at steps S3810, S3812 to S3820, and S3822, respectively, depicted in FIG. 39 and therefore, will not be described in detail.

At step S4011, the control unit 701 sets $y_2=1$ (step S4011) and goes to step S4012. At step S4021, the control unit 701 sets $y_2=y_2+1$ (step S4021) and goes to step S4012.

Figure 42:
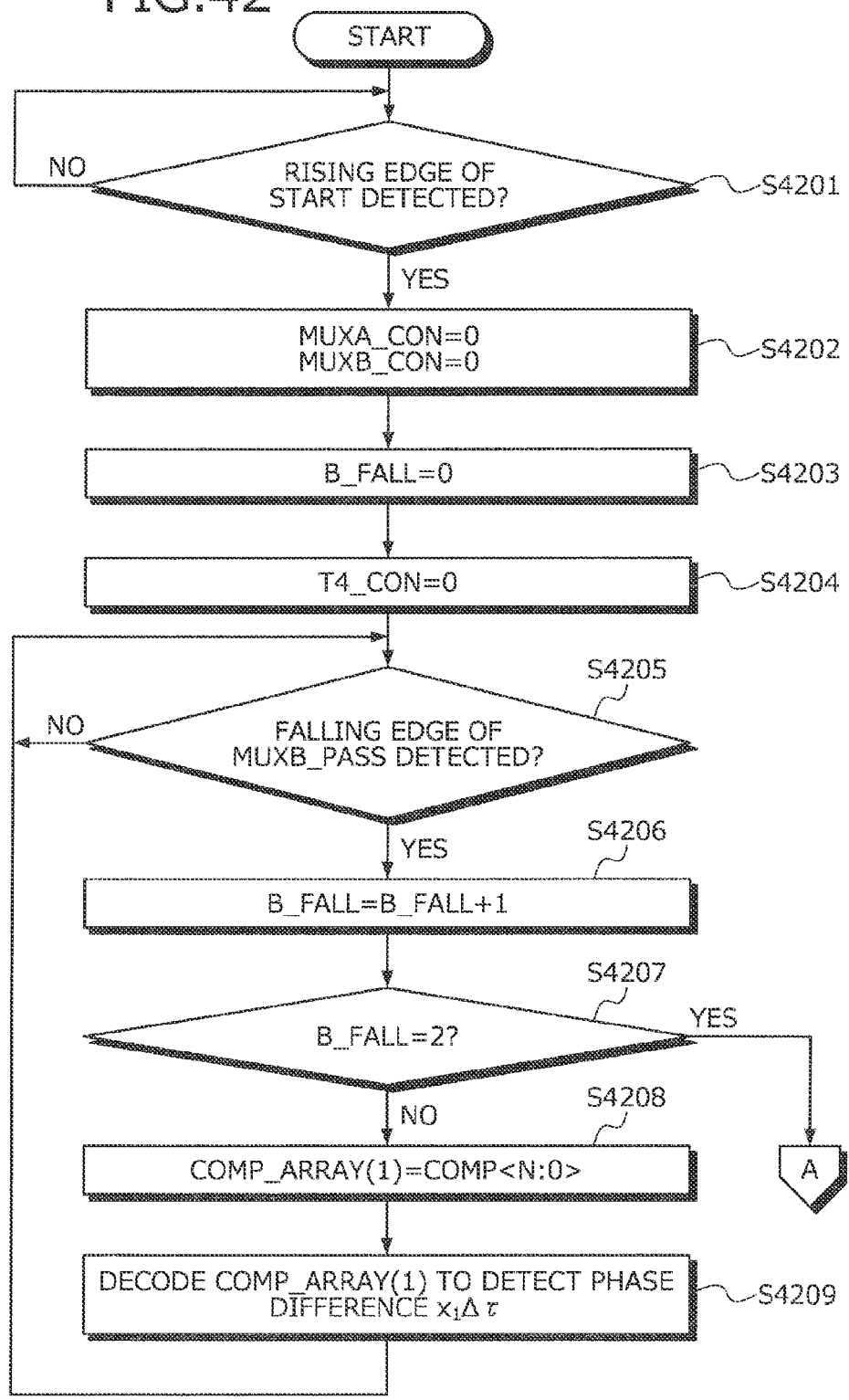
FIGS. 42, 43, and 44 are flowcharts of a first exemplary detection process procedure for the smallest second increase amount $y_3\alpha$ by the control unit 701 according to Example 2.
Figure 43:
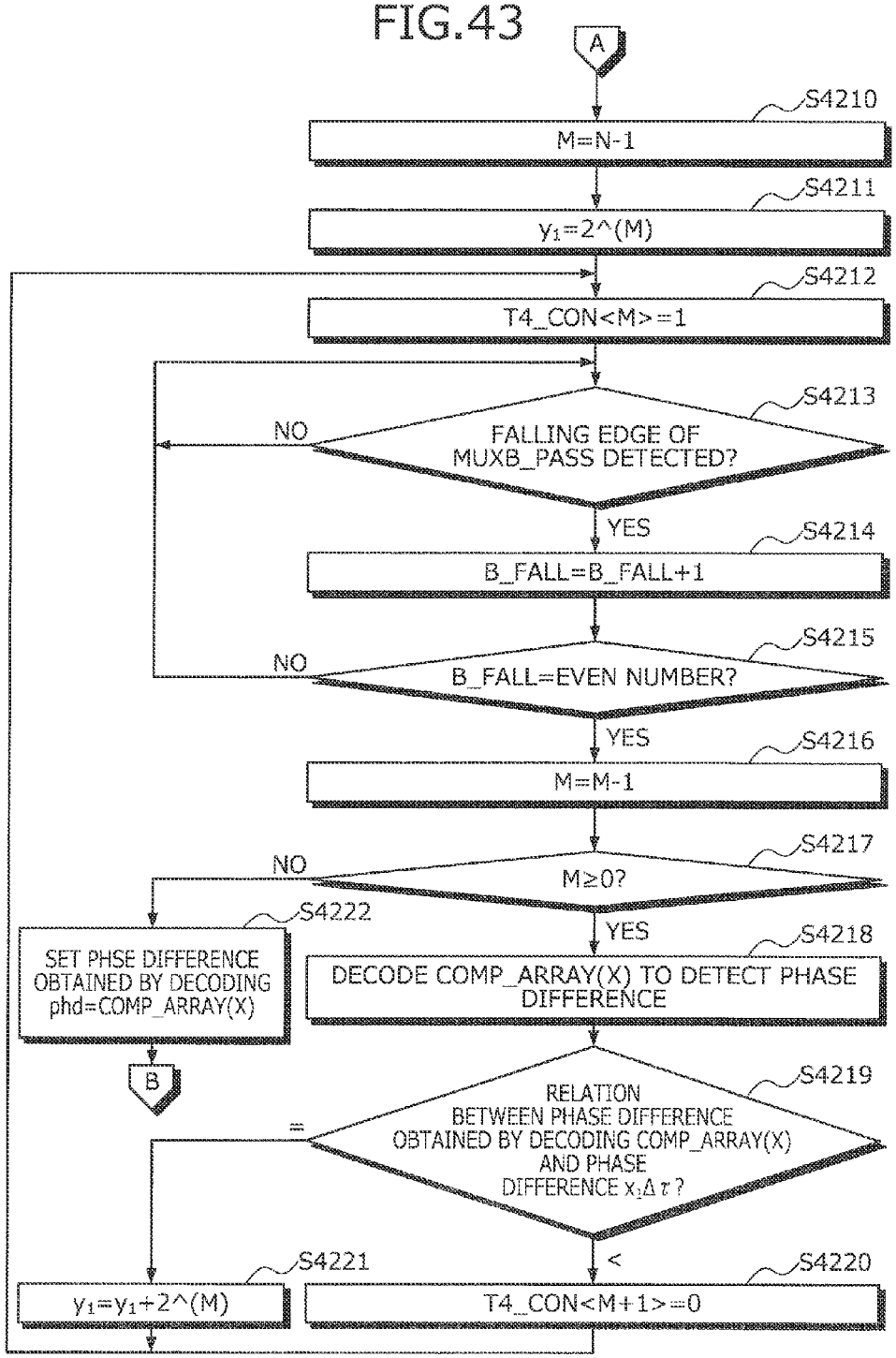
Figure 44:
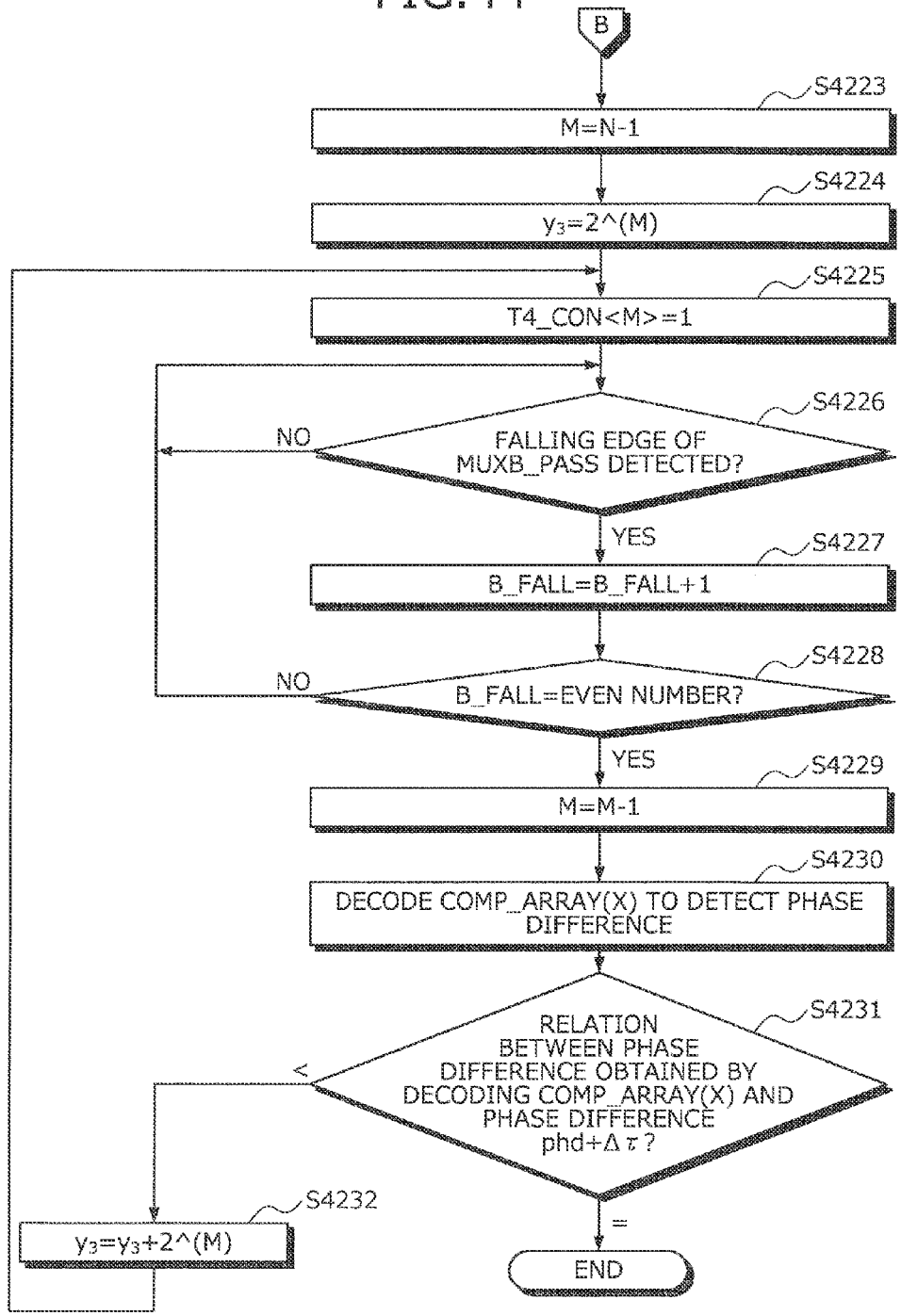

FIGS. 42, 43, and 44 are flowcharts of a first exemplary detection process procedure for the smallest second increase amount $y_3\alpha$ by the control unit 701 according to Example 2. In the first exemplary detection process procedure for the smallest second increase amount $y_3\alpha$, the delay amounts adjustable by signals of respective bits of the control signal T4_CON are different and sequentially doubled in order from the least significant bit to the most significant bit of the control signal T4_CON.

Operations at steps S4201 to S4209 are the same processes as the operations described for steps S1901 to S1909, respectively, depicted in FIG. 19 and therefore, will not be described in detail. Operations at steps S4210 to S4221 are the same operations as the operations described for steps S1910 to S1921, respectively, depicted in FIG. 20 and therefore, will not be described in detail.

At step S4217, if M≥0 is not satisfied (step S4217: NO), the control unit 701 sets a phase difference obtained by decoding phd-COMP_ARRAY(X) (step S4222) and sets M=N−1 (step S4223). The control unit 701 sets $y_3=2^{\wedge}(N)$ (step S4224), sets T4_CON<M>=1 (step S4225), and determines whether the falling edge of MUXB_PASS is detected (step S4226).

If the falling edge of MUXB_PASS is not detected (step S4226: NO), the control unit 701 returns to step S4226. On the other hand, if the falling edge of MUXB_PASS is detected (step S4226: YES), the control unit 701 sets B_FALL=B_FALL+1 (step S4223) and determines whether B_FALL is an even number (step S4228).

If B_FALL is not an even number (step S4228: NO), the control unit 701 returns to step S4226. If B_FALL is an even number (step S4228: YES), the control unit 701 sets M=M−1 (step S4229) and decodes COMP_ARRAY(X) to detect a phase difference (step S4230).

The control unit 701 makes a comparison between a phase difference obtained by decoding COMP_ARRAY(X) and the phase difference phd+$\Delta\tau$ (step S4231). If the phase difference obtained by decoding COMP_ARRAY(X) is smaller than the phase difference phd+$\Delta\tau$ (step S4231:<), the control unit 701 sets $y_3=y_3+2^{\wedge}(N)$ (step S4232) and returns to step S4225. In the case of the same values (step S4231:=), a series of the processes is terminated. The control unit 701 detects $y_3$ at the time of termination as the smallest second delay amount $y_3$.

Figure 45:
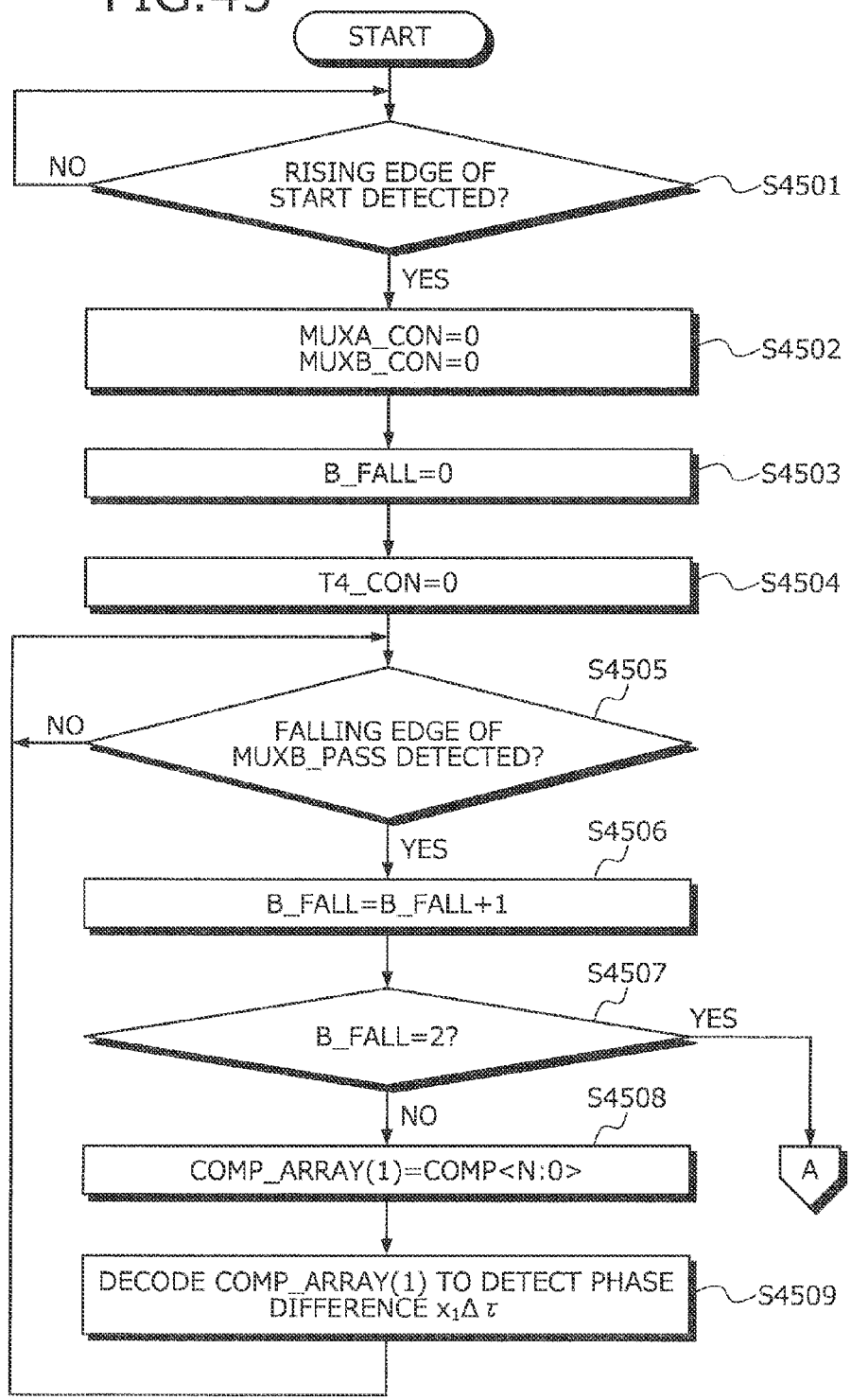
FIGS. 45, 46, and 47 are flowcharts of a second exemplary detection process procedure for the smallest second increase amount $y_3\alpha$ by the control unit 701 according to Example 2.
Figure 46:
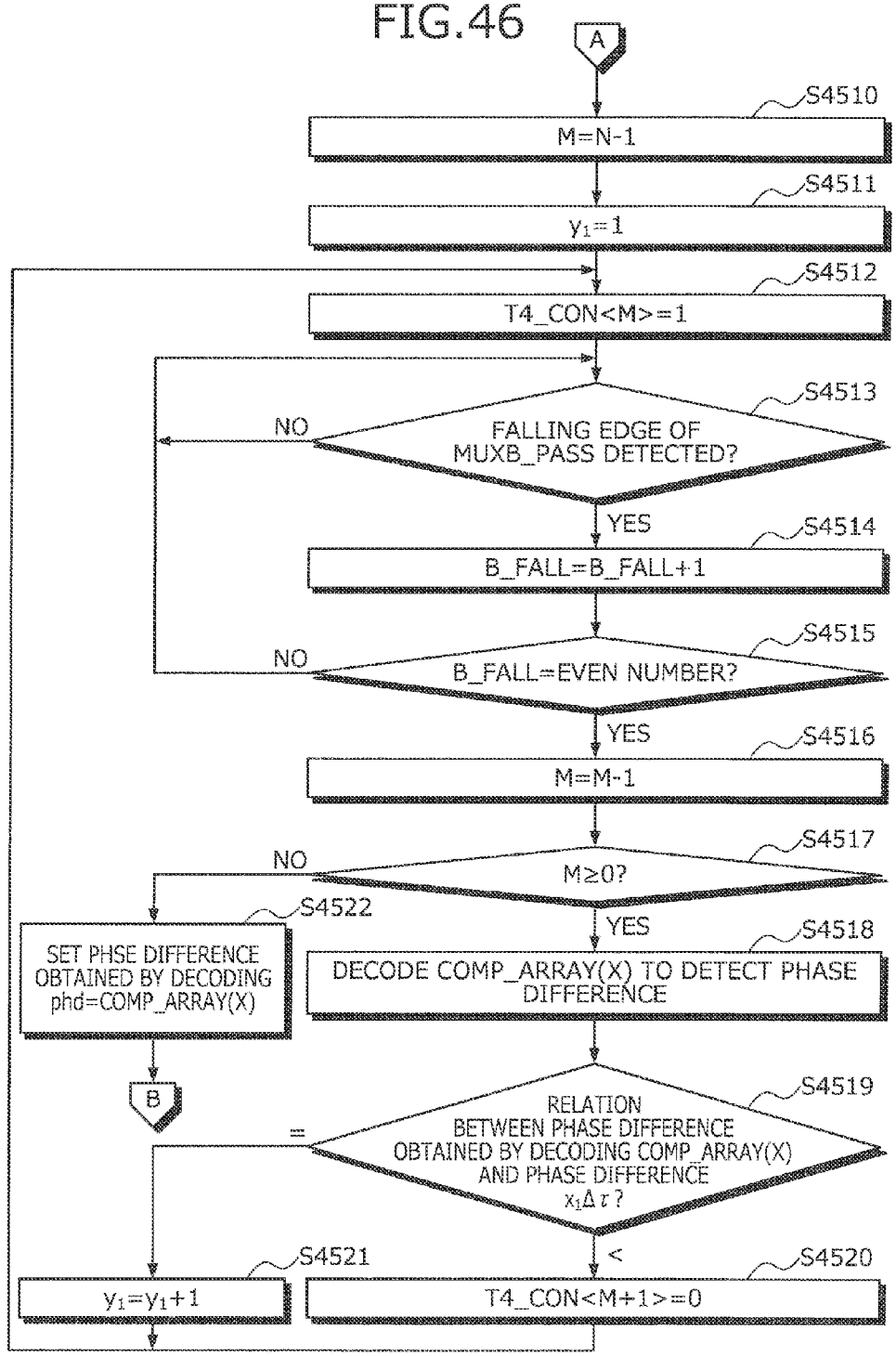
Figure 47:
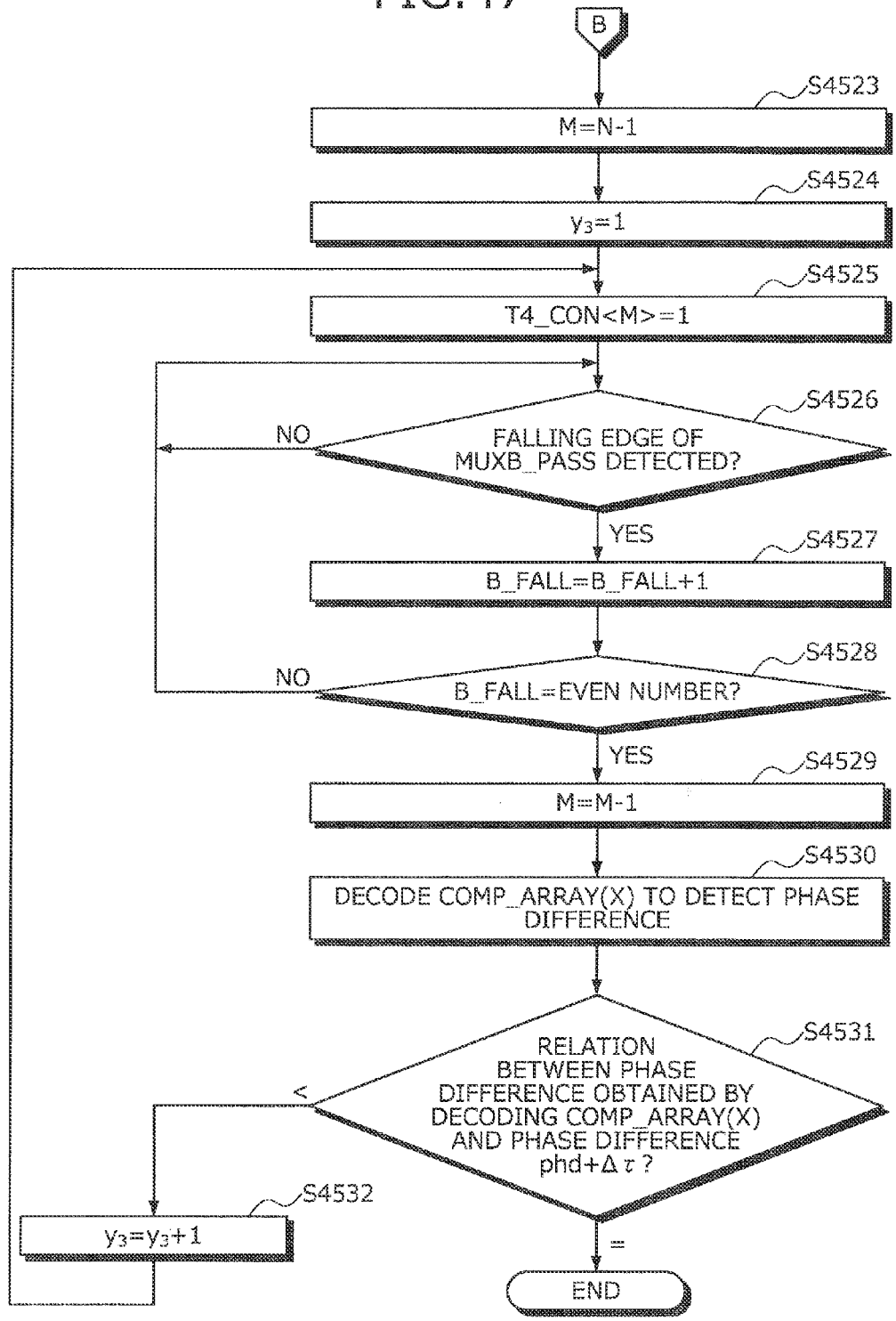

FIGS. 45, 46, and 47 are flowcharts of a second exemplary detection process procedure for the smallest second increase amount $y_3\alpha$ by the control unit 701 according to Example 2. In the second exemplary detection process procedure for the smallest second increase amount $y_3\alpha$, all the delay amounts adjustable by signals of respective bits of the control signal T4_CON are the same.

Operations at steps S4501 to S4509 are the same operations as at steps S2401 to S2409, respectively, depicted in FIG. 24 and therefore, will not be described in detail. Operations at steps S4510 to S4521 are the same operations as at steps S2410 to S2421, respectively, depicted in FIG. 25 and therefore, will not be described in detail. Operations at steps S4522, S4523, and S4525 to S4531 are the same operations as at steps S4222, S4223, and S4225 to S4231, respectively, depicted in FIG. 44 and therefore, will not be described in detail.

At step S4524, the control unit 701 sets $y_3=1$ (step S4524) and goes to step S4525. At step S4532, the control unit 701 sets $y_3=y_3+1$ (step S4532) and goes to step S4525.

A TDC according to Example 3 has the variable third delay element C31 disposed between the first switching unit 101 and the first delay element C11 and can change a delay amount of the third delay element C31 to detect a highly accurate phase difference.

Figure 48:
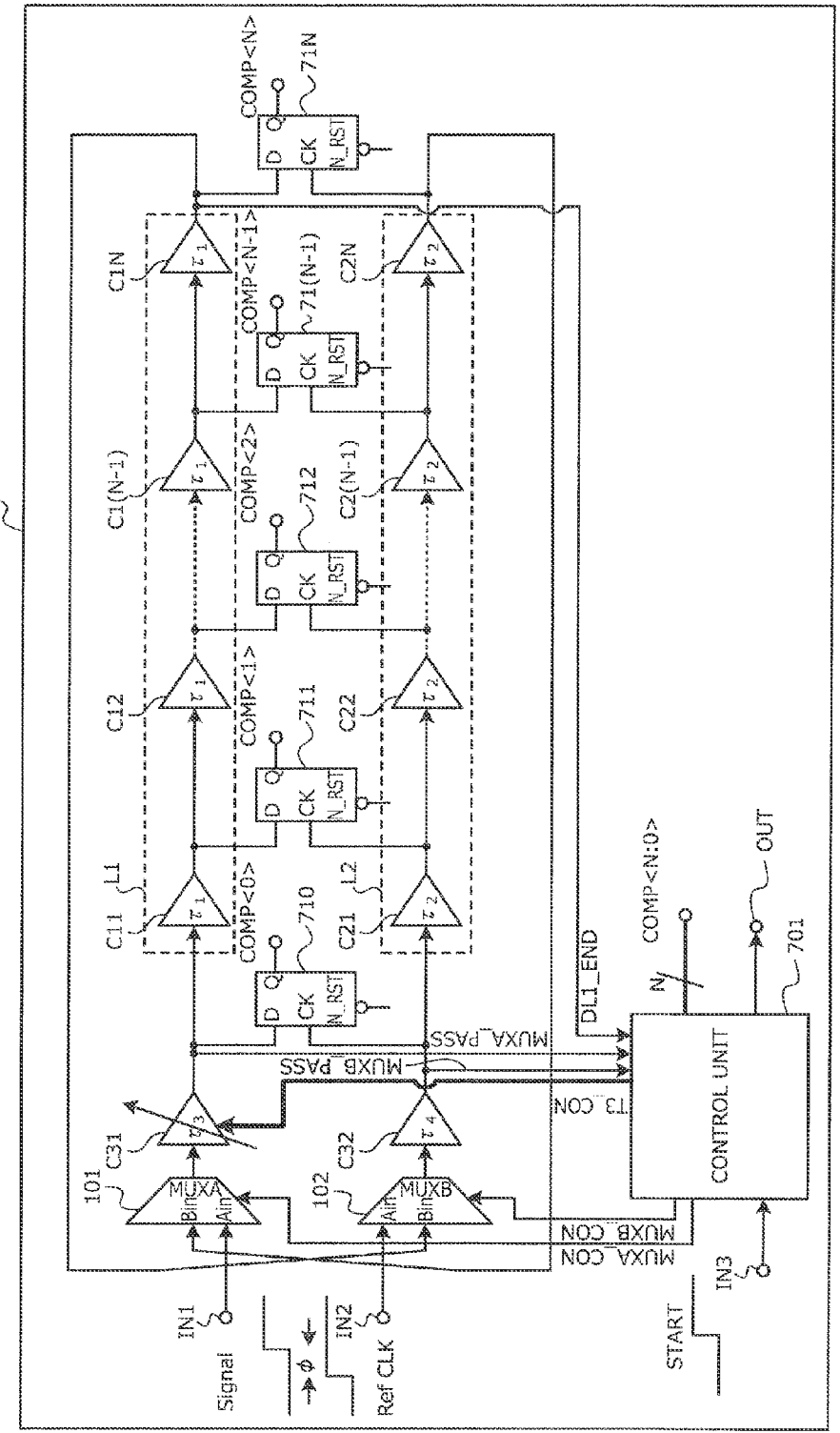
FIG. 48 is an explanatory view of the TDC according to Example 3.

FIG. 48 is an explanatory view of the TDC according to Example 3. A TDC 4800 has the first switching unit 101, the second switching unit 102, the first delay elements C11 to C1N, the second delay elements C21 to C2N, the FFs 710 to 71N, the third delay element C31, the third delay element C32, and the control unit 701.

The third delay element C31 is disposed between the first switching unit 101 and the first delay element C11. For example, the third delay element C31 delays and inputs a signal input by the first switching unit 101 to the first delay element C11 and the data input terminal of the FF 710.

The third delay element C32 is disposed between the second switching unit 102 and the second delay element C21. For example, the third delay element C32 delays and inputs a signal input by the first switching unit 101 to the second delay element C21 and the clock input terminal of the FF 710.

A delay amount $\tau 3$ of the third delay element C31 is variable and the control unit 701 can increase/decrease the delay amount $\tau 3$ of the third delay element C31 based on a control signal T3_CON. A specific example of the third delay element C31 may be the same as the third delay element C32 depicted in FIG. 17.

The switching from the first state to the second state in Example 3 is the same process as the switching from the first state to the second state in Example 2.

For example, the control unit 701 counts up A_FALL each time a falling edge of MUXA_PASS is detected. A_FALL is a variable. If the value of A_FALL is an even number, the control unit 701 determines that the first clock signal_Signal is passing through the second delay line L2. If the value of A_FALL is an even number, the control unit 701 changes a value of the control signal T3_CON. As a result, the control unit 701 can change the first increase amount for the delay amount in the first state of the third delay element C32 after the first clock signal goes around the loop.

A detection process of the phase difference ϕ in Example 3 is the same process as the detection process of the phase difference ϕ and therefore, will not be described in detail.

In Example 4, description will be made of detection of a phase difference in the case that a delay amount of multiple first delay elements and a delay amount of multiple second delay elements are variable. In Example 4, the same constituent elements as the constituent elements depicted in Examples 1 to 3 will not be described in detail.

Figure 49:
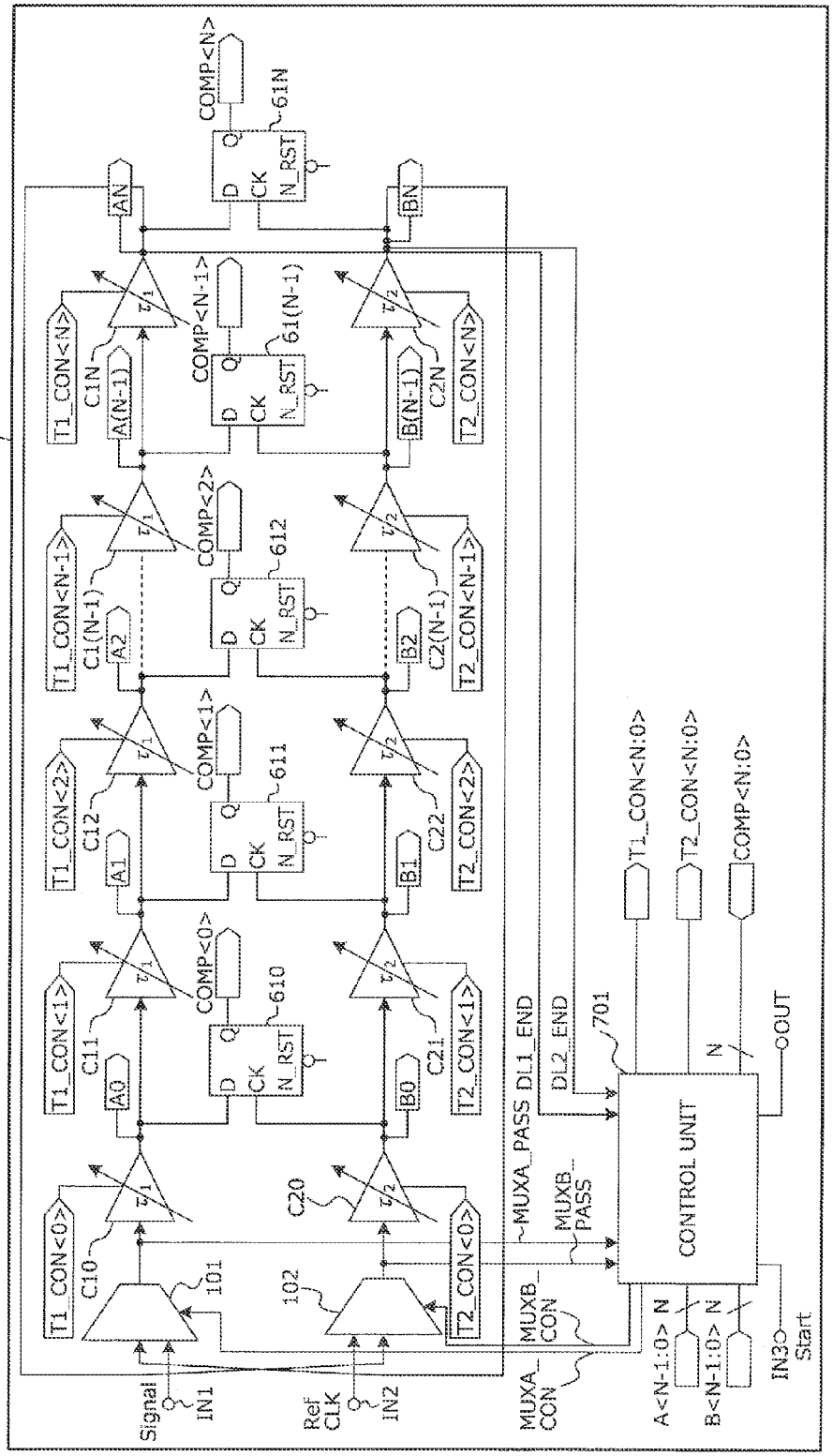
FIG. 49 is an explanatory view of a TDC according to Example 4.

FIG. 49 is an explanatory view of a TDC according to Example 4. A TDC 4900 has the first switching unit 101, the second switching unit 102, first delay elements C10 to C1N, second delay elements C20 to C2N, the FFs 710 to 71N, and the control unit 701.

The first delay element C10 is disposed between the first switching unit 101 and the first delay element C11. The second delay element C20 is disposed between the second switching unit 102 and the second delay element C21. The first delay elements C10 to C1N and the second delay elements C20 to C2N are delay elements having delay amounts variable depending on a control signal from the control unit 701.

Figure 50:
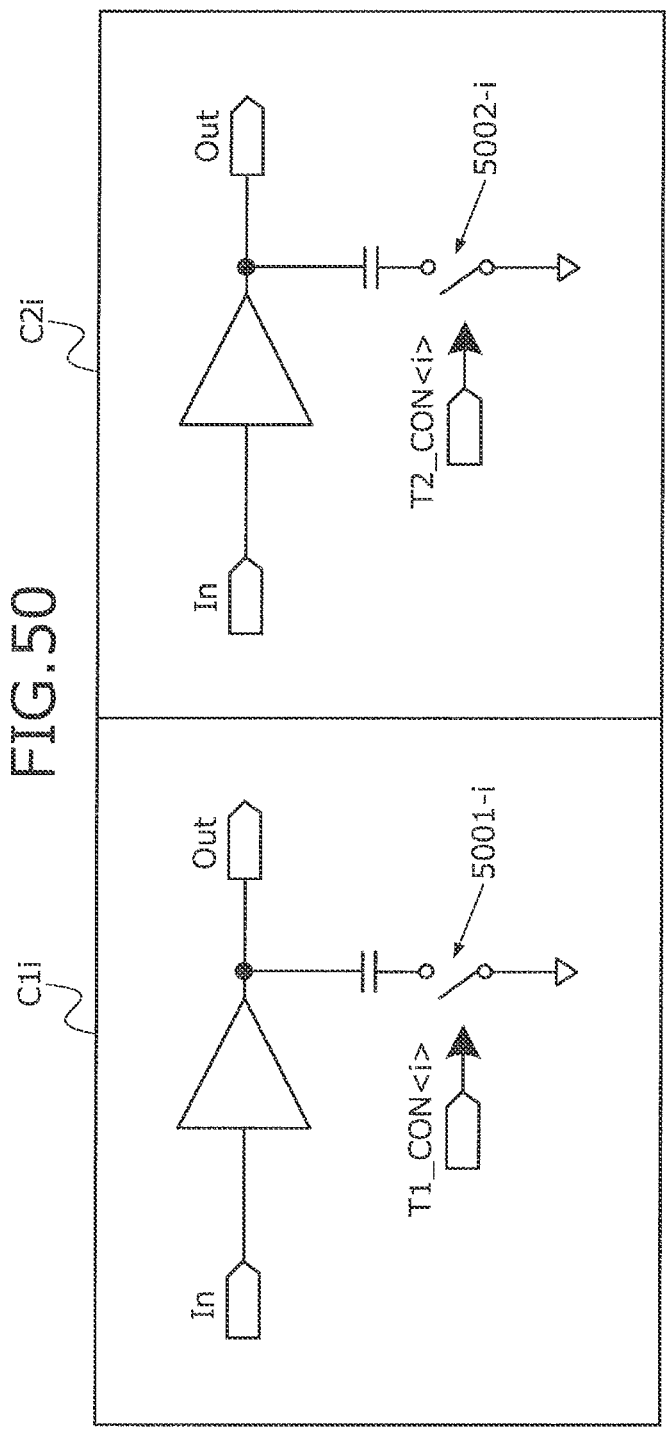
FIG. 50 is an explanatory view of detailed examples of first delay elements C10 to C1N and second delay elements C20 to C2N.

FIG. 50 is an explanatory view of detailed examples of the first delay elements C10 to C1N and the second delay elements C20 to C2N. A first delay element C1$i$ (i=0 to N) has a delay element, a delay capacity, and a switch 5001-$i$ capable of switching ON and OFF states depending on a control signal T1_CON<i>. A second delay element C2$i$ has a delay element, a delay capacity, and a switch 5002-$i$ capable of switching ON and OFF states depending on a control signal T2_CON<i>.

FIG. 51 is an explanatory view of a difference between a delay amount of the first delay element C1$i$ and a delay amount of the second delay element C2$i$. A table indicates a delay difference between a delay amount of the first delay element C1$i$ and a delay amount of the second delay element C2$i$ determined depending on a value of the control signal T2_CON<i> and a value of the control signal T1_CON<i>. For example, if the control signal T2_CON<i> is L and the control signal T1_CON<i> is L, the delay amount of the first delay element C1$i$ is a first delay amount, and the delay difference between the delay amount of the first delay element C1$i$ and the delay amount of the second delay element C2$i$ is a first difference Δτ. For example, if the control signal T2_CON<i> is L and the control signal T1_CON<i> is H, the delay amount of the first delay element C1$i$ is a second delay amount, and the delay difference between the delay amount of the first delay element C1$i$ and the delay amount of the second delay element C2$i$ is a second difference α.

The combinations of a value of the control signal T1_CON and a value of the control signal T2_CON are not limited to the example described in the table of FIG. 51, may be any combinations as long as a delay difference of two delay elements can be set to Δτ and α, and therefore can variously be changed at the time of designing.

Figure 52:
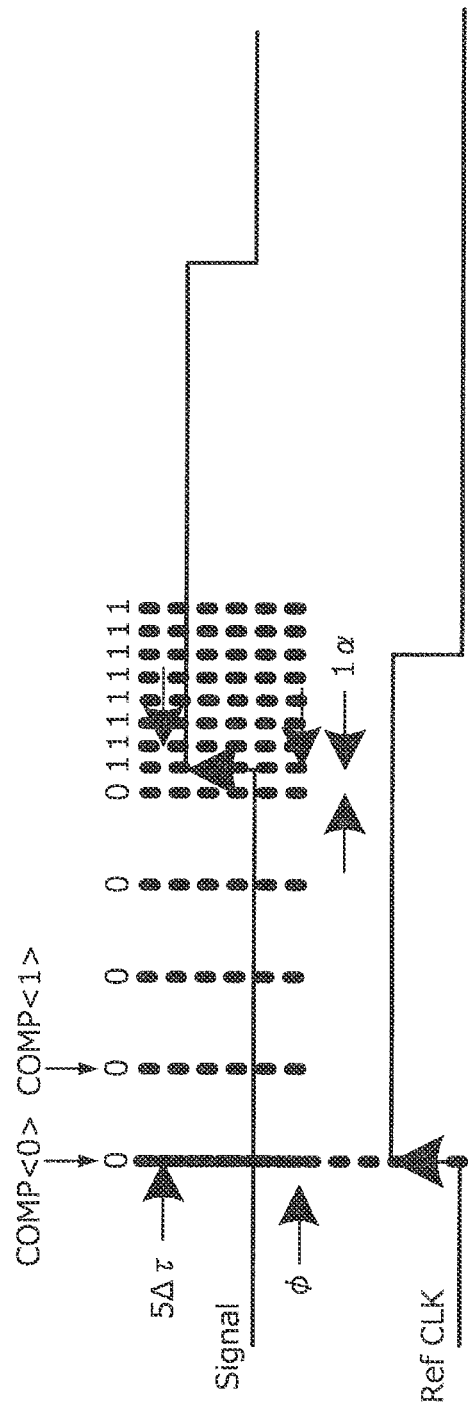
FIG. 52 is an explanatory view of a detection example of a phase difference in Example 3.

FIG. 52 is an explanatory view of a detection example of a phase difference in Example 3. A process of changing the first switching unit 101 and the second switching unit 102 from the first state to the second state by the control unit 701 is the same as the process described in Example 1 and therefore, will not be described in detail.

The control unit 701 controls the switches of the first delay elements C10 to C1N in the first state to set the delay amounts of the first delay elements C10 to C1N to the first delay amount. As a result, a difference is set to the first difference Δτ between each of the delay amounts of the first delay elements C10 to C1N and each of the delay amounts of the second delay elements C20 to C2N corresponding to the respective first delay elements C10 to C1N.

The control unit 701 determines whether the second clock signal Ref CLK goes around the loop by passing through the first delay line L1 and passing through the second switching unit 102. After the second clock signal Ref CLK goes around once, the control unit 701 identifies out of the first delay elements C10 to C1N a delay element in which a delay amount obtained by multiplying the number of stages from the first delay element C10 by the first difference becomes larger than a phase difference smaller by the first difference than a phase difference in the first state.

For example, the control unit 701 counts up B_FALL each time a falling edge of MUXB_PASS is detected. If B_FALL is two, the control unit 701 determines that the second clock signal Ref CLK passes through the first delay line L1 and passes through the second switching unit 102. The control unit 701 detects falling edges of output signals A0 to AN of the first delay elements C10 to C1N.

If falling edges of output signals Ai of first delay elements Ci are detected, the control unit 701 identifies a first delay element in which a delay amount obtained by multiplying the number (i+1) of stages from the first delay element C10 by Δτ becomes larger than a phase difference smaller by Δτ than the phase difference $x_1$Δτ in the first state. The control unit 701 sets a delay amount of the identified first delay element as a second delay amount. In the example of FIG. 52, the first delay elements C15 to C1N are identified.

The control unit 701 sets a delay amount of the identified delay element to the second delay amount. After a delay amount of the identified delay element is set to the second delay amount and the second clock signal then passes through the second switching unit 102, the control unit 701 decodes the values stored in the FFs 710 to 71N to detect a phase difference. The control unit 701 decodes COMP<N:0> based on each value of a control signal T1_CON<N:0>.

For example, if B_FALL is three, the control unit 701 counts periods from the least significant bit of COMP<N:0> until zero changes to one (rising). For example, it is assumed that the periods until zero changes to one (rising) are COMP<0> to COMP<5>. If T1_COMP<0> to T1_COMP<4> are zero, a difference is Δt between each of the delay amounts of the first delay elements C10 to C15 and each of the delay amounts of the second delay elements C20 to C25 corresponding to the respective first delay elements C10 to C15. If T1_COMP<5> is one, a difference is a between the delay amount of the first delay element C16 and the delay amount of the second delay element a C26 corresponding to the first delay element C16. Therefore, the phase difference ϕ is 4Δτ+1α. The output unit OUT outputs the detected phase difference ϕ.

Figure 53:
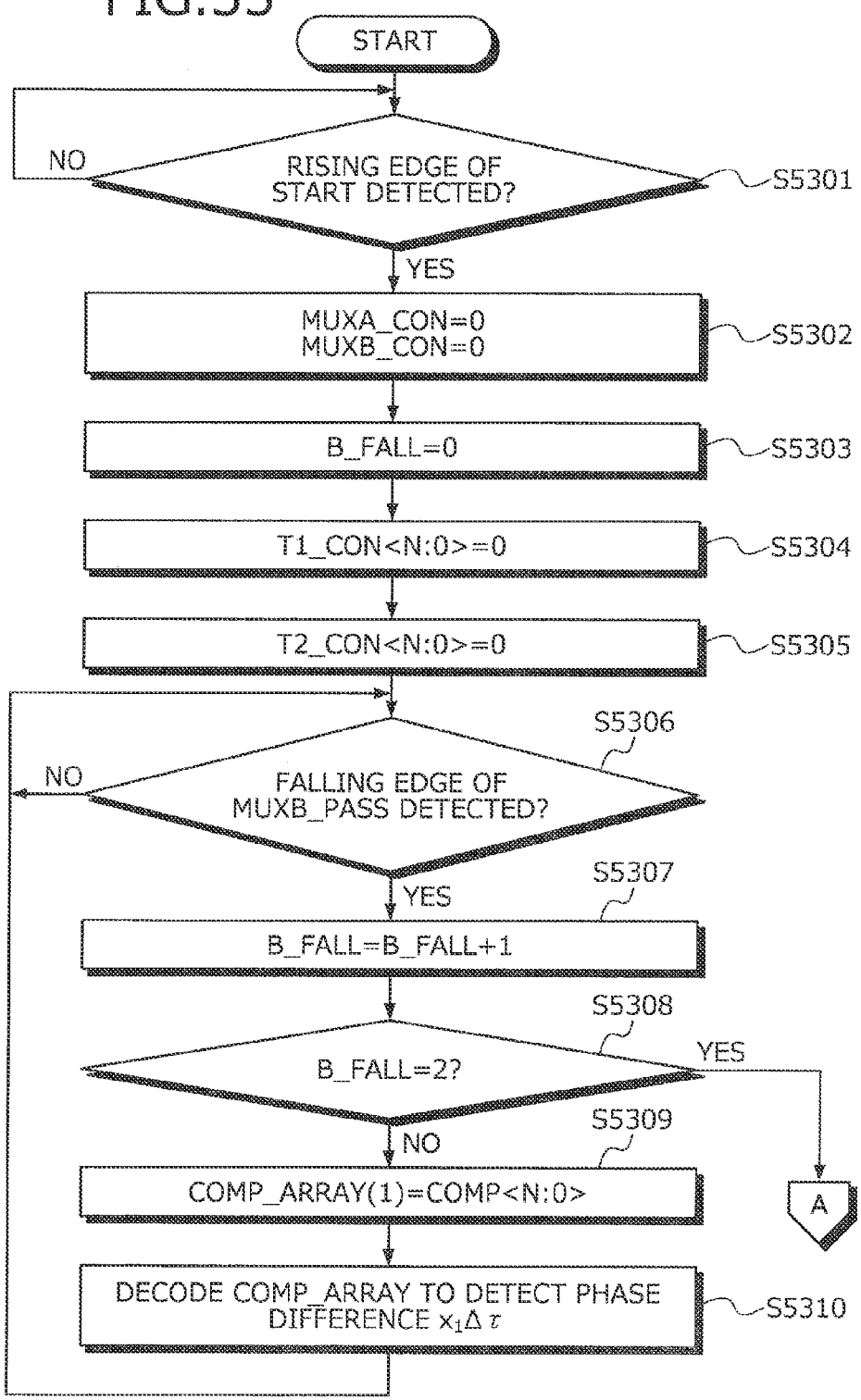
FIGS. 53 and 54 are flowcharts of an exemplary control process procedure by the control unit 701 according to Example 4.
Figure 54:
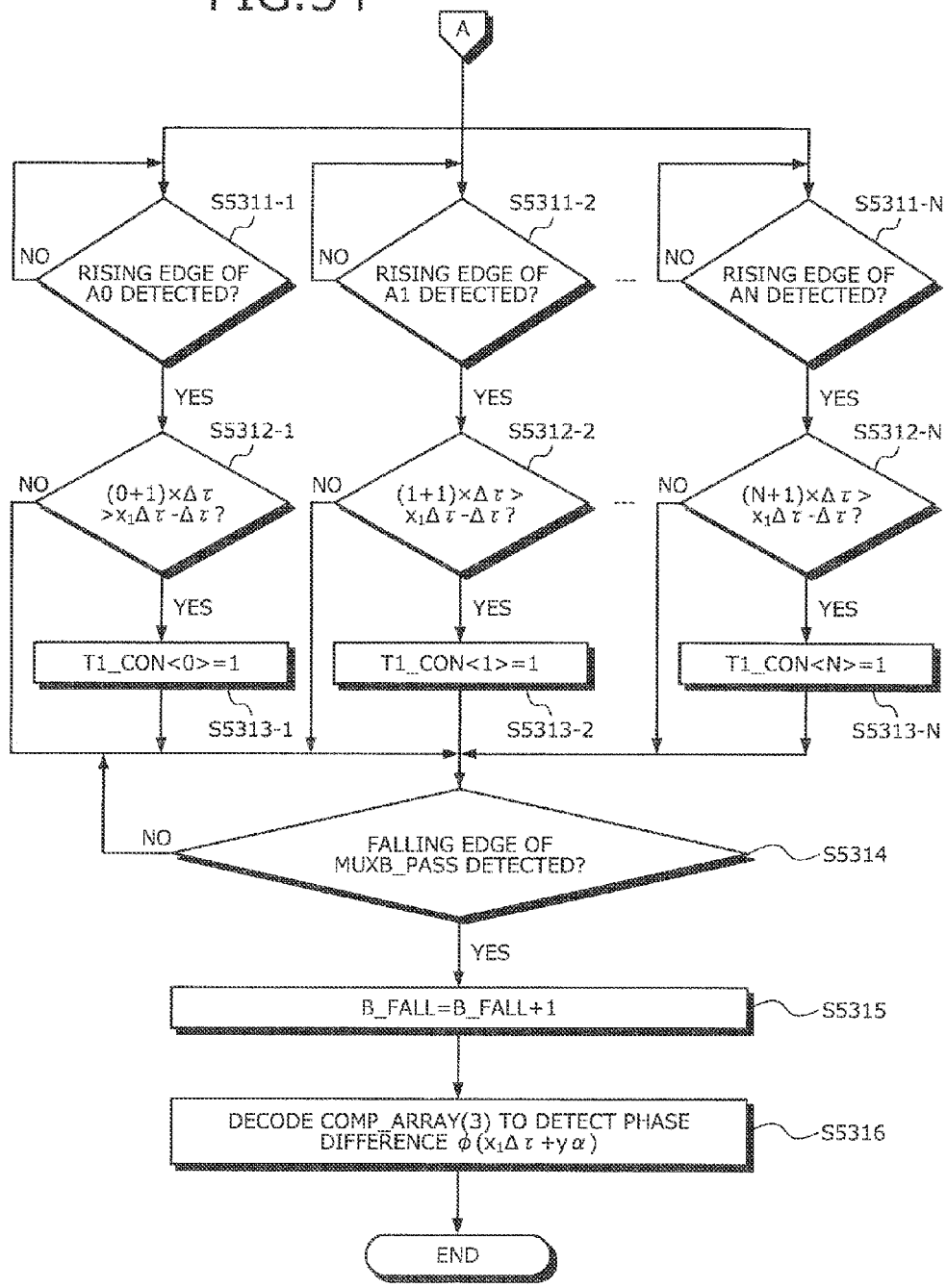

FIGS. 53 and 54 are flowcharts of an exemplary control process procedure by the control unit 701 according to Example 4. The control unit 701 determines whether the rising edge of START is detected (step S5301). If the rising edge of START is not detected (step S5301: NO), the control unit 701 returns to step S5301.

On the other hand, if the rising edge of START is detected (step S5301: YES), the control unit 701 sets MUXA_CON=0 and MUXB_CON=0 (step S5302). As a result, the first switching unit 101 selects and outputs the first clock signal_Signal based on the value of the first selection signal MUXA_CON to achieve the first state. The second switching unit 102 selects and outputs the second clock signal Ref CLK based on the value of the second selection signal MUXB- _CON to achieve the first state. A change from the first state to the second state by the control unit 701 is the same as the example described in Example 2 and therefore, will not be described in detail.

The control unit 701 sets B_FALL=0 (step S5303), T1_CON<N:0>=0 (step S5304), and T2_CON<N:0>=0 (step S5305). At steps S5304 and S5305, the control unit 701 sets a difference to $\Delta\tau$ between each of the delay amounts of the first delay elements C10 to C1N and each of the delay amounts of the second delay elements C20 to C2N in the first state.

The control unit 701 determines whether the falling edge of MUXB_PASS is detected (step S5306). If the falling edge of MUXB_PASS is not detected (step S5306: NO), the control unit 701 returns to step S5306. On the other hand, if the falling edge of MUXB_PASS is detected (step S5306: YES), the control unit 701 sets B_FALL=B_FALL+1 (step S5307).

The control unit 701 determines whether B_FALL is two (step S5308). If B_FALL is not two (step S5308: NO), the control unit 701 sets COMP_ARRAY(1)=COMP<N:0> (step S5309) and decodes COMP_ARRAY(l) to detect the phase difference $x_1\Delta\tau$ (step S5310).

On the other hand, if B_FALL is two (step S5308: YES), the control unit 701 determines whether rising edges of Ai (i=0 to N) are detected (step S5311-$i$). If rising edges of Ai are not detected (step S5311-$i$: NO), the control unit 701 returns to step S5311-$i$. If rising edges of Ai are detected (step S5311-$i$: YES), the control unit 701 determines whether $(i+1)\times\Delta\tau > x_1\Delta\tau - \Delta\tau$ is satisfied (step S5312-$i$).

If $(i+1)\times\Delta\tau > x_1\Delta\tau - \Delta\tau$ is satisfied (step S5312-$i$: YES), the control unit 701 sets T1_CON<i>=1 (step S5313-$i$) and goes to step S5314. On the other hand, if $(i+1)\times\Delta > x_1\Delta\tau - \Delta\tau$ is not satisfied (step S5312-$i$: NO), the control unit 701 goes to step S5314.

The control unit 701 determines whether the falling edge of MUXB_PASS is detected (step S5314). If the falling edge of MUXB_PASS is not detected (step S5314: NO), the control unit 701 returns to step S5314. If the falling edge of MUXB_PASS is detected (step S5314: YES), the control unit 701 sets B_FALL=B_FALL+1 (step S5315). The control unit 701 decodes COMP_ARRAY(1) to detect the phase difference $\phi$ ($x_1\Delta\tau + y\alpha$) (step S5316) and terminates a series of the processes. The output unit OUT outputs the detected phase difference $\phi$.

Figure 55:
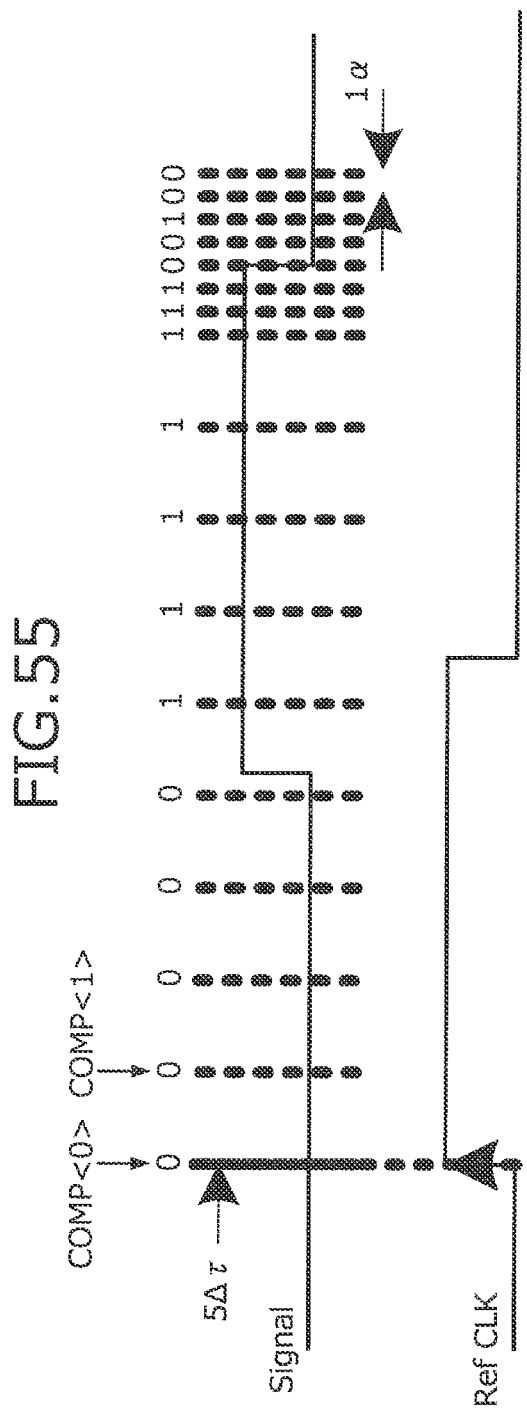
FIGS. 55 and 56 are explanatory views of a normalization example in Example 4.
Figure 56:
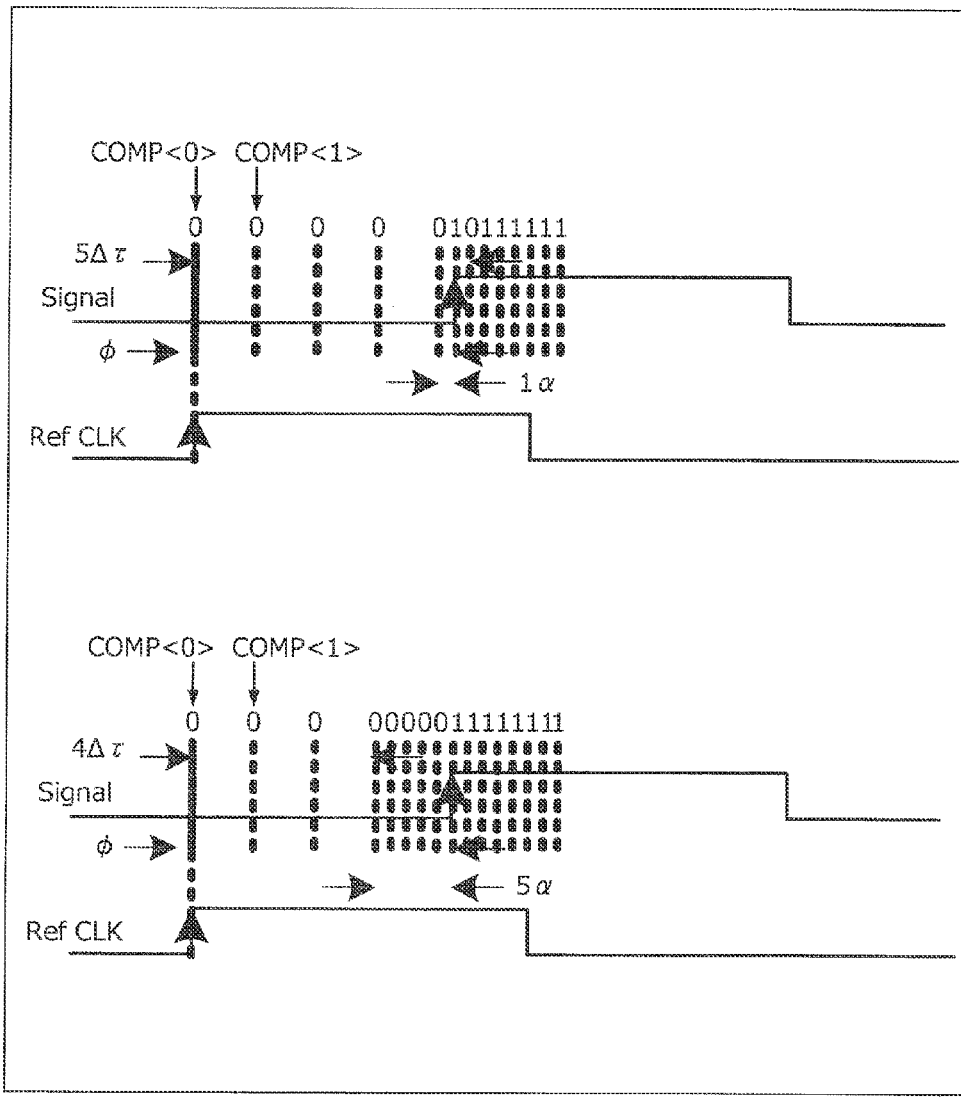

FIGS. 55 and 56 are explanatory views of a normalization example in Example 4. In FIG. 55, the control unit 701 detects the delay amount dl as described in Example 2. The control unit 701 subtracts the phase difference $\phi$ from the delay amount dl to detect the cycle period_Period.

In FIG. 56, the control unit 701 detects the smallest second increase amount $y_3\alpha$. The control unit 701 subtracts the smallest first increase amount $y_1\alpha$ from the smallest second increase amount $y_3\alpha$ and calculates $\Delta\tau$. The control unit 701 corrects the phase difference $\phi$ and the cycle period_Period with calculated $\Delta\tau$. The control unit 701 divides the corrected phase difference $\phi$ by the corrected cycle period_Period to normalize the phase difference $\phi$. The output unit OUT outputs the normalized phase difference $\phi$.

As described above, the time-to-digital converter according to Example 1 forms a loop in which the two taken-in clock signals alternately pass through the first and second delay element groups. As a result, the same delay amount is applied to the two clock signals. Therefore, the time-to-digital converter can suppress deterioration in accuracy of phase difference detection due to PVT variations of the delay elements. The time-to-digital converter according to the present invention has a simple circuit as compared to when a DLL is utilized for reducing variations due to PVT. Therefore, for example, the area can be made smaller. For example, the power consumption can be made smaller.

The time-to-digital converter according to Examples 2 and 3 has a variable delay element on the preceding stage of the first delay element group or the second delay element group and adjusts a delay amount of the variable delay element. As a result, the time-to-digital converter can improve the accuracy of the phase difference of the two clock signals with a delay amount smaller than a difference between a delay amount of the first delay element and a delay amount of the second delay element.

The time-to-digital converter according to Examples 2 and 3 calculates a difference between a delay amount of the first delay element and a delay amount of the second delay element and corrects the phase difference of the two clock signals with the calculated difference. As a result, the accuracy can be improved in the phase difference of the two clock signals by the time-to-digital converter.

The time-to-digital converter according to Examples 2 and 3 normalizes the phase difference. As a result, the accuracy can be improved in the phase difference of the two clock signals by the time-to-digital converter.

The time-to-digital converter according to Example 4 can switch the delay amounts of either the first delay element group or the second delay element amount group with switches. As a result, the time-to-digital converter can improve the accuracy of the phase difference of the two clock signals with a delay amount smaller than a difference between a delay amount of the first delay element and a delay amount of the second delay element.

The time-to-digital converter according to Example 4 calculates a difference between a delay amount of the first delay element and a delay amount of the second delay element and corrects the phase difference of the two clock signals with the calculated difference. As a result, the accuracy can be improved in the phase difference of the two clock signals by the time-to-digital converter.

An aspect of the embodiments produces an effect that deterioration can be suppressed in accuracy of phase difference detection.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A time-to-digital converter comprising:
    a plurality of first delay elements connected in series;
    a plurality of second delay elements disposed respectively for the plurality of the first delay elements and connected in series;
    a plurality of flip-flops configured to store a value of an input signal to a first delay element at a front stage of the plurality of the first delay elements and values of output signals of the plurality of the first delay elements in synchronization with an input signal to a second delay element at the front stage of the plurality of the second delay elements and output signals of the plurality of the second delay elements, respectively;

a first switching unit configured to switch a first state for inputting a first clock signal input from a first input terminal, and a second state for inputting an output signal of a second delay element at a last stage of the plurality of the second delay elements, to the first delay element at the front stage;

a second switching unit configured to switch a first state for inputting a second clock signal input from a second input terminal, and a second state for inputting an output signal of a first delay element at the last stage of the plurality of the first delay elements, to the second delay element at the front stage;

a control unit configured to put the first and second switching units into the second state after the first clock signal and the second clock signal are taken in the plurality of the first delay elements and the plurality of the second delay elements, respectively, by putting the first and second switching units into the first state; and an output unit configured to output information indicating a phase difference between the first clock signal and the second clock signal obtained by decoding values stored in the plurality of the flip-flops in the second state.

2. The time-to-digital converter according to claim 1, comprising a third delay element disposed between the second switching unit and the second delay element at the front stage and having a variable delay amount, wherein after the second clock signal passes through the plurality of the second delay elements, the first switching unit, and the plurality of the first delay elements and passes through the second switching unit, the control unit provides control of changing a delay amount of the third delay element at least until identifying a smallest increase amount at which the phase difference obtained by decoding the values stored in the plurality of the flip-flops becomes smaller than a phase difference in the first state, among increase amounts for a delay amount in the first state of the third delay element, the control unit calculates a phase difference obtained by subtracting the smallest increase amount from the phase difference in the first state, and the output unit outputs information indicating the phase difference calculated by the control unit.

3. The time-to-digital converter according to claim 2, wherein after the smallest increase amount is identified as a smallest first increase amount and the second clock signal then passes through the second switching unit, the control unit provides control of changing a delay amount of the third delay element at least until identifying a smallest second increase amount at which the phase difference obtained by decoding the values stored in the plurality of the flip-flops becomes smaller than the phase difference changed by the smallest first increase amount, among second increase amounts larger than the smallest first increase amount for a delay amount in the first state, wherein the control unit subtracts the smallest first increase amount from the smallest second increase amount, the control unit corrects the calculated phase difference based on a subtraction result, and the output unit outputs the phase difference corrected by the control unit.

4. The time-to-digital converter according to claim 3, wherein the control unit normalizes the corrected phase difference with a cycle period of the first and second clock signals, and the output unit outputs the phase difference normalized by the control unit.

5. The time-to-digital converter according to claim 1, comprising a third delay element disposed between the first switching unit and the first delay element at the front stage and having a variable delay amount, wherein after the first clock signal passes through the plurality of the first delay elements, the second switching unit, and the plurality of the second delay elements and passes through the first switching unit, the control unit provides control of changing a delay amount of the third delay element at least until identifying a smallest increase amount at which the phase difference obtained by decoding the values stored in the plurality of the flip-flops becomes smaller than a phase difference in the first state, among increase amounts for a delay amount in the first state of the third delay element, the control unit calculates a phase difference obtained by subtracting the smallest increase amount from the phase difference in the first state, and the output unit outputs information indicating the phase difference calculated by the control unit.

6. The time-to-digital converter according to claim 5, wherein after the smallest increase amount is identified as a smallest first increase amount and the first clock signal then passes through the first switching unit, the control unit provides control of changing a delay amount of the third delay element at least until identifying a smallest second increase amount at which the phase difference obtained by decoding the values stored in the plurality of the flip-flops becomes smaller than the phase difference changed by the smallest first increase amount, among second increase amounts larger than the smallest first increase amount for a delay amount in the first state, wherein the control unit subtracts the smallest first increase amount from the smallest second increase amount, the control unit corrects the calculated phase difference based on a subtraction result, and the output unit outputs the phase difference corrected by the control unit.

7. The time-to-digital converter according to claim 6, wherein the control unit normalizes the corrected phase difference with a cycle period of the first and second clock signals, and the output unit outputs the phase difference normalized by the control unit.

8. The time-to-digital converter according to claim 1, comprising a third delay element disposed between the first switching unit and the first delay element at the front stage; and a fourth delay element corresponding to the third delay element and disposed between the second switching unit and the second delay element at the front stage, wherein with regard to a delay element group made up of the third delay element and the plurality of the first delay elements and a delay element group made up of the fourth delay element and the plurality of the second delay elements, each delay element of one of the delay element groups has a switch configured to switch a delay amount of each delay element, between a first delay amount resulting in a first difference and a second delay amount resulting in a second difference smaller than the first difference, wherein the first and second differences are differences between a delay amount of each of the delay elements and a delay amount of a delay element corresponding to each of the delay elements out of the other delay element group, the control unit sets each of the delay amounts of the one delay element group to the first delay amount in the first state, after the second clock signal passes through the plurality of the second delay elements, the first switching unit, and the plurality of the first delay elements and passes through the second switching unit, the control unit identifies among the one delay element group, a delay element in which a delay amount obtained by multiplying the number of stages from the front stage of the one delay element group by the first difference becomes larger than a phase difference smaller, by the first difference, than a phase difference in the first state, the control unit sets a delay amount of the identified delay element to the second delay amount, and after the delay amount of the identified delay element is set to the second delay amount and the second clock signal then passes through the second switching unit, the output unit outputs information indicating a phase difference obtained by decoding values stored in the plurality of the flip-flops.

9. The time-to-digital converter according to claim 8, wherein after the delay amounts of the identified delay elements are set to the second delay amount, the control unit sets a delay amount of a delay element one stage before the delay element at the front stage of the identified delay elements to the second delay amount, the control unit subtracts a phase difference obtained by decoding values stored in flip-flops corresponding to the identified delay elements after the delay amounts of the identified delay elements are set to the second delay amount, from a phase difference obtained by decoding values stored in flip-flops corresponding to the delay elements having the second delay amount among the one delay element group, the control unit corrects the phase difference obtained after setting to the second delay amount based on the subtraction result, and the output unit outputs the phase difference corrected by the control unit.

10. The time-to-digital converter according to claim 9, wherein a phase difference is calculated by dividing the corrected phase difference by a cycle period of the first and second clock signal, and the output unit outputs the phase difference divided by the control unit.

11. A control method comprising putting first and second switching units into a second state after a first clock signal and a second clock signal are taken in a plurality of first delay elements and a plurality of second delay elements, respectively, by putting the first and second switching units into a first state, wherein the control method is performed by a computer configured to access a time-to-digital converter having:

the plurality of the first delay elements connected in series;

the plurality of the second delay elements disposed respectively for the plurality of the first delay elements and connected in series;

a plurality of flip-flops configured to store a value of an input signal to a first delay element at a front stage of the plurality of the first delay elements and values of output signals of the plurality of the first delay elements in synchronization with an input signal to a second delay element at the front stage of the plurality of the second delay elements and output signals of the plurality of the second delay elements, respectively;

the first switching unit configured to switch the first state for inputting the first clock signal input from a first input terminal, and the second state for inputting an output signal of a second delay element at a last stage of the plurality of the second delay elements, to the first delay element at the front stage;

the second switching unit configured to switch the first state for inputting the second clock signal input from a second input terminal, and the second state for inputting an output signal of a first delay element at the last stage of the plurality of the first delay elements, to the second delay element at the front stage; and an output unit configured to output information indicating a phase difference between the first clock signal and the second clock signal obtained by decoding values stored in the plurality of the flip-flops in the second state.

* * * * *